(12) United States Patent
Duescher

(10) Patent No.: US 9,011,207 B2
(45) Date of Patent: Apr. 21, 2015

(54) FLEXIBLE DIAPHRAGM COMBINATION FLOATING AND RIGID ABRADING WORKHOLDER

(71) Applicant: Wayne O. Duescher, Roseville, MN (US)

(72) Inventor: Wayne O. Duescher, Roseville, MN (US)

(*) Notice: Subject to any disclaimer, the term of this patent is extended or adjusted under 35 U.S.C. 154(b) by 0 days.

(21) Appl. No.: 14/185,882

(22) Filed: Feb. 20, 2014

(65) Prior Publication Data

US 2014/0170938 A1    Jun. 19, 2014

Related U.S. Application Data

(63) Continuation-in-part of application No. 14/154,133, filed on Jan. 13, 2014, which is a continuation-in-part of application No. 14/148,729, filed on Jan. 7, 2014, which is a continuation of application No. 13/869,198, filed on Apr. 24, 2013, which is a continuation-in-part of application No. 13/662,863, filed on Oct. 29, 2012, now Pat. No. 8,845,394.

(51) Int. Cl.
| B24B 37/04 | (2012.01) |
| B24B 37/30 | (2012.01) |
| B24B 37/10 | (2012.01) |
| H01L 21/304 | (2006.01) |

(52) U.S. Cl.
CPC .............. *B24B 37/30* (2013.01); *B24B 37/10* (2013.01); *H01L 21/304* (2013.01); *B24B 37/042* (2013.01)

(58) Field of Classification Search
CPC ........ B24B 37/30; B24B 37/32; B24B 49/16; B24B 49/061; B24B 7/04; B24B 7/228; B24B 41/061; B24B 37/042; B24B 37/26; B24B 37/04; B24B 37/24

USPC .......................... 451/285–290, 41, 397–398
See application file for complete search history.

(56) References Cited

U.S. PATENT DOCUMENTS 1,799,332 A  *  4/1931  Stevens .......................... 15/97.1
4,593,495 A       6/1986  Kawakami et al.
(Continued)

OTHER PUBLICATIONS

Wayne O. Duescher, Three-point spindle-supported floating abrasive platen, U.S. Appl. No. 12/661,212, filed Mar. 12, 2010. Earliest Publication No. US 20110223835 A1 Earliest Publication Date: Sep. 15, 2011.
(Continued)

*Primary Examiner* — George Nguyen
(74) *Attorney, Agent, or Firm* — Mark A. Litman & Associates, PA

(57) ABSTRACT

Flat-surfaced workpieces such as semiconductor wafers or sapphire disks are attached to a rotatable floating or rigid workpiece holder carrier that is supported by a pressurized-air flexible elastomer disk sealed air-chamber device and is rotationally driven by a flexible arm or a lug-pin device. The rotating wafer carrier rotor is horizontally restrained by a set of idlers that are attached to a stationary housing to provide rigid support against abrading forces. The abrading system can be operated at the very high abrading speeds used in high speed flat lapping with raised-island abrasive disks. A wide range of abrading pressures are applied uniformly across the surface of the workpiece. Vacuum can also be applied to the elastomer chamber to quickly move the wafer away from the abrading surface. Internal constraints limit the axial, lateral and circumferential motion of the workholder. Wafers can be quickly attached to the workpiece carrier with vacuum.

25 Claims, 17 Drawing Sheets

(56) References Cited

U.S. PATENT DOCUMENTS

| | | | |
|---|---|---|---|
| 4,918,870 A | 4/1990 | Torbert et al. | |
| 5,205,082 A | 4/1993 | Shendon et al. | |
| 5,364,655 A | 11/1994 | Nakamura et al. | |
| 5,365,700 A * | 11/1994 | Sawada et al. | 451/28 |
| 5,384,991 A * | 1/1995 | Lee | 451/57 |
| 5,421,768 A | 6/1995 | Fujiwara et al. | |
| 5,443,416 A | 8/1995 | Volodarsky et al. | |
| 5,569,062 A | 10/1996 | Karlsrud et al. | |
| 5,597,346 A | 1/1997 | Hempel, Jr. | |
| 5,643,053 A | 7/1997 | Shendon | |
| 5,643,067 A | 7/1997 | Katsuoka et al. | |
| 5,647,789 A * | 7/1997 | Kitta et al. | 451/41 |
| 5,681,215 A * | 10/1997 | Sherwood et al. | 451/388 |
| 5,683,289 A | 11/1997 | Hempel, Jr. | |
| 5,738,574 A | 4/1998 | Tolles et al. | |
| 5,769,697 A | 6/1998 | Nishio | |
| 5,795,215 A * | 8/1998 | Guthrie et al. | 451/286 |
| 5,800,254 A | 9/1998 | Motley et al. | |
| 5,851,140 A * | 12/1998 | Barns et al. | 451/288 |
| 5,860,853 A * | 1/1999 | Hasegawa et al. | 451/285 |
| 5,874,318 A | 2/1999 | Baker et al. | |
| 5,910,041 A | 6/1999 | Duescher | |
| 5,913,714 A * | 6/1999 | Volodarsky et al. | 451/41 |
| 5,913,718 A * | 6/1999 | Shendon | 451/288 |
| 5,916,009 A | 6/1999 | Izumi et al. | |
| 5,944,583 A | 8/1999 | Cruz et al. | |
| 5,964,651 A | 10/1999 | Hose | |
| 5,967,882 A | 10/1999 | Duescher | |
| 5,975,997 A | 11/1999 | Minami | |
| 5,985,093 A | 11/1999 | Chen | |
| 5,989,104 A | 11/1999 | Kim et al. | |
| 5,993,298 A | 11/1999 | Duescher | |
| 5,993,302 A | 11/1999 | Chen et al. | |
| 6,019,670 A * | 2/2000 | Cheng et al. | 451/56 |
| 6,027,398 A | 2/2000 | Numoto et al. | |
| 6,048,254 A | 4/2000 | Duescher | |
| 6,050,882 A | 4/2000 | Chen | |
| 6,056,632 A | 5/2000 | Mitchel et al. | |
| 6,066,030 A * | 5/2000 | Uzoh | 451/41 |
| 6,074,277 A | 6/2000 | Arai | |
| 6,080,050 A | 6/2000 | Chen et al. | |
| 6,083,090 A * | 7/2000 | Bamba | 451/288 |
| 6,089,959 A | 7/2000 | Nagahashi | |
| 6,093,088 A * | 7/2000 | Mitsuhashi et al. | 451/285 |
| 6,102,777 A * | 8/2000 | Duescher et al. | 451/36 |
| 6,113,468 A * | 9/2000 | Natalicio | 451/41 |
| 6,116,993 A | 9/2000 | Tanaka | |
| 6,120,352 A | 9/2000 | Duescher | |
| 6,126,993 A | 10/2000 | Orcel et al. | |
| 6,132,298 A | 10/2000 | Zuniga et al. | |
| 6,146,259 A | 11/2000 | Zuniga et al. | |
| 6,149,506 A * | 11/2000 | Duescher | 451/59 |
| 6,165,056 A | 12/2000 | Hayashi et al. | |
| 6,168,506 B1 | 1/2001 | McJunken | |
| 6,179,956 B1 | 1/2001 | Nagahara et al. | |
| 6,183,354 B1 | 2/2001 | Zuniga et al. | |
| 6,196,903 B1 * | 3/2001 | Kimura | 451/285 |
| 6,217,411 B1 * | 4/2001 | Hiyama et al. | 451/8 |
| 6,217,433 B1 | 4/2001 | Herrman et al. | |
| 6,251,215 B1 | 6/2001 | Zuniga et al. | |
| 6,270,392 B1 | 8/2001 | Hayashi et al. | |
| 6,299,741 B1 | 10/2001 | Sun et al. | |
| 6,354,907 B1 * | 3/2002 | Satoh et al. | 451/5 |
| 6,361,420 B1 | 3/2002 | Zuniga et al. | |
| 6,371,838 B1 | 4/2002 | Holzapfel | |
| 6,390,901 B1 | 5/2002 | Hiyama et al. | |
| 6,390,905 B1 | 5/2002 | Korovin et al. | |
| 6,394,882 B1 | 5/2002 | Chen | |
| 6,398,906 B1 | 6/2002 | Kobayashi et al. | |
| 6,409,585 B1 * | 6/2002 | Oowada | 451/364 |
| 6,425,809 B1 | 7/2002 | Ichimura et al. | |
| 6,436,828 B1 | 8/2002 | Chen et al. | |
| 6,439,965 B1 | 8/2002 | Ichino | |
| 6,443,821 B1 | 9/2002 | Kimura et al. | |
| 6,447,368 B1 | 9/2002 | Fruitman et al. | |
| 6,491,570 B1 | 12/2002 | Sommer et al. | |
| 6,506,105 B1 | 1/2003 | Kajiwara et al. | |
| 6,558,232 B1 | 5/2003 | Kajiwara et al. | |
| 6,585,567 B1 | 7/2003 | Black et al. | |
| 6,592,434 B1 | 7/2003 | Vanell et al. | |
| 6,607,157 B1 * | 8/2003 | Duescher | 242/417.3 |
| 6,659,850 B2 | 12/2003 | Korovin et al. | |
| 6,672,949 B2 | 1/2004 | Chopra et al. | |
| 6,716,094 B2 * | 4/2004 | Shendon et al. | 451/288 |
| 6,722,962 B1 * | 4/2004 | Sato et al. | 451/259 |
| 6,729,944 B2 | 5/2004 | Birang et al. | |
| 6,752,700 B2 | 6/2004 | Duescher | |
| 6,761,618 B1 * | 7/2004 | Leigh et al. | 451/11 |
| 6,769,969 B1 | 8/2004 | Duescher | |
| 6,805,613 B1 * | 10/2004 | Weldon et al. | 451/6 |
| 6,837,779 B2 | 1/2005 | Smith et al. | |
| 6,893,332 B2 | 5/2005 | Castor | |
| 6,896,584 B2 | 5/2005 | Perlov et al. | |
| 6,899,603 B2 | 5/2005 | Homma et al. | |
| 6,899,607 B2 | 5/2005 | Brown | |
| 6,899,609 B2 | 5/2005 | Hong | |
| 6,935,013 B1 | 8/2005 | Markevitch et al. | |
| 7,001,251 B2 | 2/2006 | Doan et al. | |
| 7,001,257 B2 | 2/2006 | Chen et al. | |
| 7,008,303 B2 | 3/2006 | White et al. | |
| 7,014,535 B2 | 3/2006 | Custer et al. | |
| 7,018,906 B2 | 3/2006 | Chen et al. | |
| 7,029,380 B2 | 4/2006 | Horiguchi et al. | |
| 7,033,251 B2 | 4/2006 | Elledge | |
| 7,044,838 B2 | 5/2006 | Maloney et al. | |
| 7,081,042 B2 | 7/2006 | Chen et al. | |
| 7,101,273 B2 | 9/2006 | Tseng et al. | |
| 7,125,313 B2 | 10/2006 | Zelenski et al. | |
| 7,144,304 B2 | 12/2006 | Moore | |
| 7,147,541 B2 | 12/2006 | Nagayama et al. | |
| 7,166,016 B1 | 1/2007 | Chen | |
| 7,250,368 B2 | 7/2007 | Kida et al. | |
| 7,276,446 B2 | 10/2007 | Robinson et al. | |
| 7,292,427 B1 | 11/2007 | Murdoch et al. | |
| 7,294,041 B1 * | 11/2007 | Lee et al. | 451/8 |
| 7,357,699 B2 | 4/2008 | Togawa et al. | |
| 7,367,867 B2 | 5/2008 | Boller | |
| 7,393,790 B2 | 7/2008 | Britt et al. | |
| 7,419,910 B2 | 9/2008 | Minamihaba et al. | |
| 7,422,634 B2 | 9/2008 | Powell et al. | |
| 7,445,847 B2 | 11/2008 | Kulp | |
| 7,446,018 B2 | 11/2008 | Brogan et al. | |
| 7,452,817 B2 | 11/2008 | Yoon et al. | |
| 7,456,106 B2 | 11/2008 | Koyata et al. | |
| 7,456,107 B2 | 11/2008 | Keleher et al. | |
| 7,470,169 B2 | 12/2008 | Taniguchi et al. | |
| 7,485,028 B2 | 2/2009 | Wilkinson et al. | |
| 7,485,241 B2 | 2/2009 | Schroeder et al. | |
| 7,488,235 B2 | 2/2009 | Park et al. | |
| 7,488,236 B2 | 2/2009 | Shimomura et al. | |
| 7,488,240 B2 | 2/2009 | Saito | |
| 7,491,116 B2 | 2/2009 | Sung | |
| 7,491,342 B2 | 2/2009 | Kamiyama et al. | |
| 7,507,148 B2 | 3/2009 | Kitahashi et al. | |
| 7,510,974 B2 | 3/2009 | Li et al. | |
| 7,520,798 B2 | 4/2009 | Muldowney et al. | |
| 7,520,800 B2 | 4/2009 | Duescher | |
| 7,527,271 B2 | 5/2009 | Oh et al. | |
| 7,527,722 B2 | 5/2009 | Sharan | |
| 7,553,214 B2 | 6/2009 | Menk et al. | |
| 7,568,970 B2 | 8/2009 | Wang | |
| 7,572,172 B2 | 8/2009 | Aoyama et al. | |
| 7,579,071 B2 | 8/2009 | Huh et al. | |
| 7,582,221 B2 | 9/2009 | Netsu et al. | |
| 7,601,050 B2 | 10/2009 | Zuniga et al. | |
| 7,614,939 B2 | 11/2009 | Tolles et al. | |
| 7,618,529 B2 | 11/2009 | Ameen et al. | |
| 7,632,434 B2 | 12/2009 | Duescher | |
| 7,648,410 B2 | 1/2010 | Choi | |
| 7,699,684 B2 | 4/2010 | Prasad | |
| 7,708,621 B2 | 5/2010 | Saito | |
| 7,731,568 B2 | 6/2010 | Shimomura et al. | |
| 7,741,656 B2 | 6/2010 | Nakayama et al. | |
| 7,753,761 B2 | 7/2010 | Fujita | |

(56) References Cited

U.S. PATENT DOCUMENTS

| | | | |
|---|---|---|---|
| 7,754,611 B2 | 7/2010 | Chen et al. |
| 7,762,870 B2 | 7/2010 | Ono et al. |
| 7,807,252 B2 | 10/2010 | Hendron et al. |
| 7,822,500 B2 | 10/2010 | Kobayashi et al. |
| 7,833,907 B2 | 11/2010 | Anderson et al. |
| 7,837,800 B2 | 11/2010 | Fukasawa et al. |
| 7,838,482 B2 | 11/2010 | Fukasawa et al. |
| 7,840,305 B2 | 11/2010 | Behr et al. |
| 7,883,397 B2 | 2/2011 | Zuniga et al. |
| 7,884,020 B2 | 2/2011 | Hirabayashi et al. |
| 7,897,250 B2 | 3/2011 | Iwase et al. |
| 7,922,783 B2 | 4/2011 | Sakurai et al. |
| 7,947,190 B2 | 5/2011 | Brown |
| 7,950,985 B2 | 5/2011 | Zuniga et al. |
| 7,955,964 B2 | 6/2011 | Wu et al. |
| 7,972,396 B2 | 7/2011 | Feng et al. |
| 8,002,860 B2 | 8/2011 | Koyama et al. |
| 8,021,215 B2 | 9/2011 | Zuniga et al. |
| 8,025,813 B2 | 9/2011 | Liu et al. |
| 8,029,640 B2 | 10/2011 | Zuniga et al. |
| 8,043,140 B2 | 10/2011 | Fujita |
| 8,047,899 B2 | 11/2011 | Chen et al. |
| 8,062,096 B2 | 11/2011 | Brusic et al. |
| 8,071,479 B2 | 12/2011 | Liu |
| 8,088,299 B2 | 1/2012 | Chen et al. |
| 8,101,060 B2 | 1/2012 | Lee |
| 8,101,093 B2 | 1/2012 | De Rege Thesauro et al. |
| 8,323,075 B2 * | 12/2012 | Masumura et al. | 451/288 |
| 8,845,394 B2 * | 9/2014 | Duescher | 451/41 |
| 2001/0009843 A1 * | 7/2001 | Hirokawa et al. | 451/160 |
| 2001/0011003 A1 * | 8/2001 | Numoto | 451/379 |
| 2001/0034199 A1 * | 10/2001 | Park | 451/287 |
| 2001/0041522 A1 * | 11/2001 | Shendon et al. | 451/288 |
| 2001/0044268 A1 * | 11/2001 | Shendon | 451/285 |
| 2002/0009958 A1 * | 1/2002 | Gotcher | 451/288 |
| 2002/0033230 A1 * | 3/2002 | Hayashi et al. | 156/345 |
| 2002/0173256 A1 * | 11/2002 | Suwabe | 451/287 |
| 2003/0008600 A1 * | 1/2003 | Ide | 451/41 |
| 2003/0008604 A1 * | 1/2003 | Boo et al. | 451/388 |
| 2003/0129932 A1 * | 7/2003 | Ficarro | 451/288 |
| 2005/0118939 A1 | 6/2005 | Duescher |
| 2007/0111641 A1 * | 5/2007 | Lee et al. | 451/11 |
| 2008/0299875 A1 | 12/2008 | Duescher |
| 2010/0003904 A1 | 1/2010 | Duescher |
| 2011/0223835 A1 | 9/2011 | Duescher |
| 2011/0223836 A1 | 9/2011 | Duescher |
| 2011/0223838 A1 | 9/2011 | Duescher |
| 2014/0127976 A1 * | 5/2014 | Duescher | 451/41 |

OTHER PUBLICATIONS

Wayne O. Duescher, Three-point fixed-spindle floating-platen abrasive system, U.S. Appl. No. 12/799,841, filed May 3, 2010. Earliest Publication No. US 20110223836 A1 Earliest Publication Date: Sep. 15, 2011.

Wayne O. Duescher, Fixed-spindle and floating-platen abrasive system using spherical mounts, U.S. Appl. No. 12/807,802, filed Sep. 14, 2010. Earliest Publication No. US 20110223838 A1 Earliest Publication Date: Sep. 15, 2011.

* cited by examiner

FLEXIBLE DIAPHRAGM COMBINATION FLOATING AND RIGID ABRADING WORKHOLDER

CROSS REFERENCE TO RELATED APPLICATIONS

This invention is a continuation-in-part of U.S. patent application Ser. No. 14/154,133 filed Jan. 13, 2014 that is a continuation-in-part of U.S. patent application Ser. No. 14/148,729 filed Jan. 7, 2014 that is a continuation-in-part of U.S. patent application Ser. No. 13/869,198 filed Apr. 24, 2013 that is a continuation-in-part of U.S. patent application Ser. No. 13/662,863 filed Oct. 29, 2012. These are each incorporated herein by reference in their entirety.

BACKGROUND OF THE INVENTION

Field of the Invention

The present invention relates to the field of abrasive treatment of surfaces such as grinding, polishing and lapping. In particular, the present invention relates to a combination-type high speed semiconductor wafer or abrasive lapping or polishing workholder system for use with single-sided abrading machines that have rotary abrasive coated flat-surfaced platens. The spider arm and slide-pin drive workholders employed here allow floating workpiece substrates to be rotated at the same desired high rotation speeds as the platens while in conformal abrading contact with a moving flat-surfaced abrasive. Conformal abrading contact assures that material is removed uniformly across the full surface of the workpiece. In addition, the combination-type abrading workholder can be operated in a rigid mode where the workpiece is not allowed to float as it is in abrading contact with moving abrasive. Often these platen and workholder speeds exceed 3,000 rpm to obtain abrading speeds of over 10,000 surface feet per minute (SFPM).

This combination-type workpiece carrier head abrading system can be used in two different abrading modes. In the first mode of operation, the rotating workpiece carrier that is attached to a rotating spindle "floats" the workpiece as it is held in controlled abrading-pressure contact with the moving abrasive. In the second mode of operation, the rotating workpiece carrier is attached rigidly to the rotating workpiece spindle. Here, the whole rotatable workpiece spindle assembly is lowered until the rigidly attached workpiece is in "non-floating" rigid abrading contact with the flat rotating platen moving abrasive surface. This rigid abrading system can be used to create parallel opposed surfaces of a workpiece that originally had non-parallel surfaces.

In many applications it is necessary or critical that the opposed surfaces of an abraded or polished workpiece are precisely parallel. For example, it is necessary for semiconductor wafers to have parallel surfaces to enable focusing of stereolithographic light beams uniformly across the full exposed surface of the wafer as the backside of the wafer is attached to a precision-flat platen surface. Likewise, it is very desirable that flattened and polished hardened steel or hard ceramic rotary seals have parallel opposed surfaces to allow the seals to be rotated at high speeds.

To provide abraded workpiece surfaces that are parallel, the workpiece rotating spindle axis is aligned to be precisely perpendicular to the rotating flat abrasive surface. When the workpiece spindle is rotated while the workpiece is abraded, the flatness of the abraded workpiece ids directly related to the accuracy of the precision perpendicular alignment of the workpiece spindle to the abrasive disk rotational platen surface. To create this precision alignment, the abrading machine can be configured with a workpiece spindle having a long axial length with wide-spaced spindle shaft bearings that provides structural stiffness to resist abrading forces that are imposed on the workpiece results in minimal deflection of the spindle device.

A second aspect of providing the precision perpendicular alignment of the spindle axis to the platen surface is to mount a precision-flat abrasive disk platen on a spherical-action platen mounting device. This spherical-action mount can be rotated until the platen surface is precisely perpendicular to the workpiece spindle axis. The spherical-action mount device is then locked in this established alignment position.

The abrading machine can be quickly switched between "floating" and "rigid" abrading modes by simply applying vacuum to a sealed chamber located inside the body of the workpiece carrier head. This vacuum forces the rotary workpiece carrier into rigid contact with rigid components within the workpiece carrier head. When portions of the rigid workpiece carrier are held in forced contact with the rigid components of the workpiece carrier head by the applied vacuum, the workpiece-attachment surface of the workpiece carrier is positioned to be precisely aligned perpendicular with the workpiece spindle rotation axis. Because the workpiece is rigidly attached to the rigid workpiece carrier attachment surface, the exposed surface of the workpiece can be abraded precisely parallel to the workpiece carrier workpiece attachment surface by the rotating platen moving abrasive Workpieces that have one surface abraded flat by the rigid workpiece carrier can be flipped over and the second (opposed) surface of the workpiece can also be abraded to provide that both opposed surfaces of the workpiece are precisely flat, have smoothly polished surfaces and both opposed surfaces are precisely parallel to each other. When it is desired to convert the workpiece carrier from the "rigid" mode of abrading operation to the "floating" mode of abrading operation, the applied vacuum is discontinued and the floating workpiece carrier is no longer held in rigid contact with the rotatable workpiece spindle.

Conventional wafer-polishing workholders are typically very limited in speeds and can not attain these rotational speeds that are required for high speed lapping and polishing. Even very thin and ultra-hard disks such as sapphire can be easily abraded and polished at very high production rates with this high speed abrading system especially when using diamond abrasives.

The slide-pin arm driven workholders having flexible annular diaphragm or flexible bellows chamber devices provide that a wide range of uniform abrading pressures can be applied across the full abraded surfaces of the workpieces such as semiconductor wafers. These slide-pin devices also allow the workholder carrier device to have a spherical-action rotation which provides flat-surfaced contact of workpieces that are attached to the workholder device with a flat-surfaced abrasive coating on a rotating abrading platen. One or more of the workholders can be used simultaneously with a rotary abrading platen.

High speed flat lapping is typically performed using flexible disks that have an annular band of abrasive-coated raised islands. These raised-island disks are attached to flat-surfaced platens that rotate at high abrading speeds. The use of the raised island disks prevent hydroplaning of the lapped workpieces when they are lapped at high speeds with the presence of coolant water. Hydroplaning causes the workpieces to tilt which results in non-flat lapped workpiece surfaces. Excess water is routed from contact with the workpiece flat surfaces into the recessed passageways that surround the abrasive coated raised island structures.

Flat lapping of workpiece surfaces used to produce precision-flat and mirror smooth polished surfaces is required for many high-value parts such as semiconductor wafer and rotary seals. The accuracy of the lapping or abrading process is constantly increased as the workpiece performance, or process requirements, become more demanding. Workpiece feature tolerances for flatness accuracy, the amount of material removed, the absolute part-thickness and the smoothness of the polish become more progressively more difficult to achieve with existing abrading machines and abrading processes. In addition, it is necessary to reduce the processing costs without sacrificing performance.

The chemical mechanical planarization (CMP) liquid-slurry abrading system has been the system-of-choice for polishing semiconductor wafers that are already exceedingly flat. During CMP polishing, a very small amount of material is removed from the surface of the wafer. Typically the amount of material removed by polishing is measured in angstroms where the overall global flatness of the wafer is not affected much. It is critical that the global flatness of the wafer surface is maintained in a precision-flat condition to allow new patterned layers of metals and insulating oxides to be deposited on the wafer surfaces with the use of photolithography techniques. Global flatness is a measure of the flatness across the full surface of the wafer. Site or localized flatness of a wafer refers to the flatness of a localized portion of the wafer surface.

This invention references commonly assigned U.S. Pat. Nos. 5,910,041; 5,967,882; 5,993,298; 6,048,254; 6,102,777; 6,120,352; 6,149,506; 6,607,157; 6,752,700; 6,769,969; 7,632,434 and 7,520,800, commonly assigned U.S. patent application published numbers 20100003904; 20080299875 and 20050118939 and U.S. patent application Ser. Nos. 12/661,212, 12/799,841 and 12/807,802 and all contents of which are incorporated herein by reference.

U.S. Pat. No. 7,614,939 (Tolles et al) describes a CMP polishing machine that uses flexible pads where a conditioner device is used to maintain the abrading characteristic of the pad. Multiple CMP pad stations are used where each station has different sized abrasive particles. U.S. Pat. No. 4,593,495 (Kawakami et al) describes an abrading apparatus that uses planetary workholders. U.S. Pat. No. 4,918,870 (Torbert et al) describes a CMP wafer polishing apparatus where wafers are attached to wafer carriers using vacuum, wax and surface tension using wafer. U.S. Pat. No. 5,205,082 (Shendon et al) describes a CMP wafer polishing apparatus that uses a floating retainer ring. U.S. Pat. No. 6,506,105 (Kajiwara et al) describes a CMP wafer polishing apparatus that uses a CMP with a separate retaining ring and wafer pr3essure control to minimize over-polishing of wafer peripheral edges. U.S. Pat. No. 6,371,838 (Holzapfel) describes a CMP wafer polishing apparatus that has multiple wafer heads and pad conditioners where the wafers contact a pad attached to a rotating platen. U.S. Pat. No. 6,398,906 (Kobayashi et al) describes a wafer transfer and wafer polishing apparatus. U.S. Pat. No. 7,357,699 (Togawa et al) describes a wafer holding and polishing apparatus and where excessive rounding and polishing of the peripheral edge of wafers occurs. U.S. Pat. No. 7,276,446 (Robinson et al) describes a web-type fixed-abrasive CMP wafer polishing apparatus.

U.S. Pat. No. 6,425,809 (Ichimura et al) describes a semiconductor wafer polishing machine where a polishing pad is attached to a rigid rotary platen. The polishing pad is in abrading contact with flat-surfaced wafer-type workpieces that are attached to rotary workpiece holders. These workpiece holders have a spherical-action universal joint. The universal joint allows the workpieces to conform to the surface of the platen-mounted abrasive polishing pad as the platen rotates. However, the spherical-action device is the workpiece holder and is not the rotary platen that holds the fixed abrasive disk.

U.S. Pat. No. 6,769,969 (Duescher) describes flexible abrasive disks that have annular bands of abrasive coated raised islands. These disks use fixed-abrasive particles for high speed flat lapping as compared with other lapping systems that use loose-abrasive liquid slurries. The flexible raised island abrasive disks are attached to the surface of a rotary platen to abrasively lap the surfaces of workpieces.

U.S. Pat. No. 8,328,600 (Duescher) describes the use of spherical-action mounts for air bearing and conventional flat-surfaced abrasive-covered spindles used for abrading where the spindle flat surface can be easily aligned to be perpendicular to another device. Here, in the present invention, this type of air bearing and conventional flat-surfaced abrasive-covered spindles can be used where the spindle flat abrasive surface can be easily aligned to be perpendicular with the rotational axis of a floating bellows-type workholder device. This patent is incorporated herein by reference in its entirety.

Various abrading machines and abrading processes are described in U.S. Pat. No. 5,364,655 (Nakamura et al). U.S. Pat. No. 5,569,062 (Karlsrud), U.S. Pat. No. 5,643,067 (Katsuoka et al), U.S. Pat. No. 5,769,697 (Nisho), U.S. Pat. No. 5,800,254 (Motley et al), U.S. Pat. No. 5,916,009 (Izumi et al), U.S. Pat. No. 5,964,651 (hose), U.S. Pat. No. 5,975,997 (Minami, 5,989,104 (Kim et al), U.S. Pat. No. 6,089,959 (Nagahashi, 6,165,056 (Hayashi et al), 6,168,506 (Mc-Junken), U.S. Pat. No. 6,217,433 (Herrman et al), U.S. Pat. No. 6,439,965 (Ichino), U.S. Pat. No. 6,893,332 (Castor), U.S. Pat. No. 6,896,584 (Perlov et al), U.S. Pat. No. 6,899,603 (Homma et al), U.S. Pat. No. 6,935,013 (Markevitch et al), U.S. Pat. No. 7,001,251 (Doan et al), U.S. Pat. No. 7,008,303 (White et al), U.S. Pat. No. 7,014,535 (Custer et al), U.S. Pat. No. 7,029,380 (Horiguchi et al), U.S. Pat. No. 7,033,251 (Elledge), U.S. Pat. No. 7,044,838 (Maloney et al), U.S. Pat. No. 7,125,313 (Zelenski et al), U.S. Pat. No. 7,144,304 (Moore), U.S. Pat. No. 7,147,541 (Nagayama et al), U.S. Pat. No. 7,166,016 (Chen), U.S. Pat. No. 7,250,368 (Kida et al), U.S. Pat. No. 7,367,867 (Boller), U.S. Pat. No. 7,393,790 (Britt et al), U.S. Pat. No. 7,422,634 (Powell et al), U.S. Pat. No. 7,446,018 (Brogan et al), U.S. Pat. No. 7,456,106 (Koyata et al), U.S. Pat. No. 7,470,169 (Taniguchi et al), U.S. Pat. No. 7,491,342 (Kamiyama et al), U.S. Pat. No. 7,507,148 (Kitahashi et al), U.S. Pat. No. 7,527,722 (Sharan) and 7,582,221 (Netsu et al).

Also, various CMP machines, resilient pads, materials and processes are described in U.S. Pat. No. 8,101,093 (de Rege Thesauro et al.), U.S. Pat. No. 8,101,060 (Lee), U.S. Pat. No. 8,071,479 (Liu), U.S. Pat. No. 8,062,096 (Brusic et al.), U.S. Pat. No. 8,047,899 (Chen et al.), U.S. Pat. No. 8,043,140 (Fujita), U.S. Pat. No. 8,025,813 (Liu et al.), U.S. Pat. No. 8,002,860 (Koyama et al.), U.S. Pat. No. 7,972,396 (Feng et al.), U.S. Pat. No. 7,955,964 (Wu et al.), U.S. Pat. No. 7,922,783 (Sakurai et al.), U.S. Pat. No. 7,897,250 (Iwase et al.), U.S. Pat. No. 7,884,020 (Hirabayashi et al.), U.S. Pat. No. 7,840,305 (Behr et al.), U.S. Pat. No. 7,838,482 (Fukasawa et al.), U.S. Pat. No. 7,837,800 (Fukasawa et al.), U.S. Pat. No. 7,833,907 (Anderson et al.), U.S. Pat. No. 7,822,500 (Kobayashi et al.), U.S. Pat. No. 7,807,252 (Hendron et al.), U.S. Pat. No. 7,762,870 (Ono et al.), U.S. Pat. No. 7,754,611 (Chen et al.), U.S. Pat. No. 7,753,761 (Fujita), U.S. Pat. No. 7,741,656 (Nakayama et al.), U.S. Pat. No. 7,731,568 (Shimomura et al.), U.S. Pat. No. 7,708,621 (Saito), U.S. Pat. No.

7,699,684 (Prasad), U.S. Pat. No. 7,648,410 (Choi), U.S. Pat. No. 7,618,529 (Ameen et al.), U.S. Pat. No. 7,579,071 (Huh et al.), U.S. Pat. No. 7,572,172 (Aoyama et al.), U.S. Pat. No. 7,568,970 (Wang), U.S. Pat. No. 7,553,214 (Menk et al.), U.S. Pat. No. 7,520,798 (Muldowney), U.S. Pat. No. 7,510,974 (Li et al.), U.S. Pat. No. 7,491,116 (Sung), U.S. Pat. No. 7,488,236 (Shimomura et al.), U.S. Pat. No. 7,488,240 (Saito), U.S. Pat. No. 7,488,235 (Park et al.), U.S. Pat. No. 7,485,241 (Schroeder et al.), U.S. Pat. No. 7,485,028 (Wilkinson et al), U.S. Pat. No. 7,456,107 (Keleher et al.), U.S. Pat. No. 7,452,817 (Yoon et al.), U.S. Pat. No. 7,445,847 (Kulp), U.S. Pat. No. 7,419,910 (Minamihaba et al.), U.S. Pat. No. 7,018,906 (Chen et al.), U.S. Pat. No. 6,899,609 (Hong), U.S. Pat. No. 6,729,944 (Birang et al.), U.S. Pat. No. 6,672,949 (Chopra et al.), U.S. Pat. No. 6,585,567 (Black et al.), U.S. Pat. No. 6,270,392 (Hayashi et al.), U.S. Pat. No. 6,165,056 (Hayashi et al.), U.S. Pat. No. 6,116,993 (Tanaka), U.S. Pat. No. 6,074,277 (Arai), U.S. Pat. No. 6,027,398 (Numoto et al.), U.S. Pat. No. 5,985,093 (Chen), U.S. Pat. No. 5,944,583 (Cruz et al.), U.S. Pat. No. 5,874,318 (Baker et al.), U.S. Pat. No. 5,683,289 (Hempel Jr.), U.S. Pat. No. 5,643,053 (Shendon),), U.S. Pat. No. 5,597,346 (Hempel Jr.).

Other wafer carrier heads are described in U.S. Pat. No. 5,421,768 (Fujiwara et al.), U.S. Pat. No. 5,443,416 (Volodarsky et al.), U.S. Pat. No. 5,738,574 (Tolles et al.), U.S. Pat. No. 5,993,302 (Chen et al.), U.S. Pat. No. 6,050,882 (Chen), U.S. Pat. No. 6,056,632 (Mitchel et al.), U.S. Pat. No. 6,080,050 (Chen et al.), U.S. Pat. No. 6,126,116 (Zuniga et al.), U.S. Pat. No. 6,132,298 (Zuniga et al.), U.S. Pat. No. 6,146,259 (Zuniga et al.), U.S. Pat. No. 6,179,956 (Nagahara et al.), U.S. Pat. No. 6,183,354 (Zuniga et al.), U.S. Pat. No. 6,251,215 (Zuniga et al.), U.S. Pat. No. 6,299,741 (Sun et al.), U.S. Pat. No. 6,361,420 (Zuniga et al.), U.S. Pat. No. 6,390,901 (Hiyama et al.), U.S. Pat. No. 6,390,905 (Korovin et al.), U.S. Pat. No. 6,394,882 (Chen), U.S. Pat. No. 6,436,828 (Chen et al.), U.S. Pat. No. 6,443,821 (Kimura et al.), U.S. Pat. No. 6,447,368 (Fruitman et al.), U.S. Pat. No. 6,491,570 (Sommer et al.), U.S. Pat. No. 6,506,105 (Kajiwara et al.), U.S. Pat. No. 6,558,232 (Kajiwara et al.), U.S. Pat. No. 6,592,434 (Vanell et al.), U.S. Pat. No. 6,659,850 (Korovin et al.), U.S. Pat. No. 6,837,779 (Smith et al.), U.S. Pat. No. 6,899,607 (Brown), U.S. Pat. No. 7,001,257 (Chen et al.), U.S. Pat. No. 7,081,042 (Chen et al.), U.S. Pat. No. 7,101,273 (Tseng et al.), U.S. Pat. No. 7,292,427 (Murdock et al.), U.S. Pat. No. 7,527,271 (Oh et al.), U.S. Pat. No. 7,601,050 (Zuniga et al.), U.S. Pat. No. 7,883,397 (Zuniga et al.), U.S. Pat. No. 7,947,190 (Brown), U.S. Pat. No. 7,950,985 (Zuniga et al.), U.S. Pat. No. 8,021,215 (Zuniga et al.), U.S. Pat. No. 8,029,640 (Zuniga et al.), U.S. Pat. No. 8,088,299 (Chen et al.), All references cited herein are incorporated herein in the entirety by reference.

SUMMARY OF THE INVENTION

The presently disclosed technology includes precision-thickness flexible abrasive disks having disk thickness variations of less than 0.0001 inches (3 microns) across the full annular bands of abrasive-coated raised islands to allow flat-surfaced contact with workpieces at very high abrading speeds. Use of a rotary platen vacuum flexible abrasive disk attachment system allows quick set-up changes where different sizes of abrasive particles and different types of abrasive material can be quickly attached to the flat platen surfaces.

Semiconductor wafers require extremely flat surfaces when using photolithography to deposit patterns of materials to form circuits across the full flat surface of a wafer. When theses wafers are abrasively polished between deposition steps, the surfaces of the wafers must remain precisely flat.

Water coolant is used with these raised island abrasive disks, which allows them to be used at very high abrading speeds, often in excess of 10,000 SFPM (160 km per minute). The same types of chemicals that are used in the conventional CMP polishing of wafers can be used with this abrasive lapping or polishing system. These liquid chemicals can be applied as a mixture with the coolant water that is used to cool both the wafers and the fixed abrasive coatings on the rotating abrading platen This mixture of coolant water and chemicals continually washes the abrading debris away from the abrading surfaces of the fixed-abrasive coated raised islands which prevents unwanted abrading contact of the abrasive debris with the abraded surfaces of the wafers.

Slurry lapping is often done at very slow abrading speeds of about 5 mph (8 kph). By comparison, the high speed flat lapping system often operates at or above 100 mph (160 kph). This is a speed difference ratio of 20 to 1. Increasing abrading speeds increase the material removal rates. High abrading speeds result in high workpiece production rates and large cost savings.

Workpieces are often rotated at rotational speeds that are approximately equal to the rotational speeds of the platens to provide equally-localized abrading speeds across the full radial width of the platen annular abrasive when the workpiece spindles are rotated in the same rotation direction as the platens. Often these platen and workholder rotational speeds exceed 3,000 rpm. Typically, conventional spherical-action types of workholders are used to provide flat-surfaced contact of workpieces with a flat-surfaced abrasive covered platen that rotates at very high speeds. In addition, the abrading friction forces that are applied to the workpieces by the moving abrasive tend to tilt the workpieces that are attached to the offset workholders. Tilting causes non-flat abraded workpiece surfaces.

Also, these conventional rotating offset spherical-action workholders are nominally unstable at very high rotation speeds, especially when the workpieces are not held firmly in direct flat-surfaced contact with the platen abrading surface. It is necessary to provide controlled operation of these unstable spherical-action workholders to prevent unwanted vibration or oscillation of the workholders (and workpieces) at very high rotational speeds of the workholders. Vibrations of the workholders can produce patterns of uneven surface wear of an expensive semiconductor wafer.

The present system provides friction-free and vibrationally stable rotation of the workpieces without the use of offset spherical-action universal joint rotation devices. Tilting of the workpieces dos not occur because the offset spherical-action universal joint rotation devices are not used. Uniform abrading pressures are applied across the full abraded surfaces of the workpieces such as semiconductor wafers by the air bearing workholders. Also, one or more of the workholders can be used simultaneously with a rotary abrading platen.

The slide-pin arm driven workholders having flexible annular diaphragm or flexible bellows chamber devices provide that a wide range of uniform abrading pressures can be applied across the full abraded surfaces of the workpieces such as semiconductor wafers.

These slide-pin devices also allow the workholder device to have a spherical-action rotation which provides flat-surfaced contact of workpieces that are attached to the workholder device with a flat-surfaced abrasive coating on a rotating abrading platen. The circular shaped workholder is supported by a set of stationary but rotatable idler bearings that contact the outer periphery of the workholder at selected locations around the circumference of the workholder. The abrading friction forces that are applied to the workpieces and thus to the free-floating workholder by abrading contact with the rotating abrasive platen are resisted by the workholder bearing idlers. These idlers maintain the circular workholder in a position that is concentric with the axis of the workholder drive shaft during the abrading action as the abrasive platen is rotated. One or more of the workholders can be used simultaneously with a rotary abrading platen.

Conventional flexible elastomeric pneumatic-chamber wafer carrier heads have a substantial disadvantage in that the vertical walls of the elastomeric chambers are very weak in a lateral or horizontal direction. The abrading pressures and vacuum that are applied to these sealed chambers are typically very small, in part, to avoid very substantial lateral deflections of the elastomer walls. The sealed abrading-chamber annular flexible diaphragm device 237 described here are flexible which allows axial motion of the workholder.

DETAILED DESCRIPTION OF THE INVENTION

Figure 1:
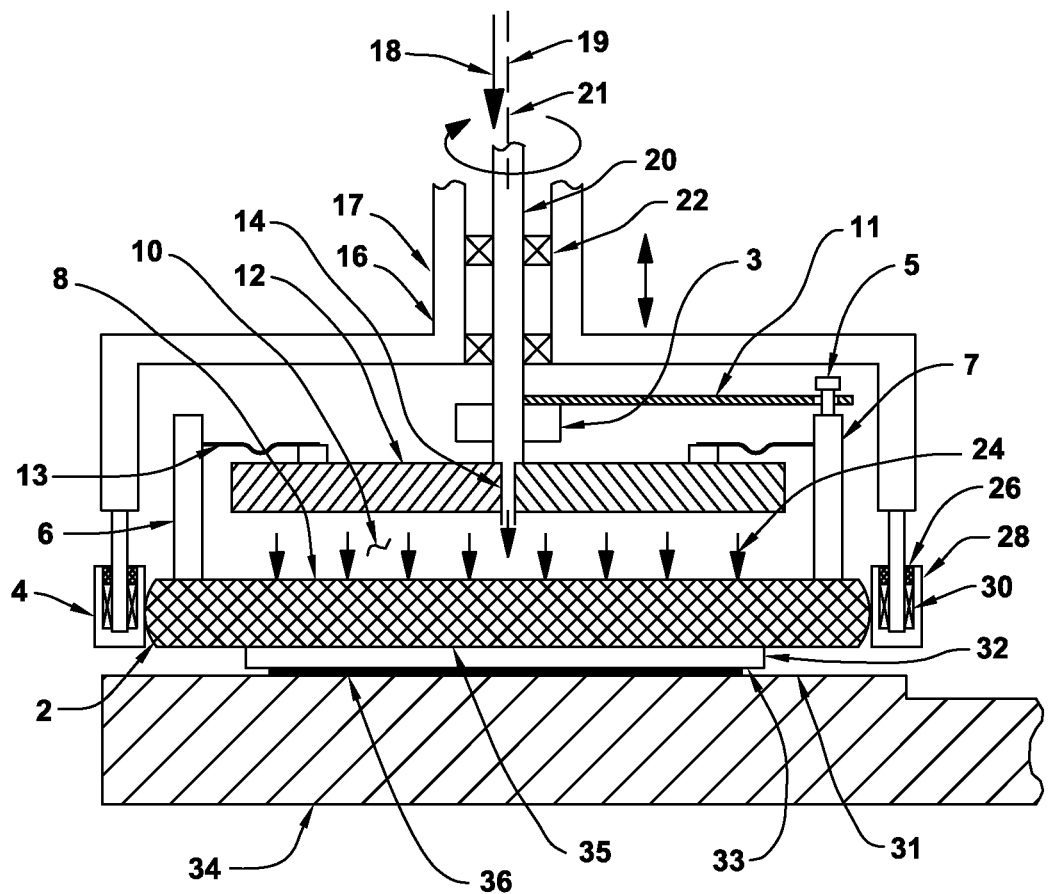
FIG. 1 is a cross section view of a pin driven flexible diaphragm workpiece carrier.

FIG. 1 is a cross section view of a pin driven flexible diaphragm workpiece carrier used for lapping or polishing semiconductor wafers or other workpiece substrates. A stationary workpiece carrier head 17 has a flat-surfaced workpiece 32 that is attached to a floating workpiece carrier rotor 35 that is rotationally driven by a drive-pin device 5. A nominally-horizontal drive plate 12 is attached to a hollow drive shaft 20 having a rotation axis 19 that is supported by bearings 22 that are supported by a stationary carrier housing 16 where the carrier housing 16 can be raised and lowered in a vertical direction.

A nominally-rigid rotational drive arm 11 is attached to the hollow drive shaft 20 where rotation of the hollow drive shaft 20 rotates the rotational drive arm 11. The drive-pin device 5 is attached a rigid annular member 6 or multiple individual posts 7 that is/are attached to the workpiece carrier rotor 35 which allows the drive-pin device 5 to rotationally drive the workpiece carrier rotor 35. The workpiece carrier rotor 35 has an outer periphery 2 that has a spherical shape which allows the workpiece carrier rotor 35 outer periphery 2 to remain in contact with stationary rotatable roller idlers 28 when the rotating carrier rotor 35 is tilted.

The workpiece carrier rotor 35 has a rotation axis 21 that is coincident or near-coincident with the hollow drive shaft 20 rotation axis 19 to avoid interference action of the workpiece carrier rotor 35 with the hollow drive shaft 20 when the hollow drive shaft 20 is rotated. The workpiece 32 carrier rotor 35 rotation axis 21 is positioned to be coincident or near-coincident with the hollow drive shaft 20 rotation axis 19 by the controlled location of the stationary roller idlers 28 that are mounted to the stationary workpiece carrier head 17. Rolling contact of the workpiece carrier rotor 35 outer periphery 2 with the set of stationary roller idlers 28 that are precisely located at prescribed positions assures that the workpiece carrier rotor 35 rotation axis 21 is coincident or near-coincident with the hollow drive shaft 20 rotation axis 19. The stationary roller idlers 28 are mounted at positions on the carrier housing 16 where the diameters of the stationary roller idlers 28 and the diameters of the respective workpiece carrier rotors 35 are selected to provide that the workpiece carrier rotor 35 rotation axis 21 is coincident or near-coincident with the hollow drive shaft 20 rotation axis 19.

An annular flexible diaphragm device 13 that is attached to the drive plate 12 is also attached to the workpiece carrier rotor 35 which flexes in a direction parallel to the workpiece carrier rotor 35 rotation axis 21 or drive shaft 20 rotation axis 19. Here, the flexible diaphragm device 13 allows the workpiece carrier rotor 35 to be translated vertically along the workpiece carrier rotor 35 rotation axis 21

If the workpiece carrier rotor 35 rotation axis 21 is positioned to be offset a small distance from the hollow drive shaft 20 rotation axis 19 then the flexible diaphragm device 13 that is attached to both the workpiece carrier rotor 35 and to the drive plate 12 that is attached to the hollow drive shaft 20 will experience a small lateral distortion in a horizontal direction. Also, horizontal translation of the drive-pin device 5 will occur if the workpiece carrier rotor 35 rotation axis 21 is positioned to be offset a small distance from the hollow drive shaft 20 rotation axis 19.

The roller idlers 28 can have a cylindrical peripheral surface 4 or other surface shapes including a "spherical" hourglass type shape and can have low-friction roller bearings 30 or air bearings 30 and roller idler 28 seals 26 shape and can have low-friction roller bearings 30 or air bearings 30 and roller idler 28 seals 26. The roller idler 28 seals 26 prevent contamination of the low-friction roller bearings 30 or air bearings 30 by abrading debris or coolant water or other fluids or materials that are used in the abrading procedures. The air bearings 30 can provide zero friction and can rotate at very high speeds when the workpiece carrier rotor 35 is rotated at speeds of 3,000 rpm or more that are typically used in high speed flat lapping. Because the diameters of the roller idlers 28 are typically much smaller than the diameters of the workpiece carrier rotors 35 the roller idlers 28 typically have rotational speeds that are much greater than the rotational speeds of the workpiece carrier rotors 35.

Pressurized air or another fluid such as water 18 is supplied through the hollow drive shaft 20 that has a fluid passage 14 that allows pressurized air or another fluid such as water 18 to fill the sealed chamber 10 that is formed by the sealed annular flexible diaphragm device 13. This controlled fluid 18 pressure is present in the sealed chamber 10 to provide uniform abrading pressure 24 across the full flat top surface 8 of the carrier rotor 35 where uniform abrading pressure 24 pressure is directly transferred to the workpiece 32 abraded surface 33 that is in abrading contact with the abrasive 36 coating on the rotary platen 34. When the sealed chamber 10 is pressurized by a fluid, the sealed annular flexible diaphragm device 13 can tend to expand radially in a horizontal direction.

Radial expansion of the annular flexible elastomer, polymer or metal diaphragm device 13 that is attached to a sealed annular wall 6 and to a nominally-horizontal drive plate 12 occurs by flexing the flexible diaphragm device 13. The workpiece carrier rotor 35 and the flat-surfaced workpiece 32 such as a semiconductor wafer is allowed to be tilted from a horizontal position when they are stationary or rotated by the flexing action provided by the flexible diaphragm device 13 and vertical translation of the drive-pin device. The workpiece carrier rotor 35 can be operated at very high rotational speeds. The drive-pin device 5 can constructed from metals or corrosion-resistant metals such as stainless steel or from polymers.

When the flat-surfaced workpieces 32 and the workpiece carrier rotor 35 are subjected to abrading friction forces that are parallel to the abraded surface 33 of the workpieces 32, these abrading friction forces are resisted by the workpiece carrier rotor 35 as it contacts the multiple idlers 28 that are located around the outer periphery of the workpiece carrier rotor 35. The circular drive plate 12 has an outer periphery 2 spherical shape which allows the workpiece carrier rotor 35 outer periphery 2 to remain in contact with the cylindrical-surfaced roller idlers 28 when the rotating carrier rotor 35 is tilted where the stationary-position surfaced roller idlers 28 that are spaced around the outer periphery of the workpiece carrier rotor 35 act together as a centering device that controls the center of rotation of the workpiece carrier rotor 35 as it rotates.

The circular drive plate 12 outer periphery 2 spherical shape provides that the center of rotation of the workpiece carrier rotor 35 remains aligned with the rotational axis of drive shaft 20 when the workpiece carrier rotor 35 is tilted as it rotates. The workpiece carrier rotor 35 can be tilted due to numerous causes including: flat-surfaced workpiece 32 that have non-parallel opposed surfaces; misalignment of components of the stationary workpiece carrier head 17; misalignment of other components of the abrading machine (not shown); a platen 34 that has an abrading surface 31 that is not flat.

The rigid member 7 is attached to the at least one individual drive-pin device 5 that are in sliding contact with a radial bar 11 that is attached to the drive shaft 20 hub 3 where the nominally-rigid member 11 is attached to the carrier rotor 35 and where the at least one individual drive-pin device 5 and the radial bar 11 are used to rotate the carrier rotor 35.

The at least one individual drive-pin device 5 and the radial bar 11 are selected to provide substantial tangential torque forces to rotationally drive the carrier rotor 35. The vertical and horizontal sliding action between the sliding-contact drive-pin device 5 and the radial bar 11 provide motion of the workpiece carrier rotor 35 in a direction along the workpiece carrier rotor 35 rotation axis 21 to allow the workpiece rotor 35 to be translated along the workpiece carrier rotor 35 rotation axis 21 as changes in the air or fluid pressure 18 pressure 24 present in the sealed chamber 10 causes motion of the workpiece rotor 35.

The flexible diaphragm device 13 forms a sealed chamber 10 that allows pressurized air or another fluid such as water 18 to fill the sealed chamber 10 to provide controlled abrading pressure to be applied to the workpiece 32 abraded surface 33 that is in abrading contact with the abrasive 36 coating on the rotary platen 34. The flexible diaphragm device 13 does not provide the primary drive torque to rotate the workpiece carrier rotor 35 as this workpiece carrier rotor 35 rotation drive, acceleration or stopping torque is provided by the drive-pin device 5. In another embodiment, the sealed flexible diaphragm device 13 can be replaced by a sealed flexible bellows-type device (not shown) that provides flexing in a direction along the rotational axis 21 of the workpiece carrier rotor 35.

Figure 2:
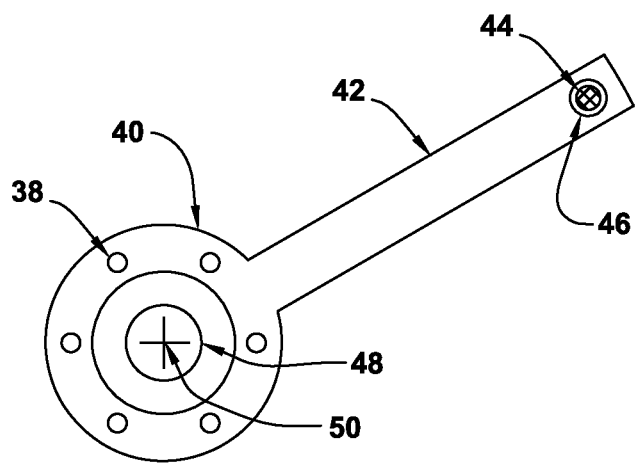
FIG. 2 is a top view of a pin-bracket floating workpiece carrier drive device.

FIG. 2 is a top view of a pin-bracket floating workpiece carrier drive device. A nominally-rigid rotational pin bracket 40 configuration shown here has an extended arm 42 that has a distal end that is in sliding contact with a drive pin 44 where the arm 42 has a pin access hole 46. The pin bracket 40 is shown with attachment bolt holes 38 to attach it to a workpiece carrier hub (not shown) that is attached to a rotatable spindle shaft 48. The pin bracket 40 is rotated about the pin bracket 40 rotation axis 50 to transmit the drive torque force loads from the pin bracket 40 to the drive pins 44 that are required to rotate the workpiece carrier rotor (not shown) during abrading operations. Other configurations of the pin bracket 40 include brackets that have hub shapes rather than arms 42 where single or multiple pins 44 can be contacted by at least one pin bracket 40.

Figure 3:
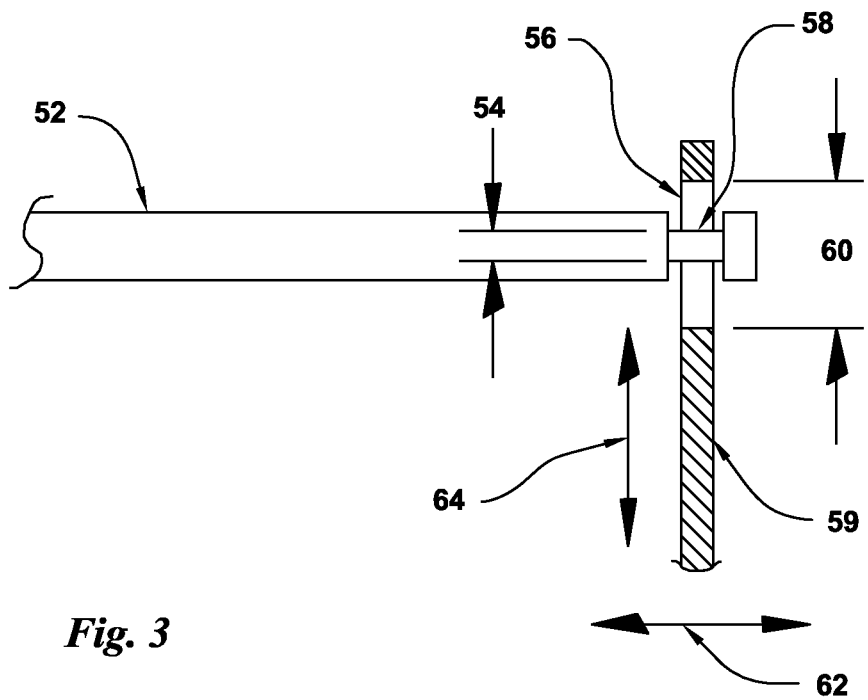
FIG. 3 is a cross section view of a slide-pin driven floating workpiece carrier rotation device.

FIG. 3 is a cross section view of a slide-pin driven floating workpiece carrier rotation device. A rotary carrier leg 52 is attached on one end to a rotatable spindle shaft (not shown) has a slideable pin 58 attached at the opposite end of the carrier leg 52 where the pin 58 has a diameter 54 that is smaller than the width (not shown) of the narrow slot 56 in a rotary arm 59 that captures the pin 58. The rotary arm 59 is attached to workpiece carrier plate (not shown). The pin 58 is in sliding contact with the rotary arm 59 where the rotary arm 59 transmits rotational forces from the spindle shaft to the pin 58 that rotate the workpiece carrier in both clockwise and counterclockwise directions to accelerate and decelerate the workpiece carrier. The pin 58 slides within the rotary arm 59 slot 56 having a vertical slot length 60 in a vertical direction 64 and also slides within the rotary arm 59 slot 56 in a horizontal direction 62.

Figure 4:
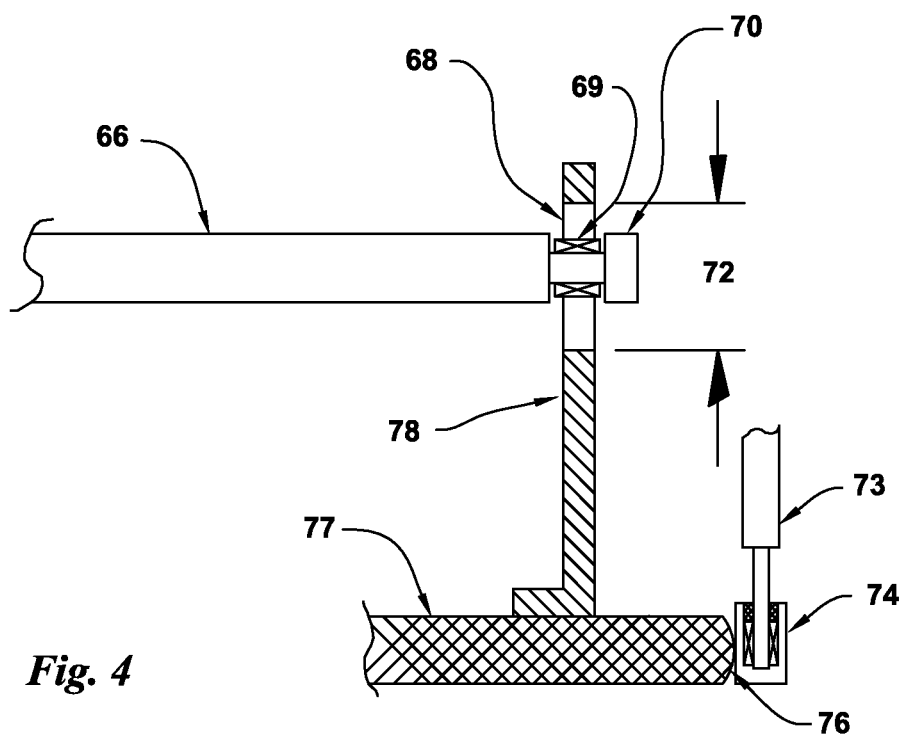
FIG. 4 is a cross section view of a slide-pin driven floating carrier constrained with idlers.

FIG. 4 is a cross section view of a slide-pin driven floating carrier constrained with idlers. A rotary carrier leg 66 that is attached on one end to a rotatable spindle shaft (not shown) has a slideable pin 70 attached at the opposite end of the carrier leg 66 where the pin 70 has a diameter that is smaller than the width (not shown) of the narrow slot 68 in a rotary arm 78 that captures the pin 70. The rotary arm 78 is attached to a workpiece carrier plate 77. The pin 70 shaft is shown with a rotary bearing 69 which is in sliding contact with the rotary arm 78 where the rotary arm 78 transmits rotational forces to the pin 70 through the bearing 69 to rotate the workpiece carrier 77 in both clockwise and counterclockwise directions to accelerate and decelerate the workpiece carrier 77.

The pin 70 and bearing 69 slide within the slot 68 having a vertical slot length 72 in a vertical direction within the vertical slot 68 in the rotary arm 78 and also slides within the slot 68 in a horizontal direction. The bearing 69 is mounted on the pin 70 to reduce the sliding friction between the pin 70 and the rotary arm 78 that is attached to the workpiece carrier plate 77. The bearing 69 can be a small-diameter needle bearing, a roller bearing or a sleeve-type bearing. The circular workpiece carrier plate 77 has a spherical surface 76 that is contacted by rotary bearing idlers 74 that are supported by idler shafts 73.

The idlers 74 are shown with cylindrical surfaces that are in rotating contact with a spherical-shaped 76 outer annular periphery of the circular workpiece carrier plate 77. In another embodiment, the idlers 74 can have spherical surface shapes and the circular workpiece carrier plate 77 can have an annular cylindrical shape where the circular workpiece carrier plate 77 can pivot or be tilted while it maintains running-contact with the idlers 74.

Figure 5:
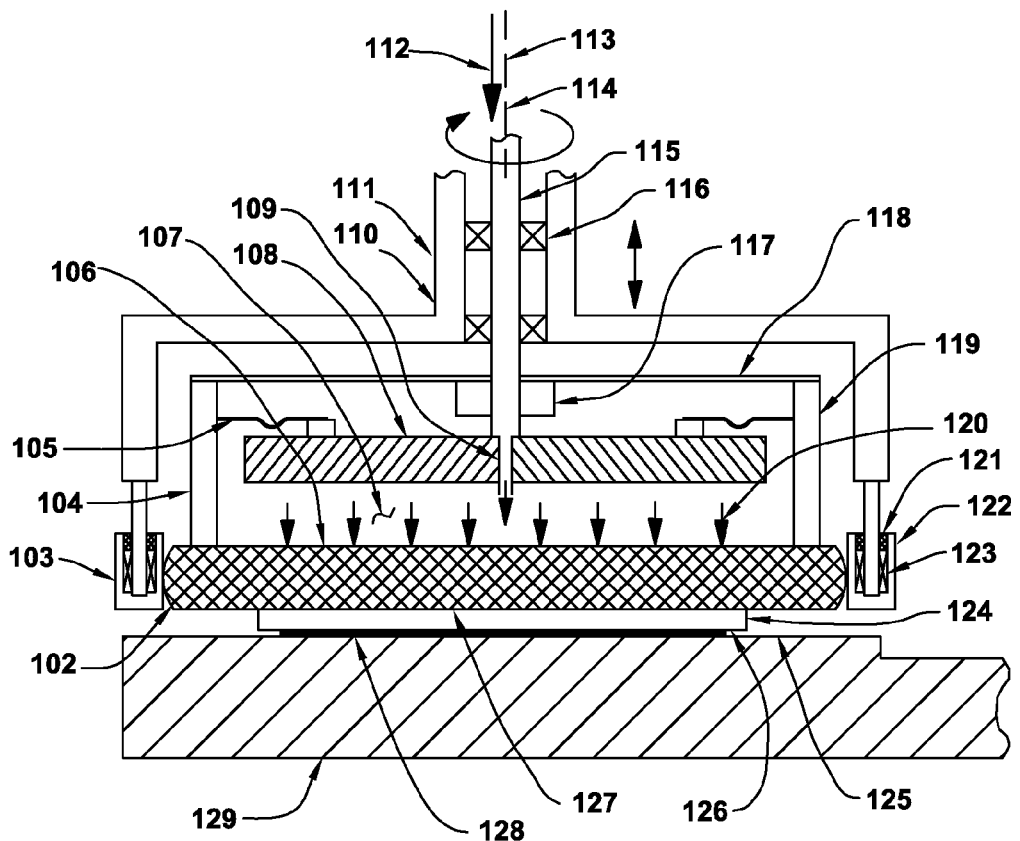
FIG. 5 is a cross section view of a flexible arm driven flexible diaphragm workpiece carrier.

FIG. 5 is a cross section view of a flexible arm driven flexible diaphragm workpiece used for lapping or polishing semiconductor wafers or other workpiece substrates. A stationary workpiece carrier head 111 has a flat-surfaced workpiece 124 that is attached to a floating workpiece carrier rotor 127 that is rotationally driven by a rigid annular member 104 or multiple individual posts 119. A nominally-horizontal drive plate 108 is attached to a hollow drive shaft 115 having a rotation axis 113 that is supported by bearings 116 that are supported by a stationary carrier housing 110 where the carrier housing 110 can be raised and lowered in a vertical direction.

A rotationally rigid but vertically flexible spider-arm device 118 having at least one individual arm is attached to the hollow drive shaft 115 where rotation of the hollow drive shaft 115 rotates the rotational spider-arm device drive arm 118. The spider-arm device 118 is attached a sealed rigid annular member 104 or multiple individual posts 119 that is/are attached to the workpiece carrier rotor 127 which allows the spider-arm device 118 to rotationally drive the workpiece carrier rotor 127. The workpiece carrier rotor 127 has an outer periphery 102 that has a spherical shape which allows the workpiece carrier rotor 127 outer periphery 102 to remain in contact with stationary rotatable roller idlers 122 when the rotating carrier rotor 127 is tilted.

The workpiece carrier rotor 127 has a rotation axis 114 that is coincident or near-coincident with the hollow drive shaft 115 rotation axis 113 to avoid interference action of the workpiece carrier rotor 127 with the hollow drive shaft 115 when the hollow drive shaft 115 is rotated. The workpiece 124 carrier rotor 127 rotation axis 114 is positioned to be coincident or near-coincident with the hollow drive shaft 115 rotation axis 113 by the controlled location of the stationary roller idlers 122 that are mounted to the stationary workpiece carrier head 111. Rolling contact of the workpiece carrier rotor 127 outer periphery 102 with the set of stationary roller idlers 122 that are precisely located at prescribed positions assures that the workpiece carrier rotor 127 rotation axis 114 is coincident or near-coincident with the hollow drive shaft 115 rotation axis 113. The stationary roller idlers 122 are mounted at positions on the carrier housing 110 where the diameters of the stationary roller idlers 122 and the diameters of the respective workpiece carrier rotors 127 are selected to provide that the workpiece carrier rotor 127 rotation axis 114 is coincident or near-coincident with the hollow drive shaft 115 rotation axis 113.

An annular flexible diaphragm device 105 that is attached to the drive plate 108 is also effectively attached to the workpiece carrier rotor 127 which flexes in a direction parallel to the workpiece carrier rotor 127 rotation axis 114 or drive shaft 115 rotation axis 113. Here, the flexible diaphragm device 105 allows the workpiece carrier rotor 127 to be translated vertically along the workpiece carrier rotor 127 rotation axis 114

If the workpiece carrier rotor 127 rotation axis 114 is positioned to be offset a small distance from the hollow drive shaft 115 rotation axis 113 then the flexible diaphragm device 105 that is attached to both the workpiece carrier rotor 127 and to the drive plate 108 that is attached to the hollow drive shaft 115 will experience a small lateral distortion in a horizontal direction. Also, horizontal translation of the spider-arm device 118 will occur if the workpiece carrier rotor 127 rotation axis 114 is positioned to be offset a small distance from the hollow drive shaft 115 rotation axis 113.

The roller idlers 122 can have a cylindrical peripheral surface 103 or other surface shapes including a "spherical" hour-glass type shape and can have low-friction roller bearings 123 or air bearings 123 and roller idler 122 seals 121 shape and can have low-friction roller bearings 123 or air bearings 123 and roller idler 122 seals 121. The roller idler 122 seals 121 prevent contamination of the low-friction roller bearings 123 or air bearings 123 by abrading debris or coolant water or other fluids or materials that are used in the abrading procedures. The air bearings 123 can provide zero friction and can rotate at very high speeds when the workpiece carrier rotor 127 is rotated at speeds of 3,000 rpm or more that are typically used in high speed flat lapping. Because the diameters of the roller idlers 122 are typically much smaller than the diameters of the workpiece carrier rotors 127 the roller idlers 122 typically have rotational speeds that are much greater than the rotational speeds of the workpiece carrier rotors 127.

Pressurized air or another fluid such as water 112 is supplied through the hollow drive shaft 115 that has a fluid passage 109 that allows pressurized air or another fluid such as water 112 to fill the sealed chamber 107 that is formed by the sealed annular flexible diaphragm device 105. This controlled fluid 112 pressure is present in the sealed chamber 10 to provide uniform abrading pressure 120 across the full flat top surface 106 of the carrier rotor 127 where uniform abrading pressure 120 pressure is directly transferred to the workpiece 124 abraded surface 126 that is in abrading contact with the abrasive 128 coating on the rotary platen 129. When the sealed chamber 107 is pressurized by a fluid, the sealed annular flexible diaphragm device 105 can tend to expand radially in a horizontal direction.

Radial expansion of the annular flexible elastomer, polymer or metal diaphragm device 105 that is attached to a sealed annular wall 104 and to a nominally-horizontal drive plate 108 occurs by flexing the flexible diaphragm device 105. The workpiece carrier rotor 127 and the flat-surfaced workpiece 124 such as a semiconductor wafer is allowed to be tilted from a horizontal position when they are stationary or rotated by the flexing action provided by the flexible diaphragm device 105 and vertical translation of the drive-pin device. The workpiece carrier rotor 127 can be operated at very high rotational speeds. The spider-arm device 118 can constructed from metals or corrosion-resistant metals such as stainless steel or from polymers.

When the flat-surfaced workpieces 124 and the workpiece carrier rotor 127 are subjected to abrading friction forces that are parallel to the abraded surface 126 of the workpieces 124, these abrading friction forces are resisted by the workpiece carrier rotor 127 as it contacts the multiple idlers 122 that are located around the outer periphery of the workpiece carrier rotor 127. The circular drive plate 108 has an outer periphery 102 spherical shape which allows the workpiece carrier rotor 127 outer periphery 102 to remain in contact with the cylindrical-surfaced roller idlers 122 when the rotating carrier rotor 127 is tilted where the stationary-position surfaced roller idlers 122 that are spaced around the outer periphery of the workpiece carrier rotor 127 act together as a centering device that controls the center of rotation of the workpiece carrier rotor 127 as it rotates.

The circular drive plate 108 outer periphery 102 spherical shape provides that the center of rotation of the workpiece carrier rotor 127 remains aligned with the rotational axis of drive shaft 115 when the workpiece carrier rotor 127 is tilted as it rotates. The workpiece carrier rotor 127 can be tilted due to numerous causes including: flat-surfaced workpiece 124 that have non-parallel opposed surfaces; misalignment of components of the stationary workpiece carrier head 111; misalignment of other components of the abrading machine (not shown); a platen 129 that has an abrading surface 125 that is not flat.

The rigid member 119 is attached to the at least one individual drive-pin device 5 that are in sliding contact with the spider-arm device 118 that is attached to the drive shaft 115 hub 117 where the spider-arm device 118 is attached to the carrier rotor 127 and where the at least one individual drive-pin device 5 and the spider-arm device 118 are used to rotate the carrier rotor 127.

The at least one spider-arm device 118 and the sealed annular wall 104 are selected to provide substantial tangential torque forces to rotationally drive the carrier rotor 127. The sealed annular wall 104 and the spider-arm device 118 provide motion of the workpiece carrier rotor 127 in a direction along the workpiece carrier rotor 127 rotation axis 114 to allow the workpiece rotor 127 to be translated along the workpiece carrier rotor 127 rotation axis 114 as changes in the air or fluid pressure 112 pressure 120 present in the sealed chamber 107 causes motion of the workpiece rotor 127.

The flexible diaphragm device 105 forms a sealed chamber 107 that allows pressurized air or another fluid such as water 112 to fill the sealed chamber 107 to provide controlled abrading pressure to be applied to the workpiece 124 abraded surface 126 that is in abrading contact with the abrasive 128 coating on the rotary platen 129. The flexible diaphragm device 105 does not provide the primary drive torque to rotate the workpiece carrier rotor 127 as this workpiece carrier rotor 127 rotation drive, acceleration or stopping torque is provided by the spider-arm device 118. In another embodiment, the sealed flexible diaphragm device 105 can be replaced by a sealed flexible bellows-type device (not shown) that provides flexing in a direction along the rotational axis 114 of the workpiece carrier rotor 127.

Workpieces and workpiece carriers can be rotated by the use of drive-lug pins that are in sliding contact with a workpiece carrier device hub that typically rotates in either a clockwise or counterclockwise direction. During an abrading operation, the workpiece and the workpiece carrier are accelerated from a stationary position until a desired rotational speed of the workpiece is reached. During the acceleration of the workpiece, the drive pin that is attached to the rotating workpiece carrier is in force-transmitting contact with one side of a pin slot that is an integral part of the workpiece carrier device hub. There is a small difference in the size of the drive pin and the size of the drive pin slot to form small gaps between drive pin and the pin slot that allows free vertical motion of the workpiece carrier relative to the workpiece carrier device hub. When a workpiece carrier is accelerated, the pin-to-slot gap exists on the opposite side of the pin from where the pin is in sliding contact with the workpiece carrier hub. When a workpiece carrier is decelerated, the pin-to-slot gap exists on the other opposed side of the pin.

Changing the acceleration and deceleration of the workpiece during the abrading operation results in the drive pin traversing the pin-to-slot gaps which can cause a dynamic upset impact forces and sudden workpiece rotational speed changes to occur on the workpiece carrier which can cause non-uniform abrading patterns on the workpiece surface. However, when a flexible spider-arm device that is attached to both the workpiece carrier and to the workpiece carrier hub is used to rotate the workpiece carrier, there is no dynamic upset force that is applied to the workpiece carrier when the workpiece carrier is accelerated or decelerated because there are no physical gaps between the spider arm device and either the workpiece carrier and the workpiece carrier hub. Repetitive changes in the acceleration and deceleration of the workpiece results in continuously smooth changes of the rotational speed of the workpiece carrier without the occurrence of impact forces or sudden rotational speed changes.

Figure 6:
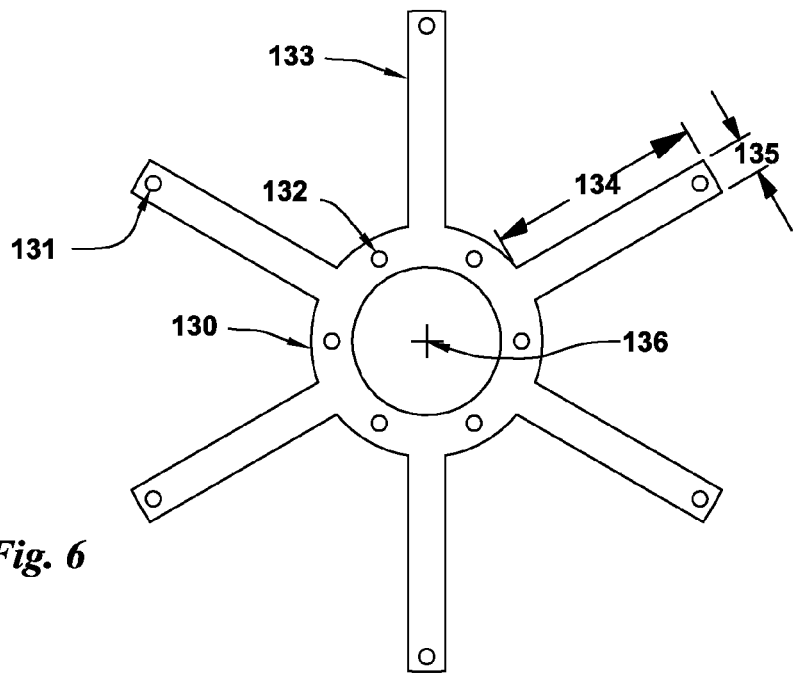
FIG. 6 is a top view of a flexible spider-arm floating workpiece carrier drive device.

FIG. 6 is a top view of a flexible spider-arm floating workpiece carrier drive device. A flexible spider-arm device 130 has multiple individual flexible spider arms 133 that have spider arm 133 lengths 134 and spider arm widths 135. The spider arms 133 have attachment bolt holes 131 and the spider-arm device 130 has attachment bolt holes 132. The widths 135 of the spider arms 133 provide substantial torsional stiffness for the spider arms 133 as the spider-arm device 130 is rotated about the spider-arm device 130 rotation axis 136 even though the spider-arm device 130 is constructed from a thin material. The thin-material spider arms 133 are flexible in a direction along the spider-arm device 130 rotation axis 136. The number of individual flexible spider arms 133 that are used are selected to provide uniform vertical motion of the workpiece carrier rotor (not shown) and to distribute the drive torque force loads that are required to rotate the workpiece carrier rotor during abrading operations.

Figure 7:
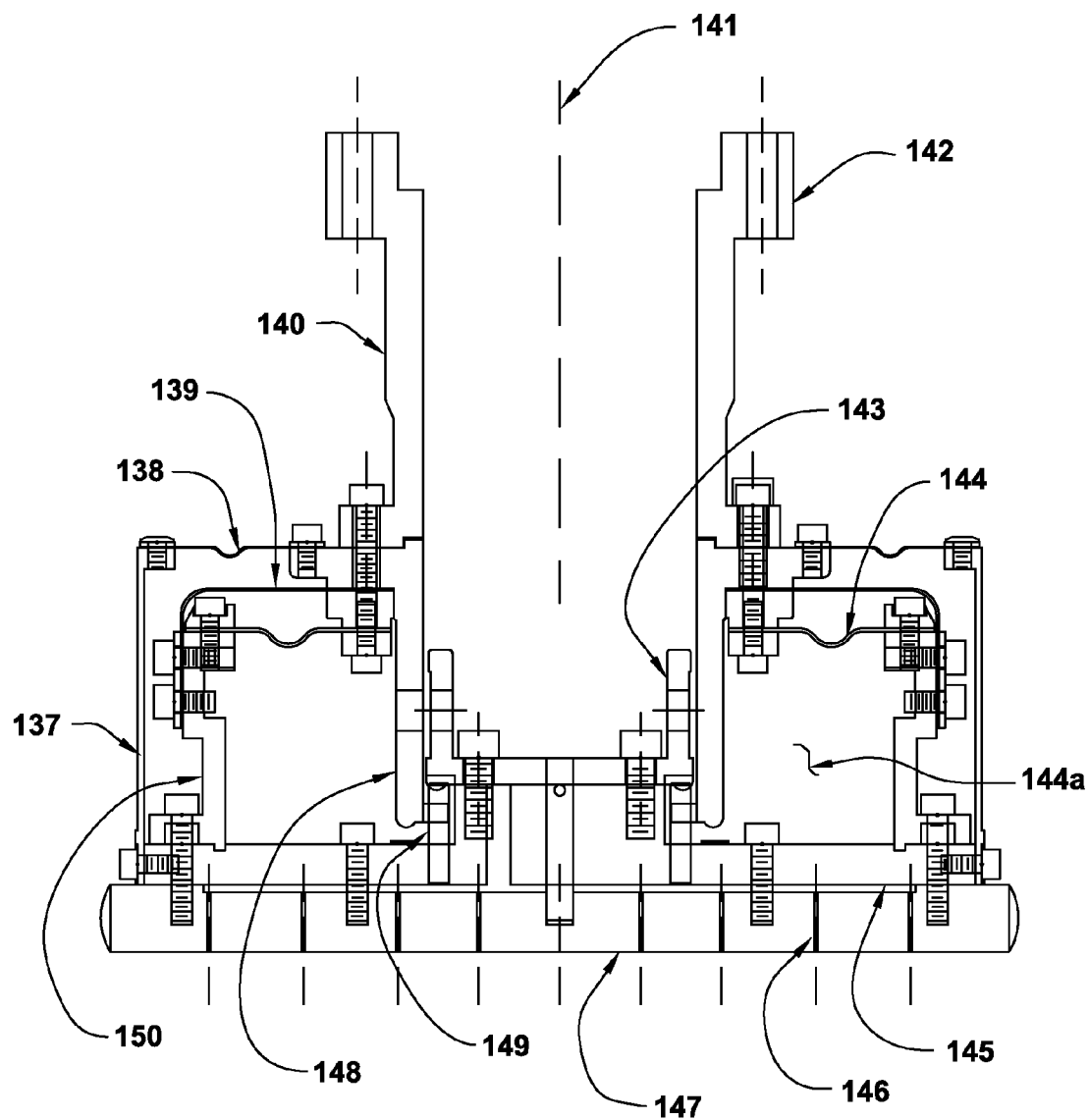
FIG. 7 is a cross section view of a flexible diaphragm workpiece carrier debris shield.

FIG. 7 is a cross section view of a flexible diaphragm workpiece carrier debris shield. An abrading workpiece carrier head 140 rotates about an axis 141 where the abrading workpiece carrier head 140 has a housing 142 that has an attached workpiece (not shown) vertical and horizontal excursion control device 148. A movable horizontal excursion control device 143 contacts the vertical and horizontal excursion control device 148 when the relative free-motion controlled-distance between them diminishes sufficiently during abrading operation of the abrading workpiece carrier head 140. An abrading workpiece is attached to a rotatable workpiece carrier 147 with vacuum through vacuum port holes 146 where the rotatable workpiece carrier 147 is attached to a support plate 145 that is attached to the movable horizontal excursion control device 143.

When the workpiece carrier head 140 housing 142 is rotated, the rotatable workpiece carrier 147 is rotated either by at least one drive pin 149 that is attached to the a support plate 145 where the at least one drive pin 149 that is in sliding contact with the horizontal excursion control device 148 or by use of a spider-arm rotational drive device 139 that is attached to both the workpiece carrier head 140 housing 142 and the rotational drive bracket 150 that is attached to the a support plate 145. The drive pin 149 can also be used in conjunction with the spider-arm rotational drive device 139 where the spider-arm rotational drive device 139 rotates the workpiece carrier 147 with no slack or gap between the workpiece carrier head 140 housing 142 and the rotational drive bracket 150 but the drive pin 149 provides a safety-measure back-up stop device that would prevent rotation of the workpiece carrier 147 in the event of structural failure of the spider-arm rotational drive device 139.

An annular sealed debris shield 137 together with an attached flexible annular debris shield 138 prevents coolant water and abrading debris from entering the interior of the abrading workpiece carrier head 140. Here, the sealed flexible annular debris shield 138 is attached both to the annular sealed debris shield 137 and the workpiece carrier head 140 housing 142. The flexibility of the sealed flexible annular debris shield 138 is allows relative motion between the workpiece carrier 147 and the workpiece carrier head 140 housing 142. Also, a sealed flexible annular disk 144 is attached to both the workpiece carrier head 140 housing 142 and the rotational drive bracket 150 to form a sealed pressure chamber 144a that is used to apply abrading pressure to the workpiece during an abrading operation.

The sealed flexible annular debris shield 138 and the sealed flexible annular disk 144 can be constructed from materials including elastomers, polyurethane, silicone rubber, polymer impregnated cloth, metals and can be mold-formed or fabricated to create an annular portion that is flexible in a radial direction. Also, the sealed flexible annular debris shield 138 and the sealed flexible annular disk 144 can be constructed where these rotatable flexible annular disk devices have an out-of-plane annular surface curvature that increases their flexibility in a radial direction perpendicular to the flexible annular disk device axis of rotation 141.

Figure 8:
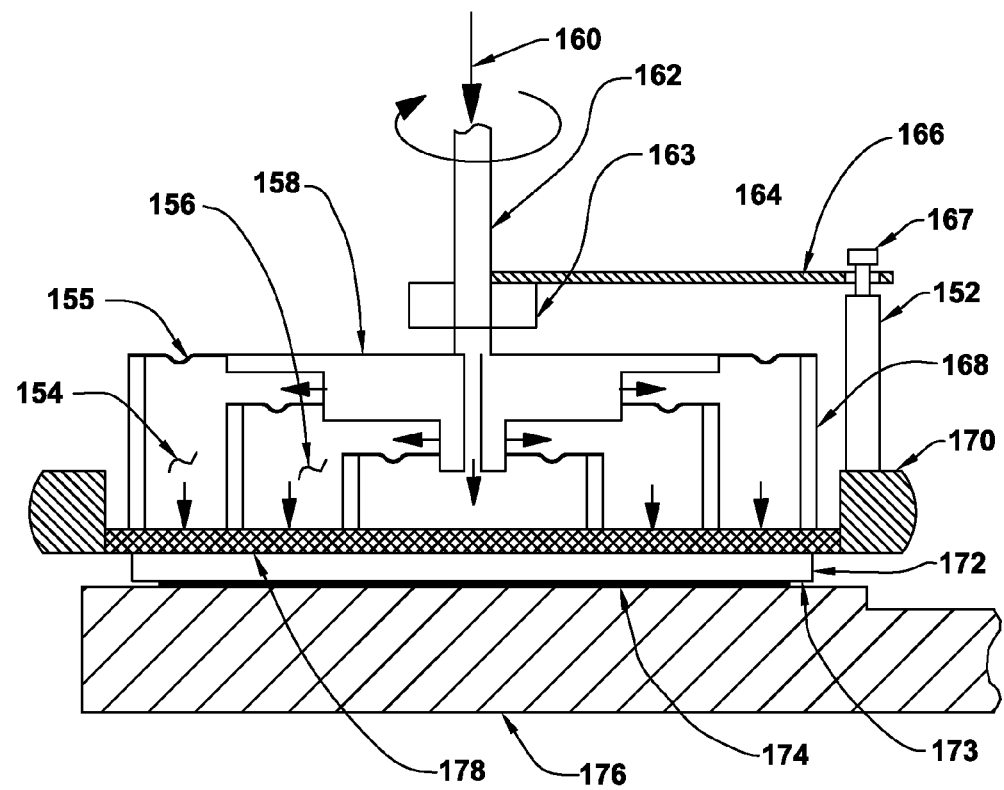
FIG. 8 is a cross section view of a drive pin diaphragm carrier with multiple chambers.

FIG. 8 is a cross section view of a drive pin diaphragm workpiece carrier with multiple pressure chambers. A flat-surfaced workpiece 172 is attached to a nominally-horizontal floating workpiece carrier rotor 170 that is rotationally driven by a sliding pin arm device 166 that is attached to a drive hub 163 that is attached to a hollow drive shaft 162. The ends of the pin arm 166 are in sliding contact with a sliding pin 167 that is attached to a bracket 152 that is attached to the workpiece carrier rotor 170. In one embodiment, sealed annular flexible elastomer disks 155 are attached on an outer radial surface to sealed annular walls 168 that are attached to the central flexible bottom portion 178 of the workpiece carrier rotor 170 and are attached at the inner radial surface to the drive plate 158. In another embodiment, the sealed annular walls 168 that are attached to the central flexible bottom portion 178 can be flexible where the sealed annular walls 168 and the central flexible bottom portion 178 can be integral with each other and constructed from materials including elastomers, polyurethane, silicone rubber, polymer impregnated cloth, metals.

The workpiece 172 is attached to the central flexible bottom portion 178 of the workpiece carrier rotor 170 by vacuum, low-tack adhesives or adhesive-bonding provided by water films that mutually wet the surfaces of both the workpiece 172 and the central flexible bottom portion 178 of the workpiece carrier rotor 170. Single or multiple workpieces 172 can be attached to the flexible bottom portion 178 of the workpiece carrier rotor 170.

Pressurized air or another fluid such as water 160 or vacuum is supplied through the hollow drive shaft 162 that has fluid passages which allows multiple pressurized air or another fluid such as water 160 to fill the independent sealed pressure chambers 154, 156 and 163 that are formed by the sealed annular flexible elastomer disks 155. Different controlled fluid 160 pressures are present in each of the independent annular or circular sealed chambers 154, 156 and 163 to provide uniform abrading action across the full flat abraded surface 173 of the workpiece 172 that is in abrading contact with the abrasive 174 coating on the rotary platen 176. When the sealed pressure chambers 154, 156 and 163 are pressurized by a fluid, the sealed annular flexible elastomer disks 155 are flexed vertically and the sliding pin 167 also moves upward or downward in a vertical direction but stays in sliding contact with the sliding pin arm device 166.

Vacuum or pressure can be supplied independently to the annular or circular sealed chambers 154, 156 and 163 to provide attachment of workpieces 172 to the central flexible bottom portion 178 of the workpiece carrier rotor 170 or a combination of vacuum or pressures may be used to optimize the uniform abrading of the abraded surface of the workpieces 172.

In another embodiment, the pin arm 166 and the sliding pin 167 that is attached to the bracket 152 can be replaced with a spider-arm rotation device (not shown) that is attached to the workpiece carrier rotor 170 to rotate the workpiece carrier rotor 170 where the sealed annular flexible elastomer disks 155 are used to provide the independent annular or circular sealed chambers 154, 156 and 163

Figure 9:
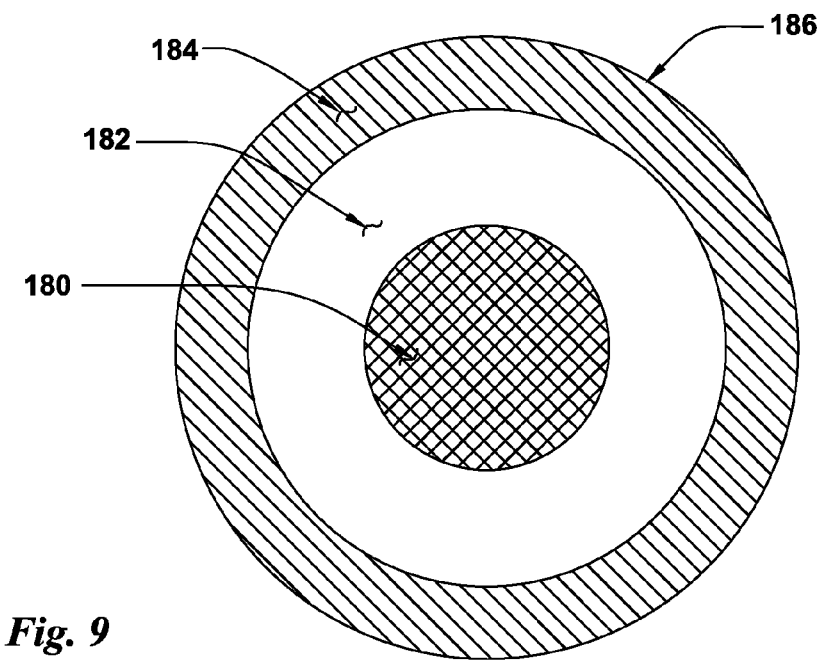
FIG. 9 is a top view of a driven workpiece carrier with multiple pressure chambers.

FIG. 9 is a top view of a driven workpiece carrier with multiple pressure chambers. A flexible-bottom workpiece holder 186 of the has an annular outer abrading pressure zone 184, an annular inner abrading pressure zone 182 and a circular inner abrading pressure zone 180. The abrading pressure is independently controlled in each of the three zones 184, 182 and 180. The device shown here has three independent pressure zones but other device embodiments can have five or more independent pressure zones.

Figure 9A:
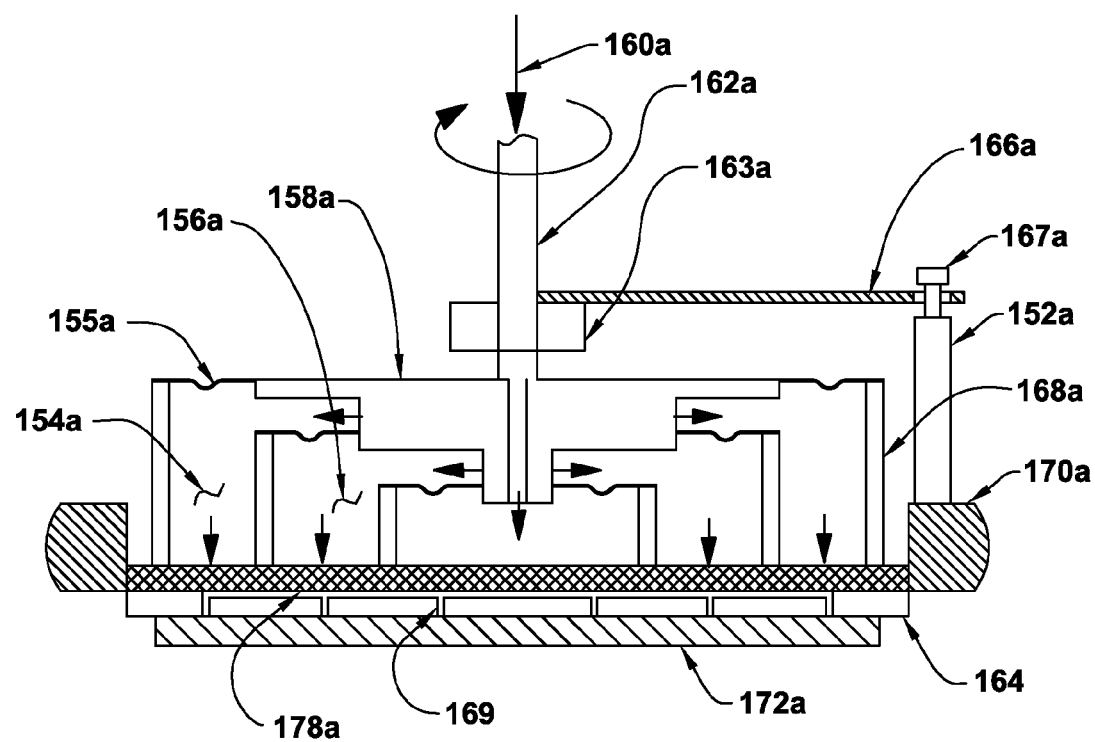
FIG. 9A is a cross section view of a flexible workpiece carrier with vacuum carrier ports.

FIG. 9A is a cross section view of a flexible bottom workpiece carrier with vacuum ports in the workpiece carrier. A flat-surfaced workpiece 172a is attached to a nominally-horizontal floating workpiece carrier rotor 170a that is rotationally driven by a sliding pin arm device 166a that is attached to a drive hub 163a that is attached to a hollow drive shaft 162a. The ends of the pin arm 166a are in sliding contact with a sliding pin 167a that is attached to a bracket 152a that is attached to the workpiece carrier rotor 170a. In one embodiment, sealed annular flexible elastomer disks 155a are attached on an outer radial surface to sealed annular walls 168a that are attached to the central flexible bottom portion 178a of the workpiece carrier rotor 170a and are attached at the inner radial surface to the drive plate 158a.

In this embodiment, the sealed annular walls 168a that are attached to the central flexible bottom portion 178a can be flexible where the sealed annular walls 168a and the central flexible bottom portion 178a can be integral with each other and constructed from materials including elastomers, polyurethane, silicone rubber, polymer impregnated cloth, metals. The workpiece 172a can be attached to the central flexible bottom portion 178a of the workpiece carrier rotor 170a by vacuum that is present in vacuum port holes 169 that are at part of the vacuum passageways that are in a flexible bottom device 164 that is attached to the flexible bottom portion 178a of the workpiece carrier rotor 170a.

Pressurized air or another fluid such as water 160a or vacuum is supplied through the hollow drive shaft 162a that has fluid passages which allows multiple pressurized air or another fluid such as water 160a to fill the independent sealed pressure chambers 154a, 156a and 163a that are formed by the sealed annular flexible elastomer disks 155a. Different controlled fluid 160a pressures are present in each of the independent annular or circular sealed chambers 154a, 156a and 163a to provide uniform abrading action across the full flat abraded surface 173 of the workpiece 172a that is in abrading contact with the abrasive 174 coating on the rotary platen 176. When the sealed pressure chambers 154a, 156a and 163a are pressurized by a fluid, the sealed annular flexible elastomer disks 155a are flexed vertically and the sliding pin 167a also moves upward or downward in a vertical direction but stays in sliding contact with the sliding pin arm device 166a.

Vacuum or pressure can be supplied independently to the annular or circular sealed chambers 154a, 156a and 163a to provide attachment of workpieces 172a to the central flexible bottom portion 178a of the workpiece carrier rotor 170a or a combination of vacuum or pressures may be used to optimize the uniform abrading of the abraded surface of the workpieces 172a.

Figure 10:
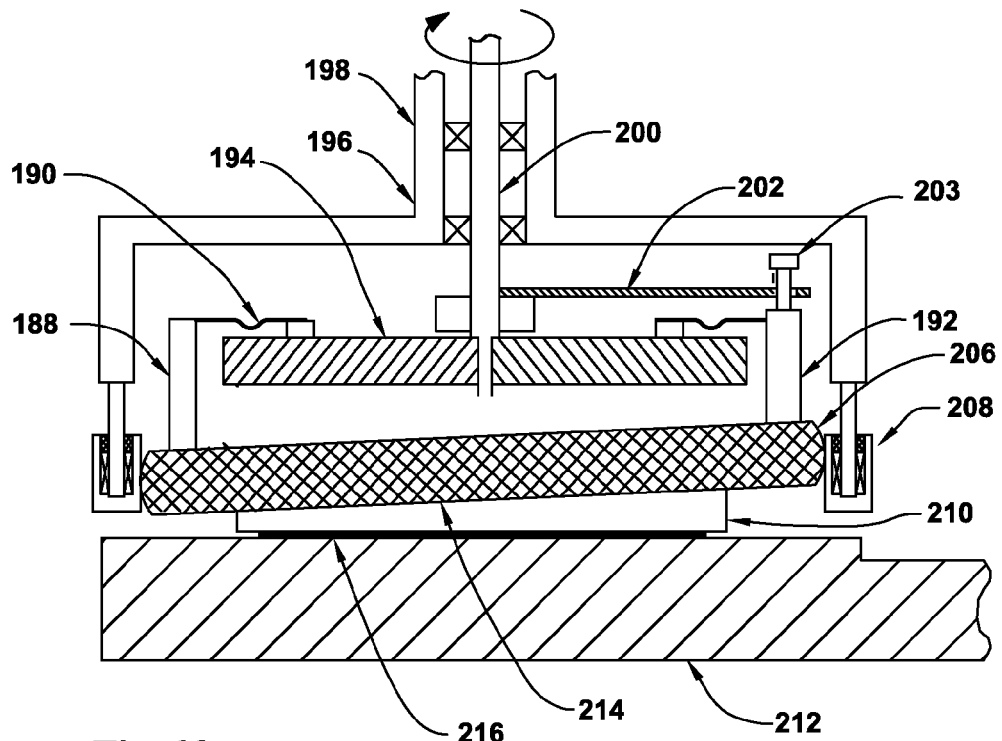
FIG. 10 is a cross section view of a flexible diaphragm workpiece carrier, angled workpiece.

In another embodiment, the pin arm 166a and the sliding pin 167a that is attached to the bracket 152a can be replaced with a spider-arm rotation device (not shown) that is attached to the workpiece carrier rotor 170a to rotate the workpiece carrier rotor 170a where the sealed annular flexible elastomer disks 155a are used to provide the independent annular or circular sealed chambers 154a, 156a and 163a FIG. 10 is a cross section view of a flexible diaphragm workpiece carrier with an angled workpiece. A workpiece abrading carrier head device 198 has a floating workpiece carrier rotor 206 and a carrier housing 196. A flat-surfaced workpiece 210 having an angled-surface shape is attached to the nominally-horizontal floating workpiece carrier rotor 206 that is rotationally driven by a sliding drive pin device 202 that is attached to a drive shaft 200. The at least one drive pin 203 is attached to a bracket 192 that is attached to the workpiece carrier rotor 206. An annular flexible diaphragm device 190 is attached to a sealed annular wall 188 that is attached to the workpiece carrier rotor 206 and is attached at the opposed end to the drive plate 194. The angled-surface workpiece 210 is attached to the workpiece carrier rotor 206 by vacuum, low-tack adhesives or adhesive-bonding provided by water films that mutually wet the surfaces of both the workpiece 210 and the workpiece carrier rotor 206.

Rolling contact of the workpiece carrier rotor 206 outer periphery with a set of multiple stationary roller idlers 208 that are precisely located at prescribed positions assures that the workpiece carrier rotor 206 rotation axis is coincident with the hollow drive shaft 200 rotation axis. The stationary roller idlers 208 are mounted at positions on the carrier housing 196 where the diameters of the stationary roller idlers 208 and the diameters of the workpiece carrier rotors 206 are considered in the design and fabrication of the workpiece carrier head 198 to provide that the workpiece carrier rotor 206 rotation axis is precisely coincident with the hollow drive shaft 200 rotation axis.

The angled-surface workpiece 210 that is attached to the workpiece carrier rotor 206 moves the drive pin 202 is upward to compensate for the upward motion of the workpiece carrier rotor 206 as the workpiece carrier rotor 206 and the bracket 192 are rotated by the drive shaft 200. Flexing of the annular flexible diaphragm device 190 occurs and the vertical, and horizontal, movement of the drive pin 203 allow the abraded surface of the angled-surface workpiece 210 to remain in flat-surfaced abrading contact with the abrasive 216 coating on the rotary platen 212 as the surface workpiece 210 is rotated.

Figure 11:
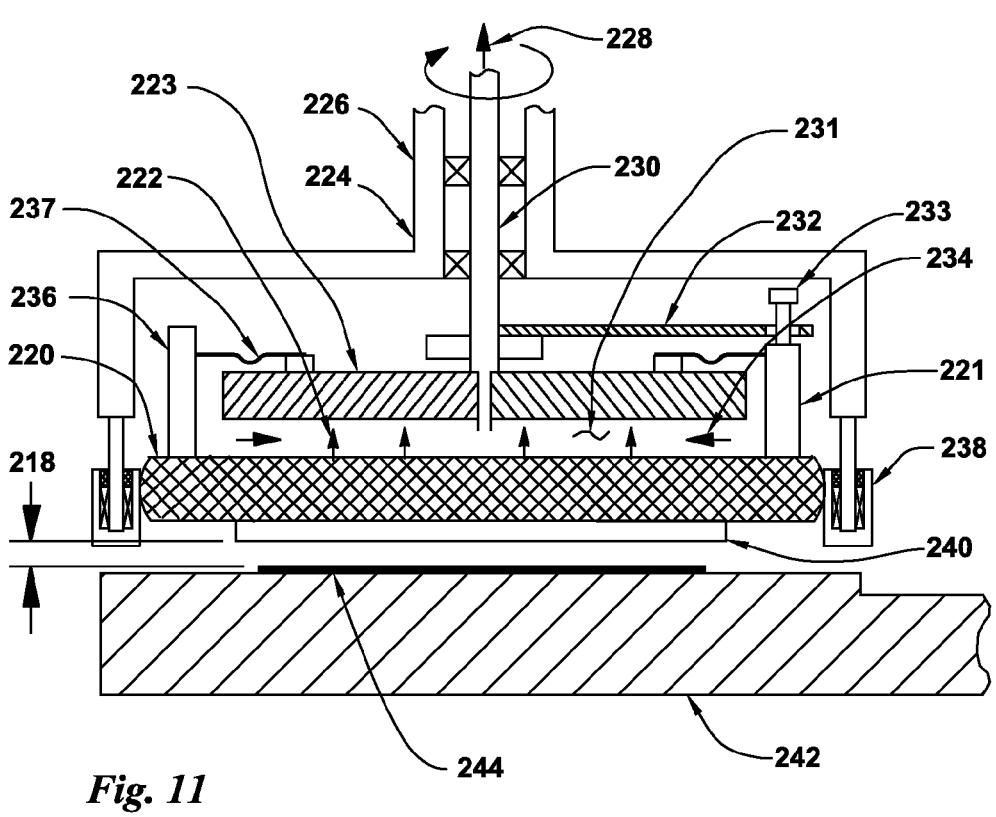
FIG. 11 is a cross section view of a diaphragm workpiece carrier with a raised workpiece.

FIG. 11 is a cross section view of a sliding drive pin flexible diaphragm workpiece carrier with a raised workpiece. A workpiece abrading carrier head device 226 has a floating workpiece carrier rotor 220 and a carrier housing 224. A flat-surfaced workpiece 240 is attached to the nominally-horizontal floating workpiece carrier rotor 220 that is rotationally driven by a sliding drive pin arm 232 that is attached to a drive shaft 230. The drive pin 233 is attached to a bracket 221 that is attached to the workpiece carrier rotor 220. An annular flexible diaphragm device 237 is attached to a sealed annular wall 236 that is attached to the workpiece carrier rotor 220 and is attached at the opposed end to the drive plate 223 The workpiece 240 is attached to the workpiece carrier rotor 220 by vacuum, low-tack adhesives or adhesive-bonding provided by water films that mutually wet the surfaces of both the workpiece 240 and the workpiece carrier rotor 220.

Rolling contact of the workpiece carrier rotor 220 outer periphery with a set of multiple stationary roller idlers 238 that are precisely located at prescribed positions assures that the workpiece carrier rotor 220 rotation axis is coincident with the hollow drive shaft 230 rotation axis. The stationary roller idlers 238 are mounted at positions on the carrier housing 224 where the diameters of the stationary roller idlers 238 and the diameters of the workpiece carrier rotors 220 are considered in the design and fabrication of the workpiece carrier head 226 to provide that the workpiece carrier rotor 220 rotation axis is precisely coincident with the hollow drive shaft 230 rotation axis.

When vacuum 228 is applied to the vacuum chamber 231, the workpiece carrier rotor 220 is raised and the workpiece 240 is raised a distance 218 from the abrasive 244 coating on the rotary platen 242 and the annular flexible diaphragm device 237 is flexed vertically. Also, the drive pin 233 is deflected upward to compensate for the upward motion of the workpiece carrier rotor 220 as the workpiece carrier rotor 220 and the drive pin arm 232 are rotated by the drive shaft 230.

Vacuum 228 can be applied very quickly to the sealed chamber 231 with the use of a vacuum surge tank (not shown) that generates a large lifting force pressure 222 to quickly raise the workpiece 240 from contact with the abrasive 244 coating on the rotary platen 242. This fast action rising of the workpieces 240 is desirable to quickly interrupt an abrading process even when the workpiece 240 and the workpiece carrier rotor 220 are rotating at high speeds. The vacuum 228 can provide a vacuum negative pressure 222 of from 0.1 to 14.7 psi.

Figure 12:
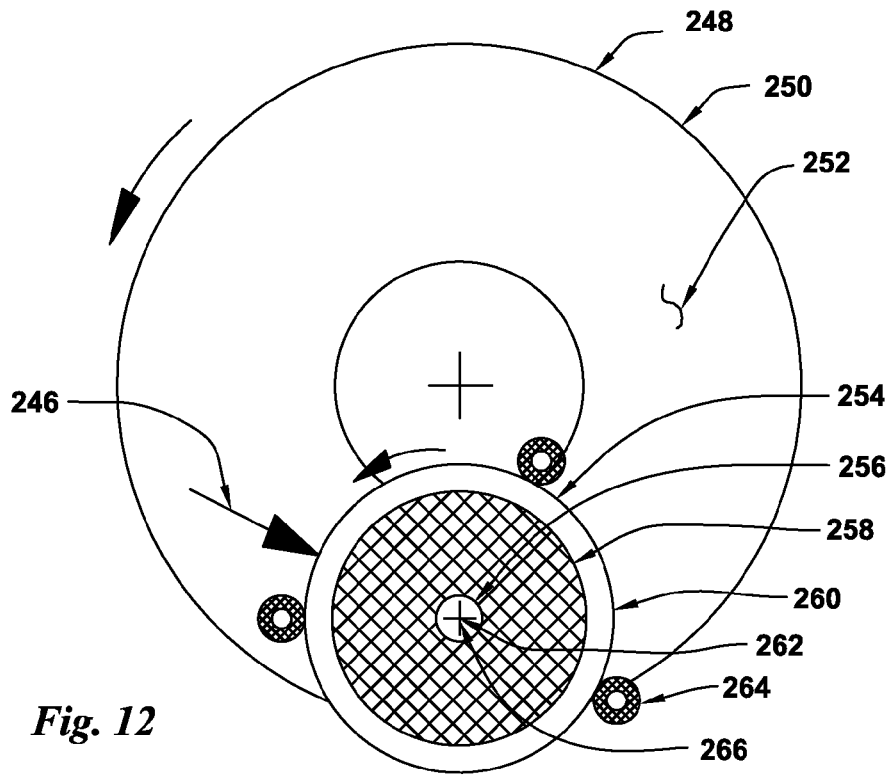
FIG. 12 is a top view of a slide-pin driven floating workpiece carrier used for lapping.

FIG. 12 is a top view of a slide-pin driven floating workpiece carrier used for lapping or polishing semiconductor wafers or other workpiece substrates. A stationary workpiece carrier head (not shown) has a flat-surfaced workpiece 258 that is attached to a floating workpiece carrier rotor 260 that is rotationally driven by a sliding drive pin (not shown) that is driven by a rotary drive shaft 256 that is attached to the stationary workpiece carrier head. The floating workpiece cylindrical-shaped carrier rotor 260 having a carrier rotor outer diameter 254 is in rolling-contact with three stationary-position rotatable roller idlers 264 that create and maintain the center of rotation 266 of the carrier rotor 260 as it rotates and is subjected to abrading forces 246. The center of rotation 266 of the carrier rotor 260 must be coincident with the axis of rotation 262 of the carrier rotor 260 hollow drive shaft (not shown). An abrasive disk 248 that has an annular band of abrasive 252 is attached to a rotating platen 250.

Figure 13:
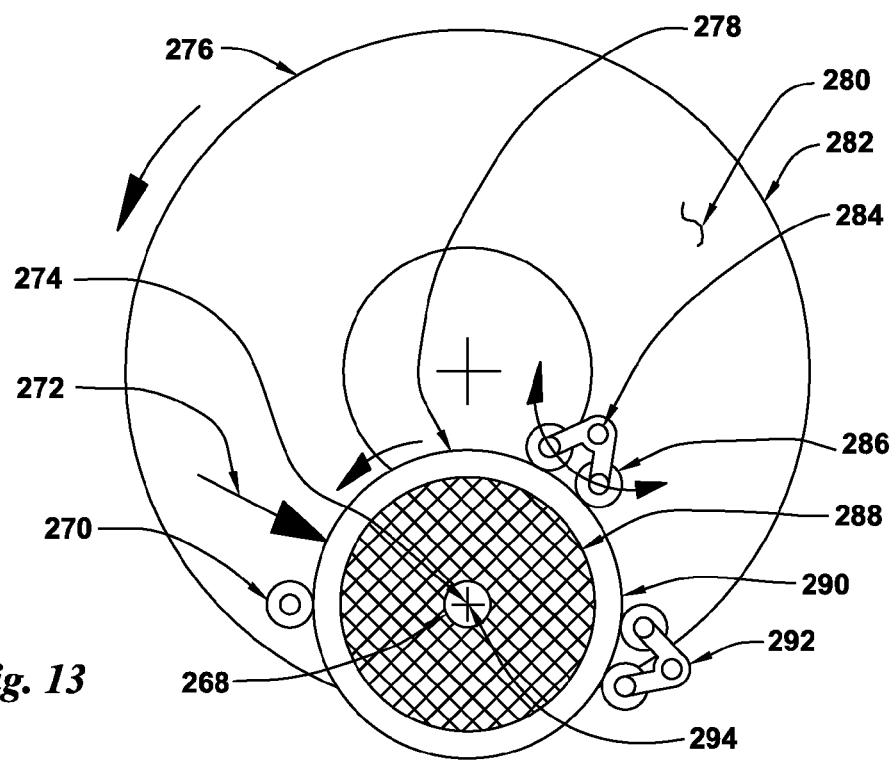
FIG. 13 is a top view of a sliding drive-pin driven floating carrier that is supported by idlers.

FIG. 13 is a top view of a sliding drive-pin driven floating carrier that is supported by idlers. A stationary workpiece carrier head (not shown) has a flat-surfaced workpiece 288 that is attached to a floating workpiece carrier rotor 290 that is rotationally driven by a sliding pin device (not shown) that is driven by a rotary drive shaft 268 that is attached to the stationary workpiece carrier head. The floating workpiece cylindrical-shaped carrier rotor 290 having a carrier rotor outer diameter 278 is in rolling-contact with multiple stationary-position rotatable roller idlers 270, 286 where idlers 286 have a pivot point 284 that provide equal-sharing of the reaction forces applied to the idlers 286 that are necessary to counteract the abrading force 272 on the workpiece 288 and to create and maintain the center of rotation 274 of the carrier rotor 290 as it rotates and is subjected to abrading forces 272.

The center of rotation 274 of the carrier rotor 290 must be coincident with the axis of rotation 294 of the carrier rotor 290 hollow drive shaft (not shown). An abrasive disk 282 that has an annular band of abrasive 280 is attached to a rotating platen 276. A dual set of idlers 286 is mounted on a pivot arm 292 having a pivot arm rotation center 284 that allows both idlers 286 to contact the outer periphery of the carrier rotor 290 where both idlers 286 share the restraining force load on the carrier rotor that is imposed by the abrading force 272 on the workpiece 288 that is transmitted to the carrier rotor 290 because the workpiece 288 is attached to the carrier rotor 290.

Figure 14:
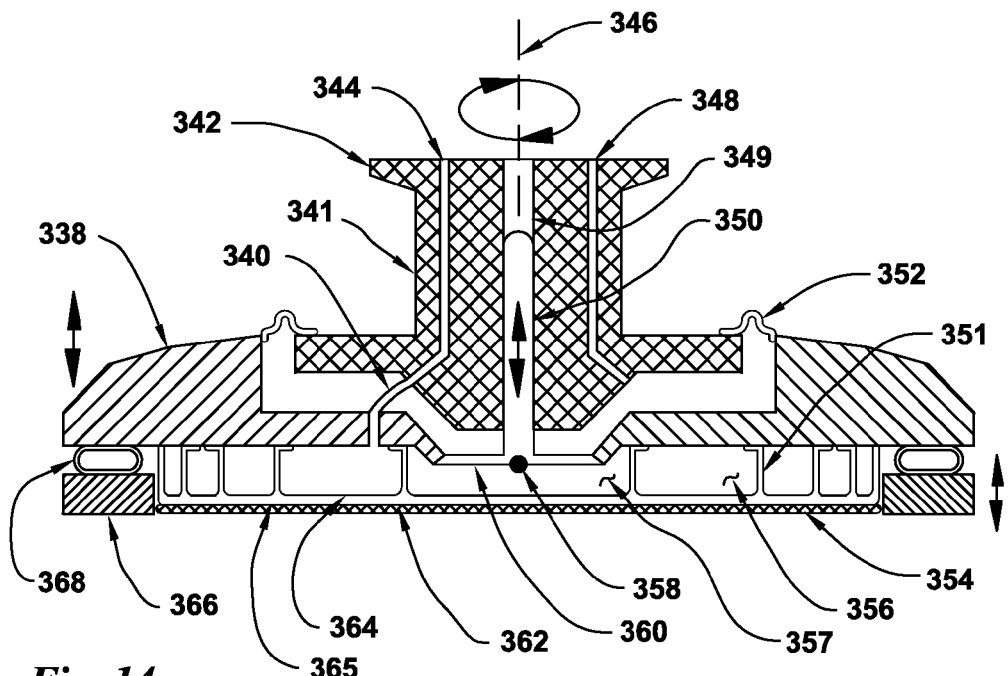
FIG. 14 is a cross section view of a prior art pneumatic bladder type of wafer carrier.

FIG. 14 is a cross section view of a conventional prior art pneumatic bladder type of wafer carrier. A rotatable wafer carrier head 341 having a wafer carrier hub 342 is attached to the rotatable head (not shown) of a polishing machine tool (not shown) where the carrier hub 342 is loosely attached with flexible joint device 352 and a rigid slide-pin 350 to a rigid carrier plate 338. The cylindrical rigid slide-pin 350 can move along a cylindrical hole 349 in the carrier hub 342 which allows the rigid carrier plate 338 to move axially along the hole 349 where the movement of the carrier plate 338 is relative to the carrier hub 342. The rigid slide-pin 350 is attached to a flexible diaphragm 360 that is attached to carrier plate 338 which allows the carrier plate 338 to be spherically rotated about a rotation point 358 relative to the rotatable carrier hub 342 that is remains aligned with its rotational axis 346.

A sealed flexible elastomeric diaphragm device 364 has a number of individual annular sealed pressure chambers 356 having flexible elastomeric chamber walls 351 and a circular center chamber 357 where the air pressure can be independently adjusted for each of the individual chambers 356, 357 to provide different abrading pressures to a wafer workpiece 354 that is attached to the wafer mounting surface 365 of the elastomeric diaphragm 364. A wafer 354 carrier annular back-up ring 366 provides containment of the wafer 354 within the rotating but stationary-positioned wafer carrier head 341 as the wafer 354 abraded surface 362 is subjected to abrasion-friction forces by the moving abrasive coated platen (not shown). An air-pressure annular bladder 368 applies controlled contact pressure of the wafer 354 carrier annular back-up ring 366 with the platen abrasive coating surface. Controlled-pressure air is supplied from air inlet passageways 344 and 396 in the carrier hub 342 to each of the multiple flexible pressure chambers 356, 357 by flexible tubes 340.

When CMP polishing of wafers takes place, a resilient porous CMP pad is saturated with a liquid loose-abrasive slurry mixture and is held in moving contact with the flat-surfaced semiconductor wafers to remove a small amount of excess deposited material from the top surface of the wafers. The wafers are held by a wafer carrier head that rotates as the wafer is held in abrading contact with the CMP pad that is attached to a rotating rigid platen. Both the carrier head and the pad are rotated at the same slow speeds.

The pneumatic-chamber wafer carrier heads typically are constructed with a flexible elastomer membrane that supports a wafer where five individual annular chambers allow the abrading pressure to be varied across the radial surface of the wafer. The rotating carrier head has a rigid hub and a floating wafer carrier plate that has a "spherical" center of rotation where the wafer is held in flat-surfaced abrading contact with a moving resilient CMP pad. A rigid wafer retaining ring that contacts the edge of the wafer is used to resist the abrading forces applied to the wafer by the moving pad.

Figure 15:
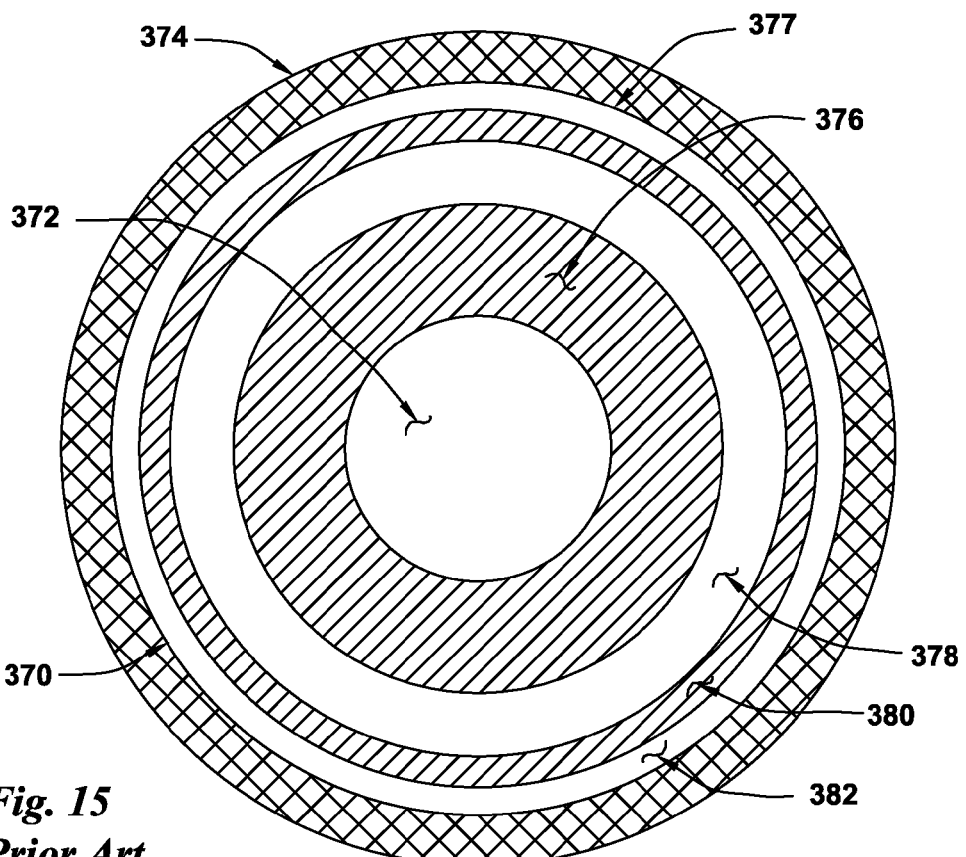
FIG. 15 is a bottom view of a prior art pneumatic bladder type of wafer carrier.

FIG. 15 is a bottom view of a conventional prior art pneumatic bladder type of wafer carrier. A wafer carrier head 374 having an continuous nominally-flat surface elastomeric diaphragm 377 is shown having multiple annular pneumatic pressure chamber areas 376, 378, 380, 382 and one circular center pressure chamber area 372. The wafer carrier head 374 can have more or less than five individual pressure chambers. A wafer carrier head 374 annular back-up ring 370 provides containment of the wafer (not shown) within the wafer carrier head 374 as the wafer (not shown) that is attached to the continuous nominally-flat surface of the elastomeric diaphragm device 377 is subjected to abrasive friction forces. Here, the semiconductor wafer substrate is loosely attached to a flexible continuous-surface of a membrane that is attached to the rigid portion of the substrate carrier. Multiple pneumatic air-pressure chambers that exist between the substrate mounting surface of the membrane and the rigid portion of the substrate carrier are an integral part of the carrier membrane.

Each of the five annular pneumatic chambers shown here can be individually pressurized to provide different abrading pressures to different annular portions of the wafer substrate. These different localized abrading pressures are provided to compensate for the non-uniform abrading action that occurs with this wafer polishing system.

The flexible semiconductor wafer is extremely flat on both opposed surfaces. Attachment of the wafer to the carrier membrane is accomplished by pushing the very flexible membrane against the flat backside surface of a water-wetted wafer to drive out all of the air and excess water that exists between the wafer and the membrane. The absence of an air film in this wafer-surface contact are provides an effective suction-attachment of the wafer to the carrier membrane surface. Sometimes localized "vacuum pockets" are used to enhance the attachment of the wafer to the flexible flat-surfaced membrane.

Each of the five annular pressure chambers expand vertically when pressurized. The bottom surfaces of each of these chambers move independently from their adjacent annular chambers. By having different pressures in each annular ring-chamber, the individual chamber bottom surfaces are not in a common plane if the wafer is not held in flat-surfaced abrading contact with a rigid abrasive surface. If the abrasive surface is rigid, then the bottom surfaces of all of the five annular rings will be in a common plane. However, when the abrasive surface is supported by a resilient pad, each individual pressure chamber will distort the abraded wafer where the full wafer surface is not in a common plane. Resilient support pads are used both for CMP pad polishing and for fixed-abrasive web polishing.

Because of the basic design of the flexible membrane wafer carrier head that has five annular zones, each annular abrading pressure-controlled zone provides an "average" pressure for that annular segment. This constant or average pressure that exist across the radial width of that annular pressure chamber does not accurately compensate for the non-linear wear rate that actually occurs across the radial width of that annular band area of the wafer surface.

Overall, this flexible membrane wafer substrate carrier head is relatively effective for CMP pad polishing of wafers. Use of it with resilient CMP pads require that the whole system be operated at very low speeds, typically at 30 rpm. However, the use of this carrier head also causes many problems results in non-uniform material removal across the full surface of a wafer.

Figure 16:
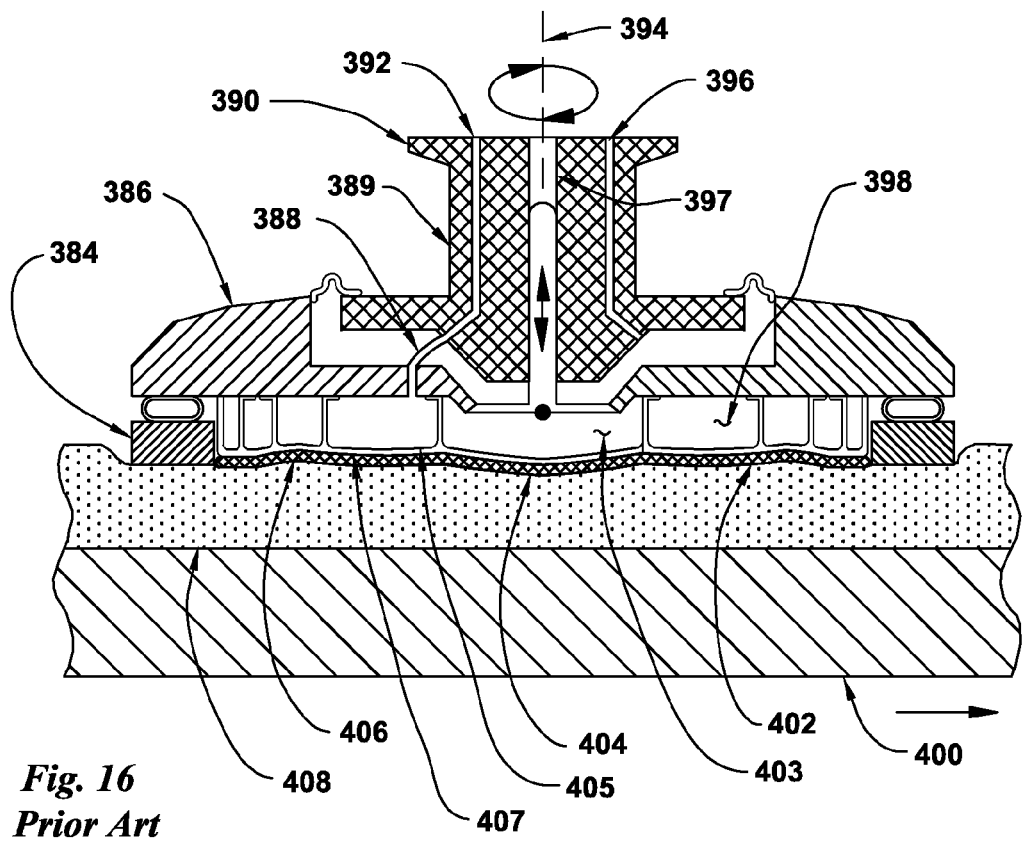
FIG. 16 is a cross section view of a prior art bladder type of wafer carrier distorted bottom

FIG. 16 is a cross section view of a prior art pneumatic bladder type of wafer carrier with a distorted bottom surface. A rotatable wafer carrier head 389 having a wafer carrier hub 390 is attached to the rotatable head (not shown) of a wafer polishing machine tool (not shown) where the carrier hub 390 is loosely attached with flexible joint devices and a rigid slide-pin to a rigid carrier plate 386. The cylindrical rigid slide-pin can move along a cylindrical hole 397 in the carrier hub 390 which allows the rigid carrier plate 386 to move axially along the hole 397 where the movement of the carrier plate 386 is relative to the carrier hub 390. The rigid slide-pin is attached to a flexible diaphragm that is attached to carrier plate 386 which allows the carrier plate 386 to be spherically rotated about a rotation point relative to the rotatable carrier hub 390 that is remains aligned with its rotational axis 394.

A sealed flexible elastomeric diaphragm device 405 having a nominally-flat but flexible wafer 402 mounting surface 407 has a number of individual annular sealed pressure chambers 398 and a circular center chamber 403 where the air pressure can be independently adjusted for each of the individual chambers 398, 403 to provide different abrading pressures to a wafer workpiece 402 that is attached to the wafer mounting surface 407 of the elastomeric diaphragm 405. A wafer 402 carrier annular back-up ring 384 provides containment of the wafer 402 within the rotating but stationary-positioned wafer carrier head 389 as the wafer 402 abraded surface 406 is subjected to abrasion-friction forces by the moving abrasive coated platen (not shown). An air-pressure annular bladder applies controlled contact pressure of the wafer 402 carrier annular back-up ring 384 with the platen abrasive coating surface. Controlled-pressure air is supplied from air inlet passageways 392 and 396 in the carrier hub 390 to each of the multiple flexible pressure chambers 398, 403 by flexible tubes 388.

When air, or other fluids such as water, pressures are applied to the individual sealed pressure chambers 398, 403, the flexible bottom wafer mounting surface 407 of the elastomeric diaphragm 405 is deflected different amounts in the individual annular or circular bottom areas of the sealed pressure chambers 398, 403 where the nominally-flat but flexible wafer 402 is distorted into a non-flat condition as shown by 404 as the wafer 402 is pushed downward into the flexible and resilient CMP pad 408 which is supported by a rigid rotatable platen 400.

When the multi-zone wafer carrier is used to polish wafer surfaces with a resilient CMP abrasive slurry saturated polishing pad, the individual annular rings push different annular portions of the wafer into the resilient pad. Each of the wafer carrier air-pressure chambers exerts a different pressure on the wafer to provide uniform material removal across the full surface of the wafer. Typically the circular center of the wafer carrier flexible diaphragm has the highest pressure. This high-pressure center-area distorts the whole thickness of the wafer as it is forced deeper into the resilient CMP wafer pad. Adjacent annular pressure zones independently distort other portions of the wafer.

Here, the wafer body is substantially distorted out-of-plane by the independent annual pressure chambers. However, the elastomer membrane that is used to attach the wafer to the rotating wafer carrier is flexible enough to allow the individual pressure chambers to flex the wafer while still maintaining the attachment of the wafer to the membrane. As the wafer body is distorted, the distorted and moving resilient CMP pad is thick enough to allow this out-of-plane distortion to take place while providing polishing action on the wafer surface.

When a wafer carrier pressure chamber is expanded downward, the chamber flexible wall pushes a portion of the wafer down into the depths of the resilient CMP pad. The resilient CMP pad is compressible and acts as an equivalent series of compression springs. The more that a spring is compressed, the higher the resultant force is. The compression of a spring is defined as $F=KX$ where F is the spring force, K is the spring constant and X is the distance that the end of the spring is deflected.

The CMP resilient pads have a stiffness that resists wafers being forced into the depths of the pads. Each pad has a spring constant that is typically linear. In order to develop a higher abrading pressure at a localized region of the flat surface of a wafer, it is necessary to move that portion of the wafer down into the depth of the compressible CMP pad. The more that the wafer is moved downward to compresses the pad, the higher the resultant abrading force in that localized area of the wafer. If the spring-like pad is not compressed, the required wafer abrading forces are not developed.

Due to non-uniform localized abrading speeds on the wafer surface, and other causes such as distorted resilient pads, it is necessary to compress the CMP pad different amounts at different radial areas of the wafer. However, the multi-zone pressure chamber wafer carrier head has abrupt chamber-bottom membrane deflection discontinuities at the annular joints that exist between adjacent chambers having different chamber pressures. Undesirable wafer abrading pressure discontinuities exist at these membrane deflection discontinuity annular ring-like areas.

Often, wafers that are polished using the pneumatic wafer carrier heads are bowed. These bowed wafers can be attached to the flexible elastomeric membranes of the carrier heads. However, in a free-state, these bowed wafers will be first attached to the center-portion of the carrier head. Here, the outer periphery of the bowed wafer contacts the CMP pad surface before the wafer center does. Pressing the wafer into forced contact with the CMP pad allows more of the wafer surface to be in abrading contact with the pad. Using higher fluid pressures in the circular center of the carrier head chamber forces this center portion of the bowed wafer into the pad to allow uniform abrading and material removal across this center portion of the surface of the wafer. There is no defined planar reference surface for abrading the surface of the wafer.

Figure 17:
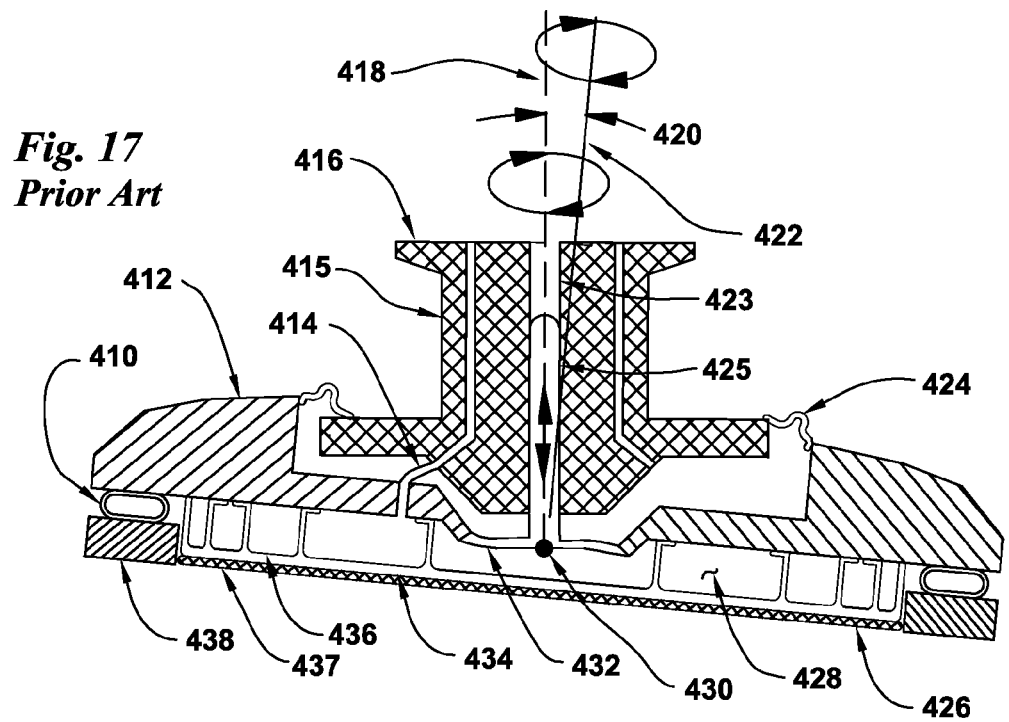
FIG. 17 is a cross section view of a prior art bladder type of wafer carrier tilted wafer carrier.

FIG. 17 is a cross section view of a prior art pneumatic bladder type of wafer carrier head with a tilted wafer carrier. The pneumatic-chamber carrier head is made up of two internal parts to allow "spherical-action" motion of the floating annular plate type of substrate carrier that is supported by a rotating carrier hub. The floating substrate carrier plate is attached to the rotating drive hub by a flexible elastomeric or a flexible metal diaphragm at the top portion of the hub. This upper elastomeric diaphragm allows approximate-spherical motion of the substrate carrier to provide flat-surfaced contact of the wafer substrate with the "flat" but indented resilient CMP pad. The CM pad is saturated with a liquid abrasive slurry mixture.

To keep the substrate nominally centered with the rotating carrier drive hub, a stiff (or flexible) post is attached to a flexible annular portion of the rigid substrate carrier structure. This circular centering-post fits in a cylindrical sliding-bearing receptacle-tube that is attached to the rotatable hub along the hub rotation axis. When misalignment of the polishing tool (machine) components occurs or large lateral friction abrading forces tilt the carrier head, the flexible centering post tends to slide vertically along the length of the carrier head rotation axis. This post-sliding action and out-of-plane distortion of the annular diaphragm that is attached to the base of the centering posts together provide the required "spherical-action" motion of the rigid carrier plate. In this way, the surface of the wafer substrate is held in flat-surfaced contact with the nominal-flatness of the CMP pad as the carrier head rotates.

Here, the "spherical action" motion of the substrate carrier depends upon the localized distortion of the structural member of the carrier head. This includes diaphragm-bending of the flexible annular base portion of the rigid substrate carrier which the center-post shaft is attached to. All of these carrier head components are continuously flexed upon each rotation of the carrier head which often requires that the wafer substrate carrier head is typically operated at very slow operating speeds of only 30 rpm.

A rotatable wafer carrier head 415 having a wafer carrier hub 416 is attached to the rotatable head (not shown) of a polishing machine tool (not shown) where the carrier hub 416 is loosely attached with flexible joint device 424 and a rigid slide-pin 425 to a rigid carrier plate 412. The cylindrical rigid slide-pin 425 can move along a cylindrical hole 423 in the carrier hub 416 which allows the rigid carrier plate 412 to move axially along the hole 423 where the movement of the carrier plate 412 is relative to the carrier hub 416. The rigid slide-pin 425 is attached to a flexible diaphragm 432 that is attached to the carrier plate 412 which allows the carrier plate 412 to be spherically rotated about a rotation point 430 relative to the rotatable carrier hub 416 that is remains aligned with its rotational axis 346.

The carrier plate 412 is shown spherically rotated about a rotation point 430 relative to the rotatable carrier hub 416 where the slide-pin axis 418 is at a tilt-angle 420 with an axis 422 that is perpendicular with the wafer 426 abraded surface 434 and where the carrier plate 412 and the wafer 426 are shown here to rotate about the axis 422. The flexible diaphragm 432 that is attached to the carrier plate 412 is distorted when the carrier plate 412 is spherically rotated about a rotation point 430 relative to the rotatable carrier hub 416.

A sealed flexible elastomeric diaphragm device 436 has a number of individual annular sealed pressure chambers 428 and a circular center chamber where the air pressure can be independently adjusted for each of the individual chambers 428 to provide different abrading pressures to a wafer workpiece 426 that is attached to the wafer mounting surface 437 of the elastomeric diaphragm 436. A wafer 426 carrier annular back-up ring 438 provides containment of the wafer 426 within the rotating but stationary-positioned wafer carrier head 415 as the wafer 426 abraded surface 434 is subjected to abrasion-friction forces by the moving abrasive coated platen (not shown). An air-pressure annular bladder 410 applies controlled contact pressure of the wafer 426 carrier annular back-up ring 438 with the platen abrasive coating surface. Controlled-pressure air is supplied from air inlet passageways in the carrier hub 416 to each of the multiple flexible pressure chambers 428 by flexible tubes 414.

The pneumatic abrading pressures that are applied during CMP polishing procedures range from 1 to 8 psi. The downward pressures that are applied by the wafer retaining ring to push-down the resilient CMP pad prior to it contacting the leading edge of the wafer are often much higher than the nominal abrading forces applied to the wafer. For a 300 mm (12 inch) diameter semiconductor wafer substrate, that has a surface area of 113 sq. inches, an abrading force of 4 psi is often applied for polishing with a resilient CMP pad. The resultant downward abrading force on the wafer substrate is 4×113=452 lbs. An abrading force of 2 psi results in a downward force of 226 lbs.

The coefficient of friction between a resilient pad and a wafer substrate can vary between 0.5 and 2.0. Here, the wafer is plunged into the depths of the resilient CMP pad. A lateral force is applied to the wafer substrate along the wafer flat surface that is a multiple of the coefficient of friction and the applied downward abrading force. If the downward force is 452 lbs and the coefficient of friction is 0.5, then the lateral force is 226 lbs. If the downward force is 452 lbs and the coefficient of friction is 2.0, then the lateral force is 904 lbs. If a 2 psi downward force is 226 lbs and the coefficient of friction is 2.0, then the lateral force is 452 lbs.

When this lateral force of 226 to 904 lbs is applied to the wafer, it tends to drive the wafer against the rigid outer wafer retaining ring of the wafer carrier head. Great care is taken not to damage or chip the fragile, very thin and expensive semiconductor wafer due to this wafer-edge contact. This wafer edge-contact position changes continually along the periphery of the wafer during every revolution of the carrier head. Also, the overall structure of the carrier head is subjected to this same lateral force that can range from 226 to 904 lbs.

All the head internal components tend to tilt and distort when the head is subjected to the very large friction forces caused by forced-contact with the moving abrasive surface. The plastic components that the pneumatic head is constructed from have a stiffness that is a very small fraction of the stiffness of same-sized metal components. This is especially the case for the very flexible elastomeric diaphragm materials that are used to attach the wafers to the carrier head. These plastic and elastomeric components tend to bend and distort substantial amounts when they are subjected to these large lateral abrading friction forces.

The equivalent-vacuum attachment of a water-wetted wafer, plus the coefficient-of-friction surface characteristics of the elastomer membrane, are sufficient to successfully maintain the attachment of the wafer to the membrane even when the wafer is subjected to the large lateral friction-caused abrading forces. However, to maintain the attachment of the wafer to the membrane, it is necessary that the flexible elastomer membrane is distorted laterally by the friction forces to where the outer periphery edge of the wafer is shifted laterally to contact the wall of the rigid wafer substrate retainer ring. Because the thin wafer is constructed form a very rigid silicon material, it is very stiff in a direction along the flat surface of the wafer.

The rigid wafer outer periphery edge is continually pushed against the substrate retainer ring to resist the very large lateral abrading forces. This allows the wafer to remain attached to the flexible elastomer diaphragm flat surface because the very weak diaphragm flat surface is also pushed laterally by the abrading friction forces. Most of the lateral abrading friction forces are resisted by the body of the wafer and a small amount is resisted by the elastomer bladder-type diaphragm. Contact of the wafer edge with the retainer ring continually moves along the wafer periphery upon each revolution of the wafer carrier head.

Figure 18:
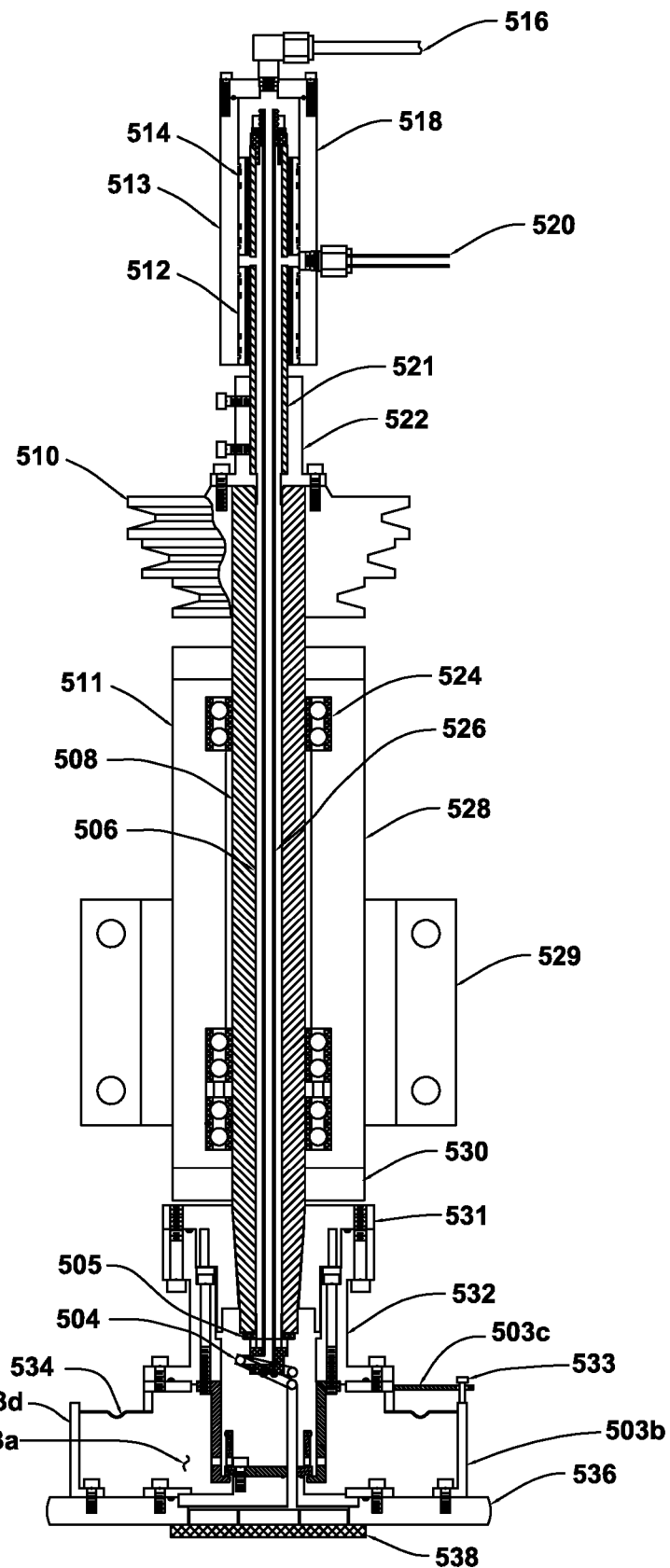
FIG. 18 is a cross section view of a sliding pin driven flexible diaphragm workholder.

FIG. 18 is a cross section view of a sliding pin flexible annular diaphragm floating workpiece carrier that is supported by a driven spindle. The workpiece rotor 536 has an outer diameter having a spherical-shaped surface that is supported laterally (horizontally) by idlers (not shown). The workpiece rotor 536 has a vacuum-attached workpiece 538 and the rotor 536 is attached to a rotary workpiece carrier housing 532 by a sliding pin drive arm 503*c* that is in sliding contact with a sliding pin 533 that is attached to a sliding pin bracket 503*b* that is attached to the workpiece rotor 536 where the sliding pin 533 moves in a vertical direction along the axis of the rotary spindle 511 rotary spindle shaft 508. The sliding pin drive device 503*c* is stiff in a tangential direction relative to the axis of the rotary spindle 511 rotary spindle shaft 508 where the sliding pin drive device 503*c* provides rotation of the workpiece rotor 536.

The cylindrical cartridge-type spindle 511 that is supported by a clamp-type device 529 has a V-belt pulley 510 attached to the spindle shaft 508 where the spindle shaft 508 rotates the rotary carrier housing 532 and a flexible annular diaphragm 534 is attached to the spindle drive shaft 508 and to an annular wall 503*d* that is attached to the workpiece rotor 536 The flexible annular diaphragm 534 flexes in a vertical direction along the axis of the rotary spindle 511 rotary spindle shaft 508. The spindle 511 v-belt pulley 510 is driven by a drive motor (not shown) and rotary drive torque is transmitted to the floating workpiece carrier rotor 536 by the sliding pin drive device 503*c*.

Vacuum is supplied to the spindle 511 at the stationary hollow tube 516 that is supported by the air bearing housing 518 where the vacuum applied at the vacuum tube 516 is routed through a hollow tube 526 to a pneumatic adapter device 505 which supplies vacuum through a flexible tube 504 to the floating workpiece carrier rotor 536 to attach the workpiece 538 to the carrier rotor 536. Air bearings 512, 514 are supported by an air bearing housing 513 which surround a precision-diameter hollow shaft 521 that is supported by a shaft mounting device 522 that is attached to the drive pulley 510. A gap space is present between the two axially mounted air bearings 512 and 514 to allow pressurized air supplied by the tubing 520 to enter radial port holes in the hollow air bearing shaft 521 to transmit the controlled-pressure air through the annular passage between the vacuum tube 526 and the spindle shaft 508 internal through-hole 506. The hollow shaft 521, the air bearings 512 and 514 and the air bearing housing 513 act together as a friction-free non-contacting high speed multi-port rotary union 518.

The pressurized air supplied by the tubing 520 is routed through the annular passageway to the pneumatic adapter device 505 where this pressurized air enters the sealed annular diaphragm chamber 503*a* to provide abrading pressure which forces the workpiece 538 against an abrasive surface (not shown) on a rotary platen (not shown). When air pressure is applied to the annular diaphragm chamber 503*a*, the flexible annular diaphragm 534 is flexed downward to move the workpiece 538 downward in a vertical direction along the rotation axis of the rotary spindle 511 rotary spindle shaft 508 that is supported be bearings 524 attached to the spindle housing 528. Vacuum can also be applied at the tubing 520 to develop a negative pressure in the sealed annular diaphragm chamber 503*a* to which distorts the annular diaphragm 534 in a vertical direction and raises the workpiece 538 away from abrading contact with the platen abrasive surface.

The spindle 511 is shown as a cartridge-type spindle which is a standard commercially available unit that can be provided by a number of vendors including GMN USA of Farmington, Conn. A rectangular block-type spindle 511 having the same spindle moving components can also be provided by a number of vendors including Gilman USA of Grafton, Wis. The spindles 511 can be belt driven units or they can have integral drive motors. Spindles 511 can have flat-surfaced moving spindle end plate 530 or the spindle 511 can have drive shafts 508 with internal or external tapered shaft ends that can be used to attach the floating annular diaphragm be workpiece carrier head 531.

An important fail-safe feature of this floating annular diaphragm workpiece carrier head 531 is that it can be operated at high rotational speeds exceeding 3,000 rpm without danger even in the event of failure of supporting components such as the annular diaphragm 534 or the loss of the workpiece rotor 536 outer diameter lateral (horizontal) lateral support by the supporting idlers. In the event of failure of these devices, all of the moving internal components of the carrier head 531 are contained within the structurally robust rotary carrier housing 532. Another safety feature is that the sliding pin 533 that is in sliding contact with the sliding pin drive arm 503*c* prevents free rotation of the workpiece carrier head 531 relative to the workpiece carrier head 531 where vacuum presence is assured to maintain the attachment of the workpiece 538 to the workpiece carrier head 531.

Because the internal structural components of the workpiece carrier head 531 are constructed with intentional small gap spaces between adjacent components, these components would shift radially these small gap distances before they become restrained from further radial motion as the workpiece carrier head 531 is rotated at low or high speeds. This slight off-set radial shifting of the components such as the workpiece carrier rotor 536 and the workpiece 538 will cause an unbalance of the rotating workpiece carrier head 531. This unbalance will result in a vibration of the rotating workpiece carrier head 531 which imposes dynamic forces on the spindle 511. However, the spindle 511 has a very robust structural design, as shown by the use of multiple spindle shaft 508 rotary bearings 524, and the spindle 511 is easily suitable to sustain these rotating workpiece carrier head 531 vibrations that will diminish rapidly as the spindle speed is diminished by emergency-stop dynamic braking of the spindle 511 drive motor.

The small gaps between the internal components of the workpiece carrier head 531 are jus large enough to allow the free-floatation of the annular diaphragm 534 workpiece carrier rotor 536 and the workpiece 538 but are small enough that large vibrations will not be caused in the remote-occurrence event of failure of the components of the floating workpiece carrier head 531.

Figure 19:
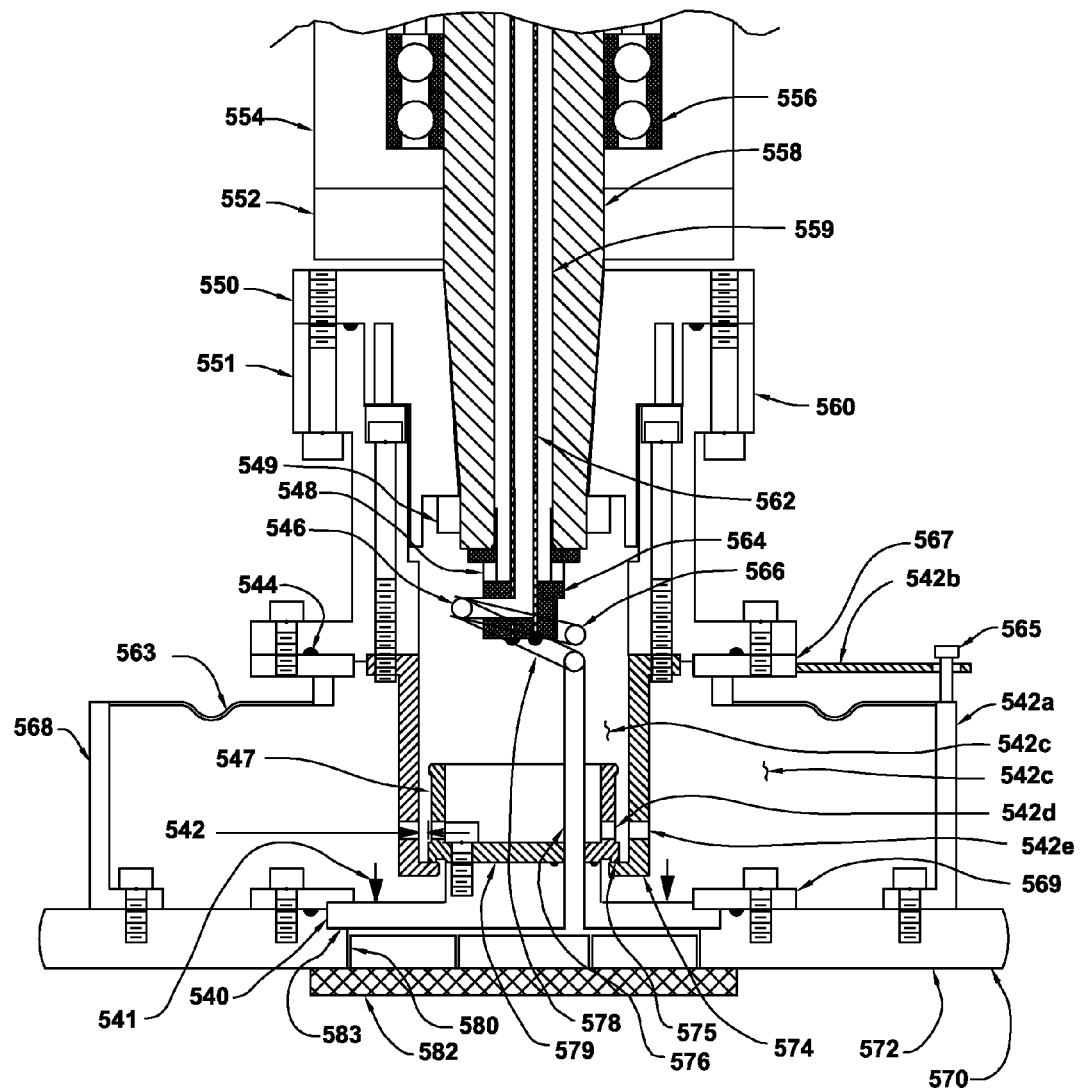
FIG. 19 is a cross section view of a slide pin floating workpiece carrier restrained vertically.

FIG. 19 is a cross section view of a slide pin floating workpiece carrier that is restrained vertically. The workpiece rotor 570 has an outer diameter having a spherical-shaped surface that is supported laterally (horizontally) by idlers (not shown). The workpiece rotor 570 having a precision-flat workpiece mounting surface 572 has a vacuum-attached workpiece 582 and the rotor 570 is attached to an annual bracket 568 that is attached to a rotary workpiece carrier housing 560 by a flexible annular diaphragm 563 that flexes in a vertical direction along the axis of the rotary spindle 554 rotary spindle shaft 558. The precision-flat workpiece mounting surface 572 is typically flat to within 0.0001 inches (0.254 microns) but the flatness of the surface 572 can range from 0.005 inches to 0.00001 inches (127 to 0.254 microns) across the full area of the surface 572.

The flexible annular diaphragm 563 that flexes in a vertical direction along the axis of the rotary spindle shaft 558 and flexes horizontally in a direction perpendicular to the axis of the rotary spindle shaft 558 is attached to an annual bracket 568 that is attached to the workpiece rotor 570 and the flexible annular diaphragm 630 is also attached to the rotary workpiece carrier housing 560.

The workpiece rotor 536 has a vacuum-attached workpiece 538 and the rotor 536 is attached to a rotary workpiece carrier housing 532 by a sliding pin drive arm 503c that is in sliding contact with a sliding pin 533 that is attached to a sliding pin bracket 503b that is attached to the workpiece rotor 536 where the sliding pin 533 moves in a vertical direction along the axis of the rotary spindle 511 rotary spindle shaft 508. The workpiece carrier rotor 570 has a vacuum-attached workpiece 582 and the rotor 570 is attached to a rotary workpiece carrier housing 560 by a sliding pin drive arm 542b that is in sliding contact with a sliding pin 565 that is attached to a sliding pin bracket 542a that is attached to the workpiece carrier rotor 570 where the sliding pin 565 moves in a vertical direction along the rotary axis of the rotary spindle 554 rotary spindle shaft 558.

Controlled-pressurized air is routed through the annular passageway between the metal or polymer vacuum tube 562 and the spindle shaft 558 internal through-hole 559 to the pneumatic adapter device 564 where this pressurized air enters the sealed flexible annular diaphragm chamber 542c to provide abrading pressure which acts uniformly across the abraded surface of the workpiece as it forces the workpiece 582 against an abrasive surface (not shown) on a rotary platen (not shown). The flexible annular diaphragm chamber 542c has an inner portion and an outer portion that are common to each other where large air passageways 542d and 542e provide free non-restricted air passage connection between the inner and outer portions where the air pressure is equal in both the inner and outer portions.

When air pressure is applied to the flexible annular diaphragm chamber 542c, the flexible annular diaphragm device 563 is flexed downward to move the workpiece 582 downward in a vertical direction along the rotation axis of the rotary spindle 554 rotary spindle shaft 558 that is supported by the bearings 556 attached to the spindle 554.

Vacuum can also be applied within the annular passageway between the metal or polymer vacuum tube 562 and the spindle shaft 558 internal through-hole 559 to develop a negative pressure in the sealed flexible annular diaphragm chamber 542c to flex the annular diaphragm device 563 in a vertical direction to raise the workpiece 582 away from abrading contact with the platen abrasive surface. The spindle 554 has a moving spindle end plate 552.

The cylindrical spindle 554 spindle shaft 558 shown here has an attached housing 550 which is attached to the end of the spindle shaft 558 with a threaded nut 549. Other rotary spindles 554 can have different spindle 554 shapes and configurations such as a block-type spindle (not shown) and different configuration spindle shaft 558 attached housings 550 such as flange-type housings 550 that are an integral part of the spindle shaft 558. The flexible annular diaphragm device 563 has an upper attached annular flange 567 and an lower attached flange 569 where the upper attached annular flange 567 is attached to the rotary workpiece carrier housing 560 and the lower attached flange 569 is attached to the workpiece rotor 570.

The workpiece 582 is attached with vacuum or by water-wetted adhesion or by low-tack adhesives to the workpiece rotor 570 flat mounting surface 572. Vacuum is supplied through vacuum passageways 580 that are present in the workpiece rotor 570 which is attached to a rotor top-plate 540 that can be attached with adhesive 583 or with fasteners (not shown) to the rotor 570 to provide maximum structural stiffness to the workpiece rotor 570. The rotor top-plate 540 has a vacuum pipe fitting 576 which supports a flexile coil-segment polymer, nylon, or polyurethane tube 578 which is also attached to the pneumatic adapter device 564 vacuum pipe fitting 546 which is connected to the spindle shaft 558 vacuum tube 562. The travelling end of the flexile polymer tube 578 is shown in a "down" position and is also shown in an "up" position 566 where the tube 578 flexes along the axis of the spindle shaft 558 as the flexible annular diaphragm device 563 is flexed along the axis of the spindle shaft 558.

The flexile polymer tube 578 also flexes in a radial direction perpendicular to the axis of the spindle shaft 558 as the workpiece flexible carrier head 551 typically is rotated at high speeds. All of the structural stresses in the flexible polymer tube 578 caused by the limited-motion axial and radial flexing of the flexile polymer tube 578 are very low which provides long fatigue lives to the tubing during the abrading operation of the workpiece carrier head 551. The coiled segments of the flexile polymer tube 578 can be provided by cutting out segments from standard coiled-polymer tubing that is in common use or the coiled segments of the flexile polymer tube 578 can be provided by the FreelinWade company of McMinnville, Oreg.

Use of the coiled polymer tubing 578 eliminates the use of nominally straight segments of flexible hollow tubing and the associated use of the required sealed tube-end holder apparatus (not shown) where the tubing has to slide in the sealed tube-end holder apparatus each time that the flexible annular diaphragm device 563 is flexed along the axis of the spindle shaft 558. Maintenance of the sliding vacuum seal by use of the non-sliding coiled vacuum tubing seal device is eliminated.

Pressurized air enters the sealed flexible annular diaphragm chamber 542c through the pneumatic adapter device 564 that has open passageways 548 to provide abrading pressure forces 541 that act against the workpiece rotor 570 to force it in a downward direction against a stop device 574. A displacement control device 579 has an annular wall 547 that acts in conjunction with the annular excursion control device 574 and the rotary workpiece carrier housing 560 to limit the lateral or horizontal excursion distance 542 of the workpiece rotor 570 relative to the rotary workpiece carrier housing 560 during the rotational abrading operation of the workpiece carrier head 551. The displacement control device 579 annular wall 547 limits the tilting of the workpiece rotor 570 relative to the rotary workpiece carrier housing 560 during the rotational abrading operation of the workpiece carrier head 551 when a workpiece 582 having non-parallel surfaces is abraded. When the workpiece rotor 570 moves more than the lateral or horizontal excursion distance 542 of the workpiece rotor 570 relative to the rotary workpiece carrier housing 560, the annular excursion control device 574 is contacted and the motion of the workpiece rotor 570 is fully restrained. The resultant rotary unbalance of the workpiece carrier head 551 caused by this off-set radial motion of the workpiece rotor 570 and the attached workpiece 582 is minimized by this small offset excursion distance 542. The small offset horizontal excursion distance 542 that is measured perpendicular to the axis of the spindle shaft 558 ranges from 0.005 inches to 0.750 inches (0.127 to 1.905 cm) where the preferred distance 542 ranges from 0.010 to 0.050 inches (0.025 to 0.127 cm).

When the pressurized air enters the sealed flexible annular diaphragm chamber 542c to provide abrading pressure forces 541 that act against the workpiece rotor 570 and the attached workpiece 582, this pressure force 541 is distributed uniformly over the whole bottom area located on the upward face of the workpiece carrier rotor 570 that is contained within the flexible annular diaphragm chamber 542c. The pressure force 541 urges the workpiece carrier rotor 570 in a downward direction against a vertical stop device 574. This vertical stop device 574 also acts as an annular excursion control device 574. The workpiece carrier rotor 570 is shown stopped in a downward vertical direction where the displacement control device 579 contacts the vertical stop device 574 at a contact point or contact line 575 which limits the excursion of the workpiece carrier rotor 570 in a vertical direction.

Figure 20:
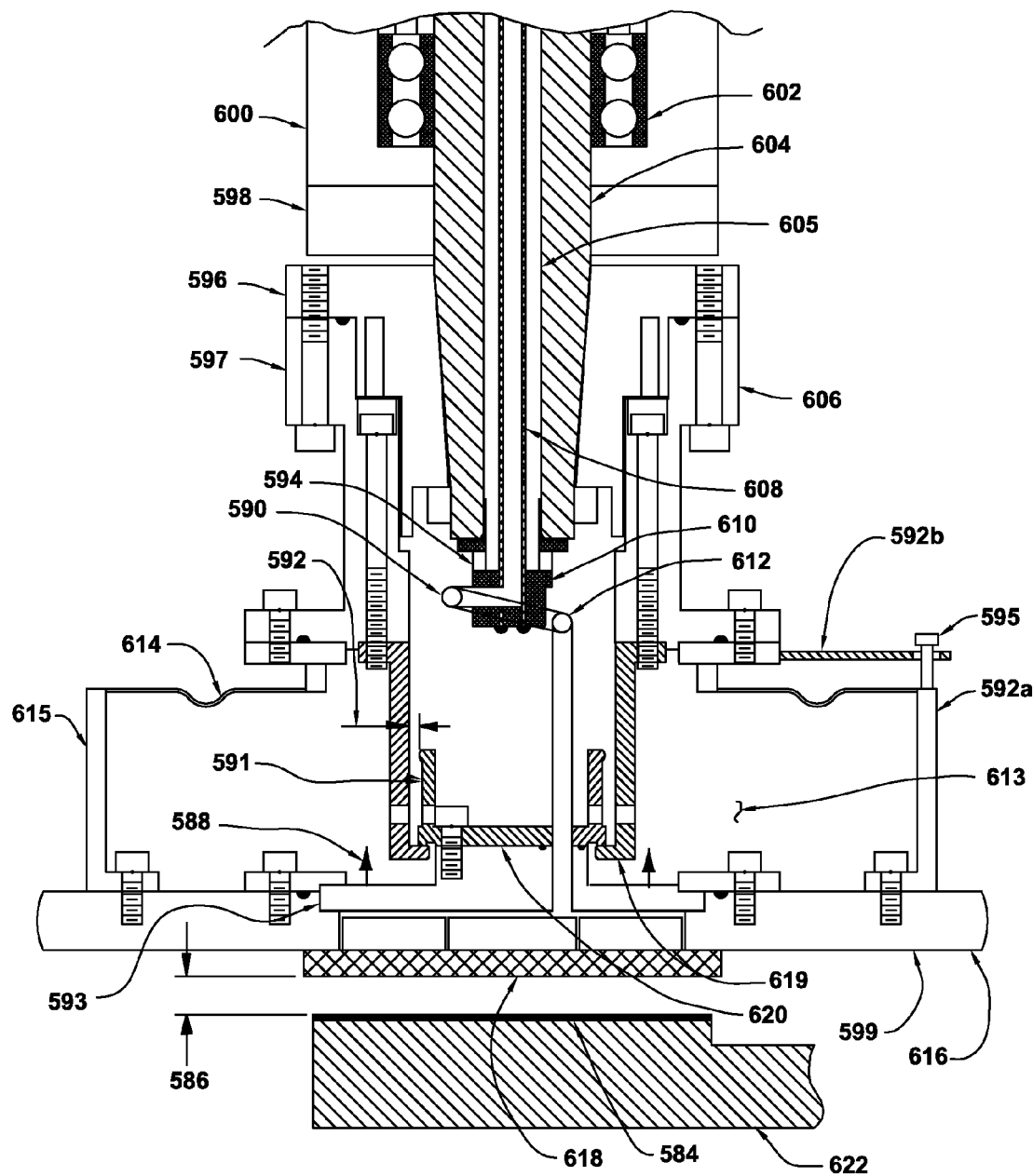
FIG. 20 is a cross section view of a slide-pin workpiece carrier raised from abrasive surface.

FIG. 20 is a cross section view of a slide-pin floating workpiece carrier that is raised away from an abrasive surface. The cylindrical spindle 600 spindle shaft 604 is supported by bearings 602 where the spindle 600 has a rotatable end plate 598 and a spindle flange hub 596 is attached to the spindle 600. A rigid vacuum tube 608 is attached to a pneumatic adapter device 610 to provide vacuum to a flexible polymer tube 612 that is attached to a tube fitting 590 that is attached to the pneumatic adapter device 610. The flexible vacuum tube 612 is also attached to the workpiece rotor 616 to attach the workpiece 618 to the workpiece rotor 616. The pneumatic adapter device 610 has a port hole opening 594 to provide pressure or vacuum to the sealed flexible annular diaphragm chamber 613. A flexible annular diaphragm 614 that flexes in a vertical direction along the axis of the rotary spindle shaft 604 and flexes horizontally in a direction perpendicular to the axis of the rotary spindle shaft 604 is attached to an annual bracket 615 that is attached to the workpiece rotor 616 and the flexible annular diaphragm 614 is also attached to the rotary workpiece carrier housing 606.

Controlled-pressurized air, or vacuum, is routed through the annular passageway between the rigid metal or polymer vacuum tube 608 and the spindle shaft 604 internal through-hole 605 to the pneumatic adapter device 610 where this pressurized air enters the sealed flexible annular diaphragm chamber 613 to provide abrading pressure which forces the workpiece 618 against an abrasive surface 584 on a rotary platen 622. When air pressure is applied to the flexible annular diaphragm chamber 613, the flexible annular diaphragm device 614 is flexed downward to move the workpiece 618 downward in a vertical direction along the rotation axis of the rotary spindle 600 rotary spindle shaft 604 until and as the workpiece 618 contacts the abrasive 584.

Vacuum can also be applied within the annular passageway between the metal or polymer vacuum tube 608 and the spindle shaft 604 internal through-hole 605 to develop a negative pressure in the sealed flexible annular diaphragm chamber 613 to flex the annular diaphragm device 614 in a vertical direction to raise the workpiece 618 away from abrading contact with the platen 622 abrasive surface 584. The workpiece 618 is drawn up a distance 586 from the abrasive 584 surface. The separation distance 586 can range from 0.010 inches to 0.500 inches (0.025 to 1.27 cm) or more. The workpiece 618 can be drawn up rapidly because vacuum can be applied rapidly in the flexible annular diaphragm chamber 613 with the use of a vacuum surge tank (not shown) that supplies vacuum with the use of an electrically-activated solenoid valve (not shown).

Because the vacuum provides a negative pressure that can exceed 10 lbs per square inch and the workpiece rotor 616 has a surface area that typically exceeds 10 square inches, the vacuum force 588 that raises the workpiece rotor 616 and workpiece 618 can easily exceed 100 lbs for even a small-sized workpiece rotor 616 that has a diameter of only 4 inches (10.1 cm). At any time that it is desired to quickly raise the workpiece 618 away from abrading contact with the abrasive 584, the vacuum can be quickly applied to the flexible annular diaphragm chamber 613 by a control system that activates solenoid valves that regulate the pressure and vacuum in the flexible annular diaphragm 614 chamber 613.

The workpiece rotor 616 has a vacuum-attached workpiece 618 and the rotor 616 is attached to a rotary workpiece carrier housing 606 by a sliding pin drive arm 592b that is in sliding contact with a sliding pin 595 that is attached to a sliding pin bracket 592a that is attached to the workpiece rotor 616 where the sliding pin 595 moves in a vertical direction along the axis of the rotary spindle 600 rotary spindle shaft 604.

A tilting control device 620 annular wall 591 shown here acts in conjunction with the rotary workpiece carrier housing 606 to limit the tilting of the workpiece rotor 616 relative to the rotary workpiece carrier housing 606 during the rotational abrading operation of the floating workpiece carrier head 597 to a specified amount when a workpiece 618 having non-parallel surfaces is abraded. When the workpiece rotor 616 tilts and reduces the distance 592 more than the original lateral or horizontal excursion distance 592 of the workpiece rotor 616 relative to the rotary workpiece carrier housing 606, the annular tilting control device 620 wall 591 contacts the rotary workpiece carrier housing 606. Here, further tilting of the workpiece rotor 616 is fully prevented and the specified and allowable tilt angle of the workpiece rotor 616 is not exceeded. The gap distance 582 of the tilting control device 620 annular wall 591 can be used to limit the sideways lateral or horizontal excursion motion of the workpiece rotor 616 in addition to limiting the tilting of the nominally-horizontal workpiece rotor 616 through a tilt angle that is measured from the precision-flat workpiece mounting surface 599 of the workpiece rotor 616 relative to a horizontal plane.

The rotatable workpiece carrier plate 616 that is attached to the rotatable flexible annular diaphragm device 614 can be tilted over a selected tilt-excursion angle that ranges from 0.1 degrees to a maximum of 30 degrees until selected structural components such as the tilting control device 620 annular wall 591 that are attached to the rotatable workpiece rotor carrier plate 616 contacts the rotary workpiece carrier housing 606 to limit the tilting of the workpiece rotor 616. The preferred range of the tilt-excursion angle ranges from 5 degrees to a 30 degrees. The cylindrical spindle 600 spindle shaft 604 is supported by bearings 602 where the spindle 600 has a rotatable end plate 598 and a spindle flange hub 596 is attached to the spindle 600.

The floating workpiece carrier head 597 can also be converted to a rigid non-floating workpiece carrier head 597 by simply applying vacuum to the sealed flexible annular diaphragm chamber 613 to develop a negative pressure in the sealed flexible annular diaphragm chamber 613 to collapse the flexible annular diaphragm device 614 in a upward vertical direction. Here the workpiece rotor 616 and the adhesively attached or fastener (not shown) attached rotor top-plate 593 is forced by the vacuum upward against the annular excursion control device 603 at the annular contact area 619 which forced-contact action converts the floating workpiece carrier head 597 to a rigid non-floating workpiece carrier head 597. A configuration option here is for the contact area 619 to be configured to provide three-point flat-surfaced or three-point spherical debris self-cleaning surfaces of contact rather than the annular continuous flat-surfaced contact area 619, as shown. The components of the floating workpiece carrier head 597 can be designed and manufactured where the precision-flat workpiece mounting surface 599 of the workpiece rotor 616 is precisely perpendicular to the rotation axis of the rotary spindle 600 rotary spindle shaft 604. This rigid non-floating workpiece carrier head 597 can be used to abrade opposed flat surfaces on workpieces 618 that are precisely parallel to each other.

Figure 21:
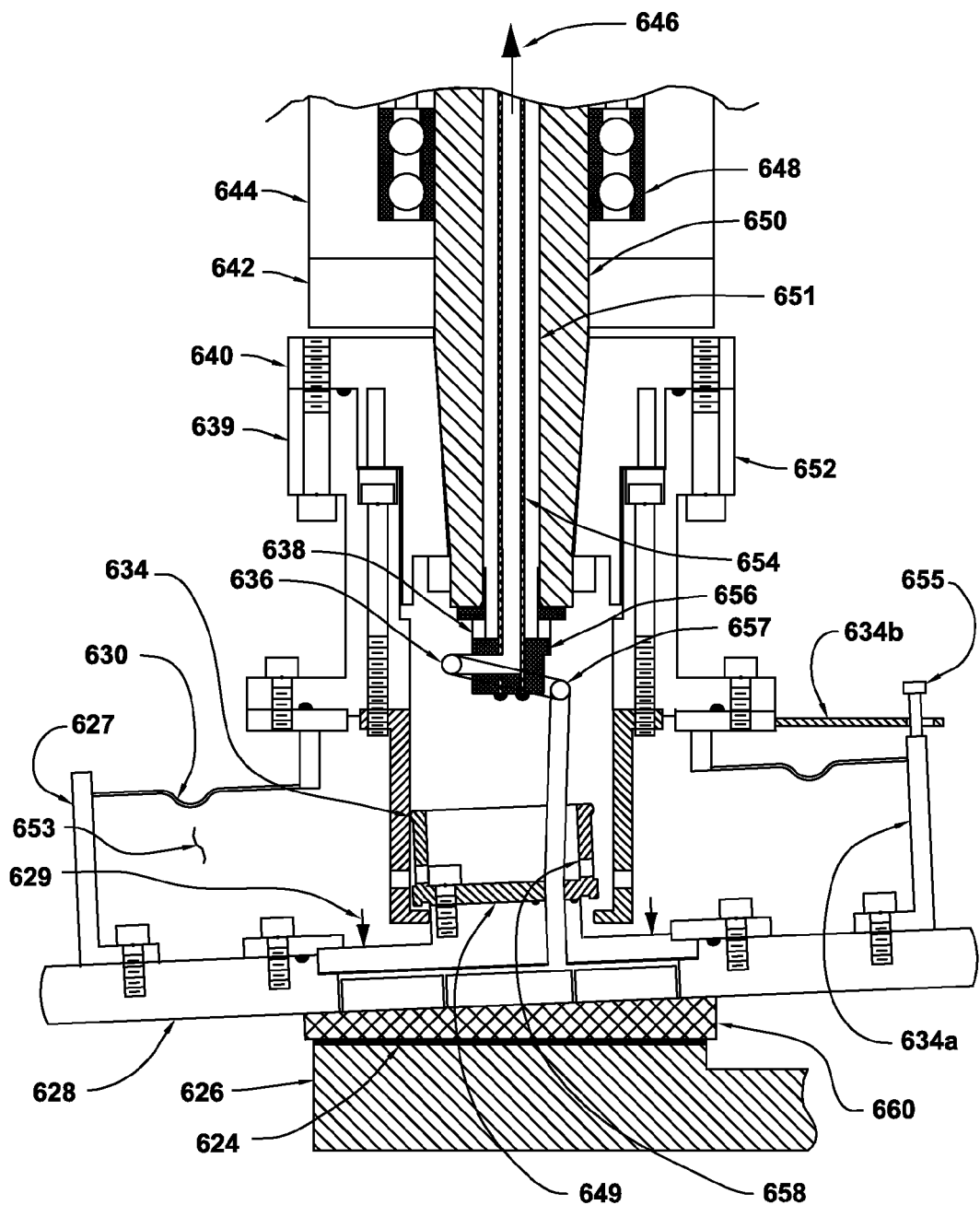
FIG. 21 is a cross section view of a slide-pin workpiece carrier that is tilted by a workpiece.

FIG. 21 is a cross section view of a slide-pin floating workpiece carrier that is tilted by a workpiece having non-parallel surfaces. The cylindrical spindle 644 spindle shaft 650 is supported by bearings 648 where the spindle 644 has a rotatable end plate 642 and a spindle flange hub 640 is attached to the spindle 644 spindle shaft 650. A rigid vacuum tube 654 is attached to a pneumatic adapter device 656 to provide vacuum 646 to a flexible polymer tube 657 that is attached to a tube fitting 636 that is attached to the pneumatic adapter device 656. The flexible vacuum tube 657 is also attached to the floating workpiece rotor 628 to attach the workpiece 660 having non-parallel surfaces to the workpiece rotor 628. The pneumatic adapter device 656 has a port-hole opening 638 to provide pressure or vacuum to the flexible annular diaphragm 630 sealed chamber 653.

A flexible annular diaphragm 630 that flexes in a vertical direction along the axis of the rotary spindle shaft 650 and flexes horizontally in a direction perpendicular to the axis of the rotary spindle shaft 650 is attached to an annual bracket 627 that is attached to the workpiece rotor 628 and the flexible annular diaphragm 630 is also attached to the rotary workpiece carrier housing 652.

Controlled-pressurized air is routed through the annular passageway between the rigid metal or polymer vacuum tube 654 and the spindle shaft 650 internal through-hole 651 to the pneumatic adapter device 656 where this pressurized air enters the flexible annular diaphragm 630 sealed chamber 653 to provide abrading pressure 629 which forces the non-parallel surfaced workpiece 660 against an abrasive surface 624 on a rotary platen 626. When air pressure is applied to the flexible annular diaphragm 630 sealed chamber 653, the flexible annular diaphragm 630 is flexed downward to move the workpiece 660 downward in a vertical direction along the rotation axis of the rotary spindle 644 rotary spindle shaft 650 until and as the workpiece 660 contacts the abrasive 624. Here the non-parallel surfaced workpiece 660 that is held in flat-faced contact with the flat abrasive surface 624 causes the workpiece rotor 628 to tilt.

The workpiece carrier rotor 628 has a vacuum-attached workpiece 660 and the carrier rotor 628 is attached to a rotary workpiece carrier housing 652 by a sliding pin drive arm 634*b* that is in sliding contact with a sliding pin 655 that is attached to a sliding pin bracket 634*a* that is attached to the workpiece carrier rotor 628 where the sliding pin 655 moves in a vertical direction along the rotation axis of the rotary spindle 644 rotary spindle shaft 650. Because the workpiece 660 has non-parallel opposed surfaces, the workpiece 660 tilts the workpiece carrier rotor 628.

A tilting control device 649 annular wall 634 shown here acts in conjunction with the rotary workpiece carrier housing 652 to limit the tilting of the workpiece rotor 628 relative to the rotary workpiece carrier housing 652 during the rotational abrading operation of the workpiece carrier head 639 to a specified amount when a workpiece 660 having non-parallel surfaces is abraded. When the workpiece rotor 628 tilts, the annular tilting control device 649 annular wall 634 contacts the rotary workpiece carrier housing 652 at the contact point 634. Here, additional tilting of the workpiece rotor 628 is fully prevented and the specified and allowable tilt angle of the workpiece rotor 628 is not exceeded.

All of the component parts of the floating workpiece carrier head 639 are designed and manufactured to be robust and structurally strong so that they easily resist the abrading forces that are applied to the floating workpiece carrier head 639 during abrading operations. These components are all manufactured from materials that resist the coolant water, CMP fluids and the abrading debris that is present in these abrading and polishing operations. The floating workpiece carrier head 639 devices are particularly well suited for polishing semiconductor wafers and for back-grinding these wafers at very high abrading speeds compared to the very low speeds of convention abrading systems presently being used for these applications. Often, the abrading speeds and piece part productivity are increased by a factor of 10 with this floating workpiece carrier head 639 abrading system.

Figure 22:
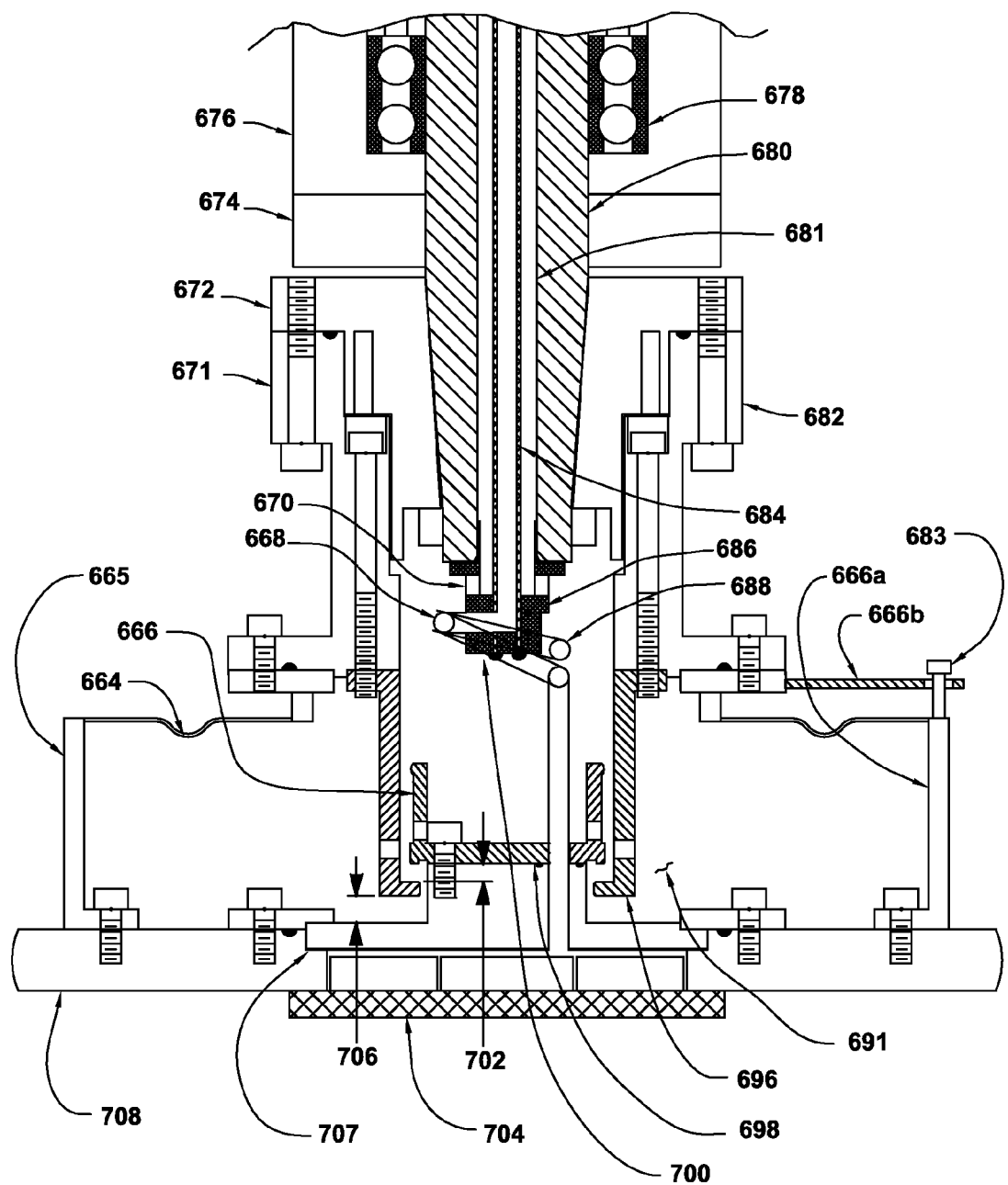
FIG. 22 is a cross section view of a slide-pin workpiece carrier neutral free-floating location.

FIG. 22 is a cross section view of a slide-pin floating workpiece carrier that is positioned in a neutral free-floating location. The cylindrical spindle 676 spindle shaft 680 is supported by bearings 678 where the spindle 676 has a rotatable end plate 674 and a spindle flange hub 672 is attached to the spindle 676 spindle shaft 680. A rigid vacuum tube 684 is attached to a pneumatic adapter device 686 to provide vacuum to a flexible circular-segment polymer tube 688 that is attached to a tube fitting 668 that is attached to the pneumatic adapter device 686. The flexible vacuum tube 688 is also attached to the floating workpiece rotor 708 to provide vacuum to attach the workpiece 704 to the workpiece rotor 708. The pneumatic adapter device 686 has a port-hole opening 670 to provide pressure or vacuum to the sealed flexible annular diaphragm chamber 691.

A flexible annular diaphragm 664 that flexes in a vertical direction along the axis of the rotary spindle shaft 680 and flexes horizontally in a direction perpendicular to the axis of the rotary spindle shaft 680 is attached to an annual bracket 665 that is attached to the workpiece rotor 708 and the flexible annular diaphragm 664 is also attached to a rotary workpiece carrier housing 682.

Controlled-pressurized air is routed through the annular passageway between the rigid metal or polymer vacuum tube 684 and the spindle shaft 680 internal through-hole 681 to the pneumatic adapter device 686 where this pressurized air enters the sealed elastomeric tube chamber 691 to provide abrading pressure which forces the workpiece 704 against an abrasive surface (not shown) that is coated on a flat-surfaced rotary platen (not shown). When air pressure is applied to the flexible annular diaphragm chamber 691, the flexible annular diaphragm device 664 is flexed downward to move the workpiece 704 downward in a vertical direction along the rotation axis of the rotary spindle 676 rotary spindle shaft 680 until, and as, the workpiece 704 contacts the flat abrasive surface. The workpiece rotor 708 has a spherical-shaped outer diameter 708 that is contacted by stationary rotary idlers (not shown) that hold the rotating workpiece rotor 708 in place as the workpiece rotor 708 rotates.

The workpiece carrier rotor 708 has a vacuum-attached workpiece 704 and the rotor 708 is attached to a rotary workpiece carrier housing 682 by a sliding pin drive arm 666*b* that is in sliding contact with a sliding pin 683 that is attached to a sliding pin bracket 666*a* that is attached to the workpiece carrier rotor 708 where the sliding pin 683 moves in a vertical direction along the rotation axis of the rotary spindle 676 rotary spindle shaft 680.

There is a vertical upward excursion distance 706 where the workpiece rotor 708 and the workpiece 704 are free to travel or float up and down vertically before the workpiece rotor 708 and the adhesively attached or fastener (not shown) rotor top-plate 707 is forced against the annular excursion control device 696. There is also a vertical downward excursion distance 702 where the workpiece rotor 708 and the workpiece 704 are free to travel or float vertically before the workpiece rotor 708, the attached rotor top-plate 707 and the attached combination translate and the vertical excursion control device 698 is forced vertically downward against the annular excursion control device 696. The vertical upward excursion distance 706 and the vertical downward excursion distance 702 together provide a total workpiece rotor 708 and the workpiece 704 vertical excursion travel distance that can range from 0.005 inches to 1.5 inches (0.0127 to 3.81 cm) or more where the preferred total vertical excursion distance ranges from 0.125 inches to a maximum of 0.500 inches (0.317 to 1.27 cm).

A floating workpiece rotor 708 excursion control device 698 acts in conjunction with the rotary workpiece carrier housing 682 to limit the lateral or horizontal excursion of the workpiece rotor 708 and the workpiece 704 relative to the rotary workpiece carrier housing 682 during the rotational abrading operation of the workpiece carrier head 671. Here, the lateral, sideways or horizontal motion of the workpiece rotor 708 and the workpiece 704 is confined and restrained when the excursion control device 698 is forced horizontally against the annular excursion control device 696 at the contact point 690.

Figure 23:
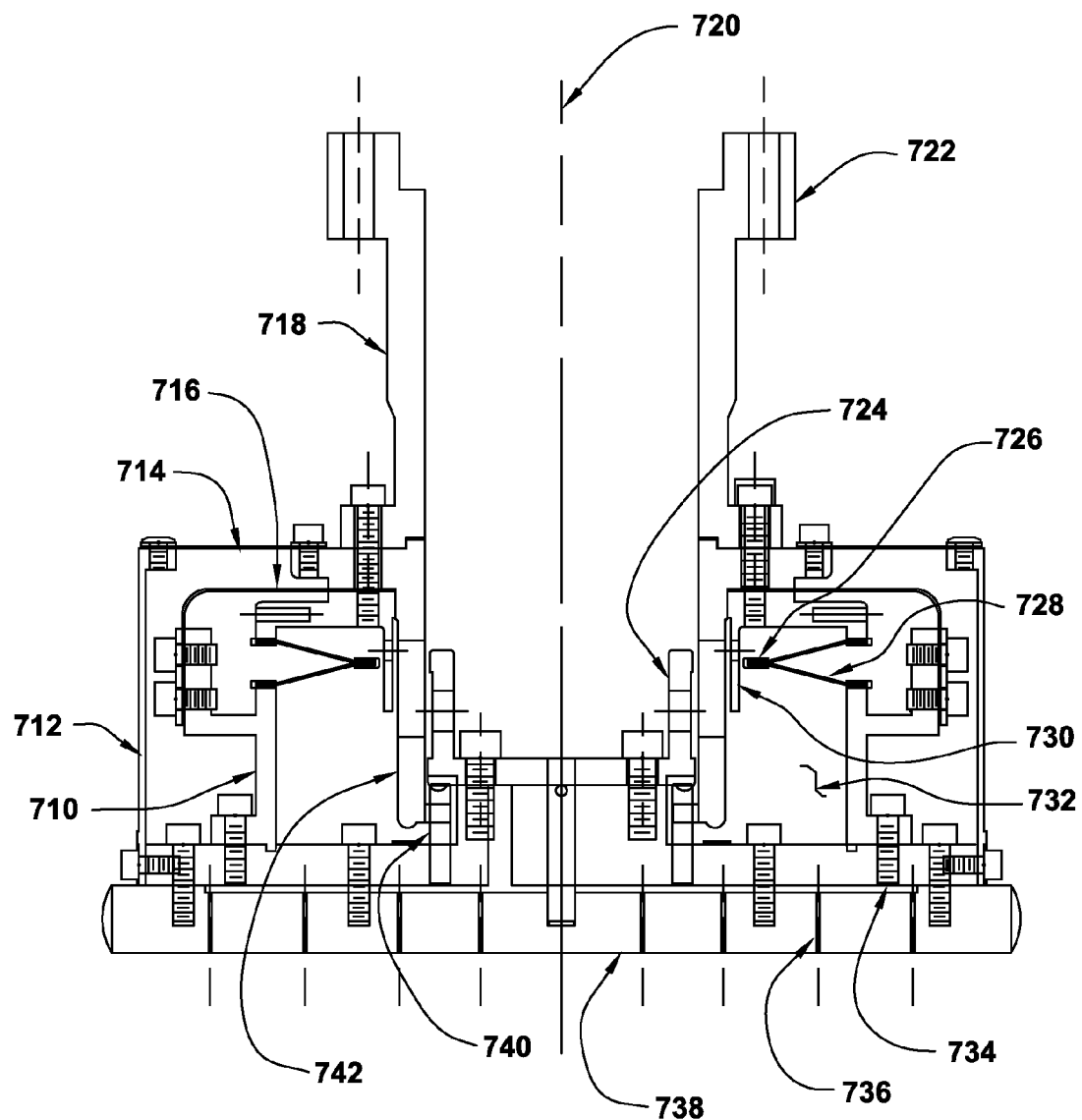
FIG. 23 is a cross section view of a bellows-type flexible-diaphragm workpiece carrier.

FIG. 23 is a cross section view of a bellows-type flexible diaphragm spider arm or pin-drive workpiece carrier rotation device. An abrading workpiece carrier head 718 rotates about an axis 720 where the abrading workpiece carrier head 718 has a housing 722 that has an attached workpiece (not shown) vertical and horizontal excursion control device 742. A movable horizontal excursion control device 724 contacts the vertical and horizontal excursion control device 742 when the relative free-motion controlled-distance between them diminishes sufficiently during abrading operation of the abrading workpiece carrier head 718. An abrading workpiece is attached to a rotatable workpiece carrier 738 with vacuum through vacuum port holes 736 where the rotatable workpiece carrier 738 is attached to a support plate 734 that is attached to the movable horizontal excursion control device 724.

When the workpiece carrier head 718 housing 722 is rotated, the rotatable workpiece carrier 738 is rotated either by at least one drive pin 740 that is attached to the a support plate 734 where the at least one drive pin 740 that is in sliding contact with the horizontal excursion control device 742 or by use of a spider-arm rotational drive device 716 that is attached to both the workpiece carrier head 718 housing 722 and the rotational drive bracket 710 that is attached to the a support plate 734. The drive pin 740 can also be used in conjunction with the spider-arm rotational drive device 716 where the spider-arm rotational drive device 716 rotates the workpiece carrier 738 with no slack or gap between the workpiece carrier head 718 housing 722 and the rotational drive bracket 710 but the drive pin 740 provides a safety-measure back-up stop device that would prevent rotation of the workpiece carrier 738 in the event of structural failure of the spider-arm rotational drive device 716.

An annular sealed debris shield 712 together with an attached flexible annular debris shield 714 prevents coolant water and abrading debris from entering the interior of the abrading workpiece carrier head 718. Here, the sealed flexible annular debris shield 714 is attached both to the annular sealed debris shield 712 and the workpiece carrier head 718 housing 722. The flexibility of the sealed flexible annular debris shield 714 is allows relative motion between the workpiece carrier 738 and the workpiece carrier head 718 housing 722. Also, a sealed flexible annular bellows-type multiple-disk 728 is attached to both the workpiece carrier head 718 housing 722 and the rotational drive bracket 710 to form a sealed pressure chamber 732 that is used to apply abrading pressure to the workpiece during an abrading operation.

The sealed flexible annular disk 728 can be constructed from multiple flexible annular disks that are joined together at the inner and outer annular radius to form a bellows-type type multiple-disk 728 where in one embodiment, the inner and outer annular radius joints can be attached to stiff annular rings 726 that prevent distortion of individual bellows annular disks when the bellows-type type multiple-disk 728 is subjected about the to pressures or vacuum. Also, an annular extension device 730 that is attached to the horizontal excursion control device 742 that is attached to the workpiece carrier head 718 housing 722 can act to restrain and limit the radial movement of the stiff annular rings 726 and the sealed flexible annular disk 728 when the workpiece carrier head 718 housing 722 is rotated at high speeds about an axis 720.

High speed rotation of the workpiece carrier head 718 housing 722 that is required for high speed abrasive lapping and polishing can cause the sealed flexible annular disk 728 to move radially from the carrier head 718 housing 722 rotation axis 720. When portions of the flexible annular disk 728 move in a radial direction, a small gap between the stiff annular rings 726 and the annular extension device 730 is bridged and further radial motion of the stiff annular rings 726 is prevented, which allows high speed rotation of the workpiece carrier head 718 housing 722 to take place. The stiff annular rings 726 and the sealed flexible annular disk 728 are nominally very light in weight so the amount of unbalance they cause when forced to a small offset position relative to the carrier head 718 housing 722 rotation axis 720 has minimal vibration or dynamic effect on the abrading operation.

The sealed flexible annular debris shield 714 and the sealed flexible annular disk 728 can be constructed from materials including elastomers, polyurethane, silicone rubber, polymer impregnated cloth, metals and can be mold-formed or fabricated to create an annular portion that is flexible in a radial direction. Also, the sealed flexible annular debris shield 714 and the sealed flexible annular disk 728 can be constructed where these rotatable flexible annular disk devices have an out-of-plane annular surface curvature that increases their flexibility in a radial direction perpendicular to the flexible annular disk device axis of rotation 720.

Figure 24:
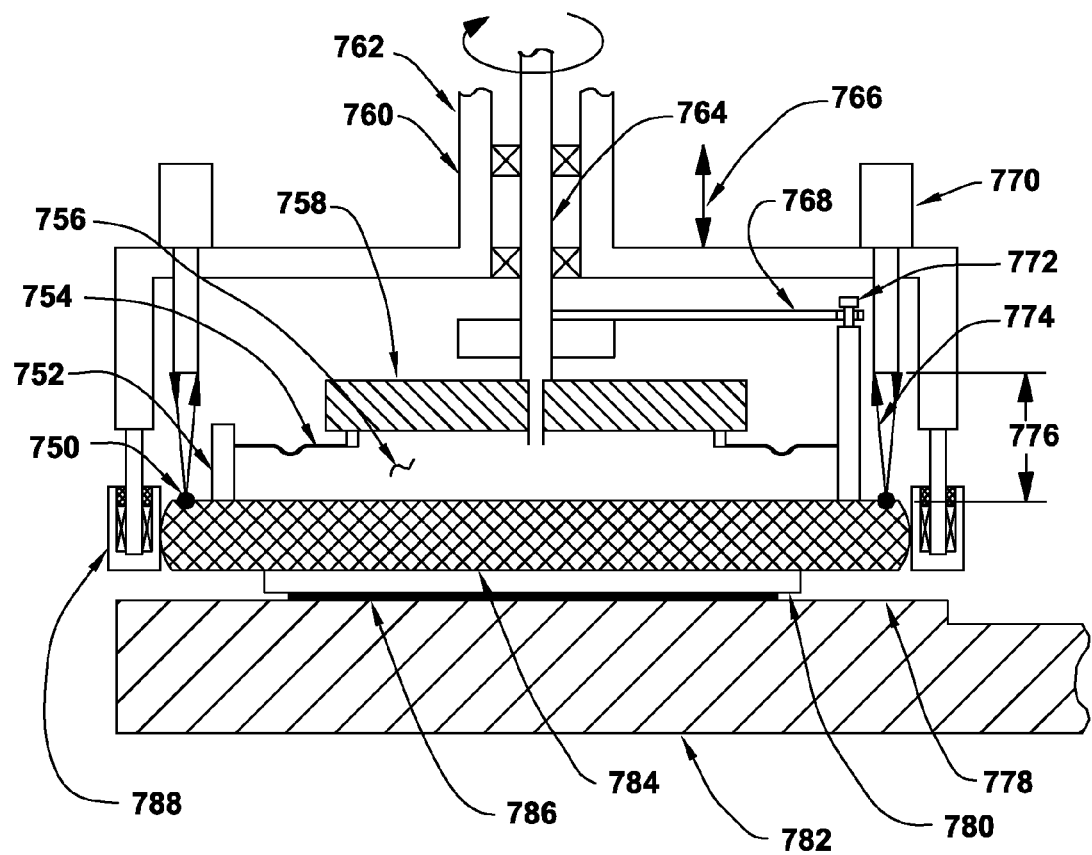
FIG. 24 is a cross section view of a floating workpiece carrier with position measurement.

FIG. 24 is a cross section view of a slide-pin driven floating workpiece carrier having workpiece rotor position measurement devices. A stationary workpiece carrier head assembly 762 has a flat-surfaced workpiece 848 that is attached to a rigid floating workpiece carrier rotor 852. The workpiece carrier rotor 784 is rotationally driven by a slide-pin arm 768 and a slide-pin device 772 that is attached to a sliding pin bracket that is attached to a rotational drive shaft 764. The nominally-horizontal drive plate 758 is attached to the hollow drive shaft 764, having a rotation axis, which is supported by a vertically movable stationary carrier housing 760 where the carrier housing 760 can be raised and lowered in a vertical direction 766.

The flexible annular diaphragm device 754 that is attached to the drive plate 758 is also attached to the workpiece carrier rotor 784 that is rotationally driven by the slide-pin arm device 768. Here, the flexible annular diaphragm 754 that flexes in a vertical direction along the axis of the rotary spindle shaft 764 and flexes horizontally in a direction perpendicular to the axis of the rotary spindle shaft 764 is attached to an annual bracket 752 that is attached to the workpiece rotor 784 and the flexible annular diaphragm 754 is also attached to a rotary workpiece carrier housing 760.

The workpiece carrier rotor 784 has an outer periphery that has a spherical shape which allows the workpiece carrier rotor 784 outer periphery to remain in contact with stationary rotational roller idlers 788 when the rotating carrier rotor 784 is tilted. The workpiece carrier rotor 784 and the flexible annular diaphragm device 754 have rotation axes that are coincident with the hollow drive shaft 764 rotation axis. The workpiece 780 that is attached to the workpiece carrier flexible annular diaphragm lower flange rotor 784 is rotationally driven by the flexible slide-pin device 754. The workpiece 780 is shown in abrading contact with the abrasive 786 coating on the flat surface 778 of the rotary platen 782.

Pressurized air can be supplied through the hollow drive shaft 764 that has a fluid passage that allows the pressurized air, or vacuum, to fill the sealed chamber 756 that is formed by the sealed flexible annular diaphragm device 754, the annual bracket 752 and the workpiece rotor 784.

The workpiece carrier rotor 784 and the flat-surfaced workpiece 780 such as a semiconductor wafer is allowed to be tilted from a horizontal position when they are stationary or rotated by the flexing action provided by the annual bracket 752 that is attached to the workpiece rotor 784 and flexible annular diaphragm 754 that can be operated at very high rotational speeds. One or more distance measurement devices 770 are attached to the stationary non-rotating stationary workpiece carrier head assembly 762 stationary carrier housing 760 where the stationary non-rotating stationary workpiece carrier head assembly 762 and the stationary carrier housing 760 can be raised and lowered vertically in the direction 766.

Multiple distance measurement devices 770 can be positioned around the outer periphery of the workpiece carrier rotor 784 and can be used to provide independent measurements of the distances 776. The measurement distances 776 are equivalently measured from the stationary carrier housing 760 to a selected area spot 750 located on a surface of the floating workpiece carrier flexible annular diaphragm lower flange rotor 784 which the workpiece 780 is attached to. Non-contacting ultrasonic or laser distance measuring sensors devices 770 or contact-type mechanical or electronic measuring devices including calipers, vernier calipers, micrometers and linear variable differential transformers (LVDT) can be used to measure the distances 776. A non-contacting measuring device 770 emits and receives rays or signals 774 that indicate the distances 776. Nominally, when the lower flange rotor 784 to which the workpiece 780 is attached to is positioned vertically where the lower flange rotor 784 is free to move vertically during an abrading operation.

The abrading machine floating workpiece substrate carrier apparatus and processes to use it are described here. An abrading machine floating workpiece substrate carrier apparatus is described where a rotating platen abrasive lapping and polishing apparatus having a floating workpiece substrate carrier apparatus comprises:
 a.) a workpiece substrate carrier frame moveable in a vertical direction that supports an attached rotatable workpiece carrier spindle having a hollow rotatable carrier drive shaft that has a vertical rotatable carrier drive shaft axis of rotation;
 b) a rotatable drive housing having a rotatable drive housing rotation axis where the rotatable drive housing is attached to the rotatable carrier drive shaft wherein the rotatable drive housing rotation axis is coincident with the rotatable carrier drive shaft axis of rotation;
 c) a rotatable flexible annular disk device having an annular disk device annular surface, an annular disk device outer periphery portion, an annular disk device inner periphery portion and an axis of rotation that is nominally located at the radial center of the annular disk device annular surface and that is nominally perpendicular to the annular disk device annular surface wherein the annular disk device outer annular periphery portion is moveable relative to the annular disk device inner annular periphery portion;
 d) a floating circular rotatable workpiece carrier plate having a workpiece carrier plate top surface, an opposed nominally-horizontal workpiece carrier plate flat bottom surface, a workpiece carrier plate rotation axis that is nominally-perpendicular to the workpiece carrier plate flat bottom surface and a workpiece carrier plate nominally-vertical outer periphery annular surface located between the workpiece carrier plate top and bottom surfaces and wherein the floating circular rotatable workpiece carrier plate is movable relative to the rotatable drive housing;
 e) wherein the rotatable flexible annular disk device inner annular periphery portion is attached to the rotatable drive housing and the rotatable flexible annular disk device outer annular periphery portion is attached to the workpiece carrier plate top surface wherein the rotatable flexible annular disk device axis of rotation is nominally-coincident with the vertical rotatable carrier drive shaft axis of rotation and wherein the rotatable flexible annular disk device together with the rotatable drive housing and the workpiece carrier plate forms a sealed enclosed rotatable flexible annular disk device pressure chamber having an internal volume contained by the rotatable flexible annular disk, the rotatable drive housing and the workpiece carrier plate top surface;
 f) a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and causes the workpiece carrier plate to be rotated by the rotatable drive housing;
 g) at least two rotatable idlers having rotation axes wherein the rotatable idlers have outer periphery cylindrical or spherical surfaces that are rotatable about the rotatable idlers rotation axes;
 h) wherein the at least two rotatable idlers are attached to the movable workpiece substrate carrier frame wherein the at least two rotatable idlers' rotation axes are nominally parallel to the vertical rotatable carrier drive shaft axis of rotation and wherein the at least two respective rotatable idler's outer periphery cylindrical or spherical surfaces are in contact with the floating circular workpiece carrier plate outer periphery annular surface, wherein the at least two rotatable idlers maintain the floating circular workpiece carrier plate rotation axis to be nominally concentric with the carrier drive shaft axis of rotation;
 i) wherein the floating circular workpiece carrier plate is moveable relative to the movable workpiece substrate carrier frame in a nominally-vertical direction along the floating circular workpiece carrier plate rotation axis wherein the at least two respective rotatable idler's outer periphery cylindrical surfaces are in vertical sliding contact with the floating circular workpiece carrier plate outer periphery annular surface and wherein the at least two rotatable idlers rotate as they are in contact with a rotating rotatable workpiece carrier plate;
 j) wherein at least one workpiece having opposed workpiece top and bottom surfaces is attached to the workpiece carrier plate flat bottom surface; and k) a rotatable abrading platen having a flat abrasive coated abrading surface that is nominally horizontal.

Also, the apparatus can be configured wherein the rotary workpiece drive device is comprised of a rotatable drive housing bracket that is attached to the rotatable drive housing and a workpiece carrier plate bracket that is attached to the workpiece carrier plate wherein the rotatable drive housing bracket and the workpiece carrier plate bracket are in vertical and horizontal sliding contact with each other at a bracket sliding joint and wherein the rotary drive housing bracket can be rotated by the rotatable drive housing to transmit torque, measured about the rotatable drive housing rotation axis, through the bracket sliding joint to the workpiece carrier plate bracket to provide rotation of the workpiece carrier plate about the workpiece carrier plate rotation axis, and wherein the workpiece carrier plate is movable vertically in a direction along the workpiece carrier plate rotation axis, and wherein the workpiece carrier plate is movable horizontally in a direction perpendicular to the workpiece carrier plate rotation axis.

In addition, with the same apparatus, the rotary workpiece drive device can be comprised of:
- a) at least one nominally-horizontal rotatable nominally-circular flexible support element having at least one individual flexible arm wherein each arm has a first proximal end secured to a central support ring, and a second distal end connected to the respective first proximal end by a flexing joint;
- b) wherein the distal end is flexible in a vertical direction but is stiff in a direction that is tangential to the nominally-circular flexible support element and wherein the flexible support element has a nominally-vertical rotatable flexible support element rotation axis located at the center of the nominally-circular flexible support element;
- c) wherein the at least one rotatable nominally-circular flexible support element central support ring is attached to the rotatable drive housing and where the at least one flexible support element distal end is attached to the floating circular rotatable workpiece carrier plate wherein the at least one rotatable flexible support element rotation axis is coincident with the rotatable drive housing rotation axis;
- d) and wherein the at least one rotatable nominally-circular flexible support element can be rotated by the rotatable drive housing to provide rotation of the workpiece carrier plate, and wherein the workpiece carrier plate is movable vertically in a direction along the workpiece carrier plate rotation axis by flexing the at least one individual flexible radial arm in a vertical direction.

In another embodiment, the rotatable flexible annular disk device is constructed from or mold-formed or molded from impervious flexible materials comprising: elastomers, silicone rubber, room temperature vulcanizing (RTV) silicone rubber, natural rubber, synthetic rubber, thermoset polyurethane, thermoplastic polyurethane, flexible polymers, composite materials, polymer-impregnated woven cloths, sealed fiber materials, organic materials, laminated sheets of combinations of these materials, sheets of these impervious flexible materials and metals.

In a further embodiment, the controlled-pressure air or controlled-pressure fluid or controlled-pressure vacuum is accessible into the sealed enclosed flexible annular disk device pressure chamber through an air, fluid or vacuum passageway connecting an air, fluid or vacuum passageway in the hollow rotatable carrier drive shaft to the enclosed flexible annular disk device pressure chamber and wherein the pressure or vacuum present in the enclosed flexible annular disk device pressure chamber can move the workpiece carrier plate vertically and wherein controlled pressure present in the enclosed flexible annular disk device pressure chamber applies a controlled abrading pressure to workpieces that attached to the workpiece carrier plate and that are in abrading contact with a platen abrasive coated abrading surface.

Additionally, the workpiece carrier plate top surface can be configured so that controlled vacuum applied to the sealed enclosed flexible annular disk device pressure chamber generates a lifting force on the workpiece carrier plate capable of moving the workpiece carrier plate toward the rotatable drive housing thereby distorting the rotatable flexible annular disk device in a direction along the flexible annular disk device axis of rotation wherein the workpiece carrier plate is moved vertically away from the rotatable abrading platen abrasive coated abrading surface.

In another embodiment, the rotatable drive housing bracket and the workpiece carrier plate bracket act together with mutual sliding contact to rotate the workpiece carrier plate in both clockwise and counterclockwise directions and to rotationally accelerate and decelerate the workpiece carrier and wherein the rotatable drive housing bracket and the workpiece carrier plate bracket act together to prevent substantial rotation of the workpiece carrier plate relative to the rotatable drive housing. Further, the horizontal rotatable nominally-circular flexible support element rotates the workpiece carrier in both clockwise and counterclockwise directions and rotationally accelerates and decelerates the workpiece carrier and wherein the horizontal rotatable nominally-circular flexible support element prevents rotation of the workpiece carrier plate relative to the rotatable drive housing.

In addition, the rotatable drive housing has an attached rotatable drive housing vertical excursion-stop device and an attached rotatable drive housing horizontal excursion-stop device, and wherein the floating circular rotatable workpiece carrier plate has an attached floating circular rotatable workpiece carrier plate vertical excursion-stop device and an attached floating circular rotatable workpiece carrier plate horizontal excursion-stop device wherein the horizontal and vertical movement distance of the floating circular rotatable workpiece carrier plate relative to the rotatable drive housing is controlled and limited by contacting of the rotatable drive housing vertical excursion-stop device with the floating circular rotatable workpiece carrier plate vertical excursion-stop device and by contacting of the rotatable drive housing horizontal excursion-stop device with the floating circular rotatable workpiece carrier plate horizontal excursion-stop device.

Further, a rotatable stationary vacuum, air or fluid rotary union is attached to the hollow carrier drive shaft which supplies vacuum or pressurized air or fluid to a hollow carrier drive shaft fluid passageway that is connected to a hollow flexible fluid tube that is routed to fluid passageways connected to vacuum or fluid port holes in the workpiece carrier plate flat bottom surface to supply vacuum or pressurized air or fluid to the vacuum or fluid port holes in the workpiece carrier plate flat bottom surface. And, a rotatable stationary vacuum, air or fluid rotary union is attached to the hollow carrier drive shaft which supplies vacuum or pressurized air or fluid to a hollow carrier drive shaft fluid passageway that is routed to the sealed flexible annular disk device pressure chamber to supply vacuum or pressurized air or fluid to the sealed flexible annular disk device pressure chamber.

Also, a rotational limiting and restraint device is used in conjunction with the circular flexible support element wherein the rotational limiting and restraint device is attached to either the rotatable workpiece carrier plate or to the rotatable drive housing wherein the rotational limiting and restraint device only contacts a respective adjacent rotatable workpiece carrier plate or the respective adjacent rotatable drive housing if the flexible support element is substantially distorted or fractured wherein the rotational limiting and restraint device prevents substantial rotation of the rotatable workpiece carrier plate relative to the rotatable drive housing.

A process is described for using the apparatus to abrade or polish a workpiece surface by rotating the rotatable abrading platen having a flat abrasive coated abrading surface against a workpiece wherein vacuum is supplied to the hollow flexible fluid tube that is routed to fluid passageways connected to vacuum or fluid port holes in the workpiece carrier plate flat bottom surface wherein the vacuum attaches at least one workpiece to the workpiece carrier plate flat bottom surface. In another process, the apparatus is used wherein pressurized air or a fluid is supplied to the sealed flexible annular disk device pressure chamber and wherein the applied pressure acts on the workpiece carrier plate top surface, when the workpiece is in abrading contact with the platen abrasive, which creates an abrading force that is transmitted through the workpiece carrier plate thickness wherein this abrading force is transmitted to at least one workpiece that is attached to the workpiece carrier plate which forces the at least one workpiece into abrading-force controlled flat-surfaced abrading contact with the rotatable abrading platen abrasive surface.

In another process, the apparatus is configured wherein vacuum is applied to the sealed enclosed flexible annular disk device pressure chamber wherein the vacuum generates a vacuum lifting force on the workpiece carrier plate wherein the vacuum lifting force forces the workpiece carrier plate top surface into rigid contact against a rotatable drive housing vertical excursion-stop device that is attached to the rotatable drive housing and wherein the workpiece substrate carrier frame and the attached workpiece carrier spindle are moved vertically to position the workpiece that is attached to the workpiece carrier plate flat bottom surface into abrading contact with the rotatable abrading platen abrasive surface wherein the workpiece surface is abraded or polished by rotating the rotatable abrading platen and rotating the workpiece carrier plate while the workpiece is in abrading contact with the platen abrasive surface.

In another embodiment, central portions of the floating circular rotatable workpiece carrier plate workpiece carrier plate are flexible in a vertical direction and wherein the workpiece carrier plate outer periphery annular surface is substantially rigid in a horizontal direction, wherein the flexible central portions of the workpiece carrier plate flat bottom surface can be distorted out-of-plane by the controlled-pressure air or controlled-pressure fluid or controlled-pressure vacuum present in the sealed enclosed flexible annular disk device pressure chamber which acts on the workpiece carrier plate top surface.

Also, multiple rotatable flexible annular disk devices are positioned concentric with respect to each other to form multiple independent annular or circular rotatable flexible annular disk device's sealed flexible annular disk device pressure chambers wherein independent sealed flexible annular disk device pressure chambers are formed between adjacent sealed flexible annular disk device pressure chambers, wherein each independent sealed rotatable flexible annular disk device sealed enclosed pressure chamber has an independent controlled-pressure air or controlled-pressure fluid or vacuum source to provide independent controlled-pressure air or controlled-pressure fluid pressures to the respective rotatable flexible annular disk device's sealed enclosed pressure chambers, wherein the flexible central portions of the workpiece carrier plate flat bottom surface can assume non-flat shapes at the location of each independent rotatable flexible annular disk device's sealed enclosed pressure chamber and the respective rotatable flexible annular disk device's sealed enclosed pressure chambers apply independently controlled abrading pressures to the portions of the abraded surface of at least one workpiece, that is attached to the workpiece carrier plate, at the position of the respective rotatable flexible annular disk device's sealed enclosed pressure chambers when the at least one workpiece abraded surface is in abrading contact with the rotatable abrading platen abrading surface.

Further, the flexible-bottom workpiece carrier plate has an attached flexible vacuum-surface device that extends over the workpiece-attachment nominally-flat central portions of the floating circular rotatable workpiece carrier plate wherein the attached flexible vacuum-surface device has vacuum port holes wherein workpieces can be attached by vacuum to the flexible-bottom workpiece carrier plate when vacuum is supplied to the vacuum port holes.

In another embodiment, the floating workpiece carrier plate nominally-vertical outer periphery annular surface has a nominally-spherical shape. And, the stationary vacuum and fluid rotary union that is attached to the hollow rotatable carrier drive shaft is a friction-free air-bearing rotary union for both the rotary workpiece drive device having a rotatable drive housing bracket and the workpiece carrier plate bracket and also for the workpiece drive device flexible support element having at least one individual flexible arm.

In a further embodiment, vacuum supplied to the sealed enclosed flexible annular disk device pressure chamber generates a lifting force on the workpiece carrier plate that is capable of moving the workpiece carrier plate toward the rotatable drive housing is provided by a vacuum surge tank having a substantial tank volume wherein the at least one workpiece that is attached to the workpiece carrier plate is moved rapidly away from abrading contact with the rotatable abrading platen abrading surface. Also, the rotatable flexible annular disk device has an non-planar annular surface curvature that increases its flexibility in a radial direction perpendicular to the flexible annular disk device axis of rotation.

In another embodiment, the apparatus has at least one measurement device is attached to the workpiece substrate carrier frame wherein the at least one measurement device measures the distance between the workpiece substrate carrier frame and the workpiece carrier plate when a workpiece that is attached to the workpiece carrier plate is in flat-surfaced contact with the rotatable abrading platen abrading surface wherein the at least one measurement device distance measurements between the workpiece substrate carrier frame and the workpiece carrier plate are used to move the workpiece carrier plate workpiece substrate carrier frame vertically wherein the workpiece carrier plate is positioned vertically where the vertical movement distance of the floating circular rotatable workpiece carrier plate relative to the rotatable drive housing that is attached to the workpiece substrate carrier frame is approximately at the midpoint of the controlled and limited vertical movement distance of the floating circular rotatable workpiece carrier plate relative to the rotatable drive housing.

Another process is described of providing abrading workpieces using an abrading machine floating workpiece substrate carrier apparatus comprising:

a.) providing a workpiece substrate carrier frame moveable in a vertical direction that supports an attached rotatable workpiece carrier spindle having a hollow rotatable carrier drive shaft that has a vertical rotatable carrier drive shaft axis of rotation;
b) providing a rotatable drive housing having a rotatable drive housing rotation axis where the rotatable drive housing is attached to the rotatable carrier drive shaft wherein the rotatable drive housing rotation axis is coincident with the rotatable carrier drive shaft axis of rotation;
c) providing a rotatable flexible annular disk device having an annular disk device annular surface, an annular disk device outer periphery portion, an annular disk device inner periphery portion and an axis of rotation that is nominally located at the radial center of the annular disk device annular surface and that is nominally perpendicular to the annular disk device annular surface wherein the annular disk device outer annular periphery portion is moveable relative to the annular disk device inner annular periphery portion;
d) providing a floating circular rotatable workpiece carrier plate having a workpiece carrier plate top surface, an opposed nominally-horizontal workpiece carrier plate flat bottom surface, a workpiece carrier plate rotation axis that is nominally-perpendicular to the workpiece carrier plate flat bottom surface and a workpiece carrier plate nominally-vertical outer periphery annular surface located between the workpiece carrier plate top and bottom surfaces and wherein the floating circular rotatable workpiece carrier plate is movable relative to the rotatable drive housing;
e) attaching the rotatable flexible annular disk device inner annular periphery portion to the rotatable drive housing and attaching the rotatable flexible annular disk device outer annular periphery portion to the workpiece carrier plate top surface wherein the rotatable flexible annular disk device axis of rotation is nominally-coincident with the vertical rotatable carrier drive shaft axis of rotation and wherein the rotatable flexible annular disk device together with the rotatable drive housing and the workpiece carrier plate forms a sealed enclosed rotatable flexible annular disk device pressure chamber having an internal volume contained by the rotatable flexible annular disk, the rotatable drive housing and the workpiece carrier plate top surface;
f) providing a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and causes the workpiece carrier plate to be rotated by the rotatable drive housing;
g) providing at least two rotatable idlers having rotation axes wherein the rotatable idlers have outer periphery cylindrical or spherical surfaces that are rotatable about the rotatable idlers rotation axes;
h) attaching the at least two rotatable idlers to the movable workpiece substrate carrier frame wherein the at least two rotatable idlers' rotation axes are nominally parallel to the vertical rotatable carrier drive shaft axis of rotation and wherein the at least two respective rotatable idler's outer periphery cylindrical or spherical surfaces are in contact with the floating circular workpiece carrier plate outer periphery annular surface, wherein the at least two rotatable idlers maintain the floating circular workpiece carrier plate rotation axis to be nominally concentric with the carrier drive shaft axis of rotation;
i) providing that the floating circular workpiece carrier plate is moveable relative to the movable workpiece substrate carrier frame in a nominally-vertical direction along the floating circular workpiece carrier plate rotation axis wherein the at least two respective rotatable idler's outer periphery cylindrical surfaces are in vertical sliding contact with the floating circular workpiece carrier plate outer periphery annular surface and wherein the at least two rotatable idlers rotate as they are in contact with a rotating rotatable workpiece carrier plate;
j) attaching at least one workpiece having opposed workpiece top and bottom surfaces to the workpiece carrier plate flat bottom surface; and
k) providing a rotatable abrading platen having a flat abrasive coated abrading surface that is nominally horizontal;
l) moving the workpiece substrate carrier frame and the attached workpiece carrier spindle vertically to position the flat workpiece bottom surface of at least one workpiece that is attached to the workpiece carrier plate flat bottom surface close to flat-surfaced abrading contact with the rotatable abrading platen abrading surface after which the movable workpiece substrate carrier frame and the workpiece carrier spindle are held stationary at that position and wherein the workpiece carrier plate is moved in a vertical direction relative to the stationary workpiece substrate carrier frame by adjusting the pressure in the sealed flexible annular disk device pressure chamber wherein the at least one workpiece bottom surface is positioned in flat-surfaced abrading contact with the rotatable abrading platen abrading surface.

What is claimed:
1. A rotating platen abrasive lapping and polishing apparatus having a floating workpiece substrate carrier apparatus comprising:
   a.) a workpiece substrate carrier frame moveable in a vertical direction that supports an attached rotatable workpiece carrier spindle having a hollow rotatable carrier drive shaft with a vertical rotatable carrier drive shaft axis of rotation;
   b) a rotatable drive housing having a rotatable drive housing rotation axis wherein the rotatable drive housing is attached to the rotatable carrier drive shaft and the rotatable drive housing rotation axis is coincident with the rotatable carrier drive shaft axis of rotation;
   c) a rotatable flexible annular disk device with an annular disk device annular surface, an annular disk device outer periphery portion, an annular disk device inner periphery portion and an axis of rotation that is nominally located at the radial center of the annular disk device annular surface and that is nominally perpendicular to the annular disk device annular surface, wherein the annular disk device outer annular periphery portion is moveable relative to the annular disk device inner annular periphery portion;
   d) a floating circular rotatable workpiece carrier plate having a workpiece carrier plate top surface, an opposed nominally-horizontal workpiece carrier plate flat bottom surface, a workpiece carrier plate rotation axis nominally-perpendicular to the workpiece carrier plate flat bottom surface and a workpiece carrier plate nominally-vertical outer periphery annular surface located between the workpiece carrier plate top and bottom sur- faces, wherein the floating circular rotatable workpiece carrier plate is movable relative to the rotatable drive housing;
e) wherein the rotatable flexible annular disk device inner annular periphery portion is attached to the rotatable drive housing and the rotatable flexible annular disk device outer annular periphery portion is attached to the workpiece carrier plate top surface and the rotatable flexible annular disk device axis of rotation is nominally-coincident with the vertical rotatable carrier drive shaft axis of rotation and the rotatable flexible annular disk device together with the rotatable drive housing and the workpiece carrier plate forms a sealed enclosed rotatable flexible annular disk device pressure chamber having an internal volume contained by the rotatable flexible annular disk, the rotatable drive housing and the workpiece carrier plate top surface;
f) a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and is configured to cause the workpiece carrier plate to be rotated by the rotatable drive housing;
g) at least two rotatable idlers having rotation axes wherein the rotatable idlers have outer periphery cylindrical or spherical surfaces that are rotatable about the rotatable idlers rotation axes;
h) wherein the at least two rotatable idlers are attached to the movable workpiece substrate carrier frame and the at least two rotatable idlers' rotation axes are nominally parallel to the vertical rotatable carrier drive shaft axis of rotation and the at least two respective rotatable idler's outer periphery cylindrical or spherical surfaces contact the floating circular workpiece carrier plate outer periphery annular surface, wherein the at least two rotatable idlers maintain the floating circular workpiece carrier plate rotation axis as nominally concentric with the carrier drive shaft axis of rotation;
i) wherein the floating circular workpiece carrier plate is moveable relative to the movable workpiece substrate carrier frame in a nominally-vertical direction along the floating circular workpiece carrier plate rotation axis wherein the at least two respective rotatable idler's outer periphery cylindrical surfaces are in vertical sliding contact with the floating circular workpiece carrier plate outer periphery annular surface and the at least two rotatable idlers rotate in contact with the rotating rotatable workpiece carrier plate; and
j) wherein at least one workpiece having opposed workpiece top and bottom surfaces is attached to the workpiece carrier plate flat bottom surface and a rotatable abrading platen having a flat abrasive coated abrading surface that is nominally horizontal.

2. The apparatus of claim 1 wherein the rotary workpiece drive device comprises a rotatable drive housing bracket attached to the rotatable drive housing, and a workpiece carrier plate bracket attached to the workpiece carrier plate, wherein the rotatable drive housing bracket and the workpiece carrier plate bracket are in vertical and horizontal sliding contact with each other at a bracket sliding joint and wherein the rotary drive housing bracket can be rotated by the rotatable drive housing to transmit torque, measured about the rotatable drive housing rotation axis, through the bracket sliding joint to the workpiece carrier plate bracket to provide rotation of the workpiece carrier plate about the workpiece carrier plate rotation axis, and wherein the workpiece carrier plate is movable vertically in a direction along the workpiece carrier plate rotation axis, and the workpiece carrier plate is movable horizontally in a direction perpendicular to the workpiece carrier plate rotation axis.

3. The apparatus of claim 1 wherein the rotary workpiece drive device comprises:
a) at least one nominally-horizontal rotatable nominally-circular flexible support element having at least one individual flexible arm wherein each arm has a first proximal end secured to a central support ring, and a second distal end connected to the respective first proximal end by a flexing joint;
b) wherein the second distal end is flexible in a vertical direction but is stiff in a direction that is tangential to the nominally-circular flexible support element and wherein the flexible support element has a nominally-vertical rotatable flexible support element rotation axis located at a center of the nominally-circular flexible support element;
c) wherein the at least one rotatable nominally-circular flexible support element central support ring is attached to the rotatable drive housing and the at least one flexible support element second distal end is attached to the floating circular rotatable workpiece carrier plate and the at least one rotatable flexible support element rotation axis is coincident with the rotatable drive housing rotation axis; and
d) the at least one rotatable nominally-circular flexible support element can be rotated by the rotatable drive housing to provide rotation of the workpiece carrier plate, and the workpiece carrier plate is movable vertically in a direction along the workpiece carrier plate rotation axis by flexing the at least one individual flexible radial arm in a vertical direction.

4. The apparatus of claim 1 wherein the rotatable flexible annular disk device comprises flexible materials selected from the group consisting of: elastomers, silicone rubber, room temperature vulcanizing silicone rubber, natural rubber, synthetic rubber, thermoset polyurethane, thermoplastic polyurethane, flexible polymers, composite materials, polymer-impregnated woven cloths, sealed fiber materials, laminated sheets of combinations thereof, sheets of impervious flexible materials, and metals.

5. The apparatus of claim 1 wherein pressure-controlled air, fluid or vacuum is accessible into the sealed enclosed flexible annular disk device pressure chamber through a passageway connecting an air, fluid or vacuum passageway in the hollow rotatable carrier drive shaft to the enclosed flexible annular disk device pressure chamber and wherein the pressure or vacuum present in the enclosed flexible annular disk device pressure chamber is sufficient to move the workpiece carrier plate vertically and wherein controlled pressure present in the enclosed flexible annular disk device pressure chamber applies a controlled abrading pressure to workpieces that attached to the workpiece carrier plate that are in abrading contact with a platen abrasive coated abrading surface.

6. The apparatus of claim 1 wherein the workpiece carrier plate top surface is configured so that controlled vacuum applied to the sealed enclosed flexible annular disk device pressure chamber generates a lifting force on the workpiece carrier plate capable of moving the workpiece carrier plate toward the rotatable drive housing thereby distorting the rotatable flexible annular disk device in a direction along the flexible annular disk device axis of rotation wherein the workpiece carrier plate is moved vertically away from the rotatable abrading platen abrasive coated abrading surface.

7. The apparatus of claim 2 wherein the rotatable drive housing bracket and the workpiece carrier plate bracket act together with mutual sliding contact to rotate the workpiece carrier plate in either clockwise and counterclockwise directions and to rotationally accelerate and decelerate the workpiece carrier and wherein the rotatable drive housing bracket and the workpiece carrier plate bracket act together to prevent substantial rotation of the workpiece carrier plate relative to the rotatable drive housing.

8. The apparatus of claim 3 wherein the horizontal rotatable nominally-circular flexible support element is configured to rotate the workpiece carrier in either clockwise or counterclockwise directions and rotationally accelerate or decelerate the workpiece carrier and wherein the horizontal rotatable nominally-circular flexible support.

9. The apparatus of claim 1 wherein the rotatable drive housing has an attached rotatable drive housing vertical excursion-stop device and an attached rotatable drive housing horizontal excursion-stop device, and the floating circular rotatable workpiece carrier plate has an attached floating circular rotatable workpiece carrier plate vertical excursion-stop device and an attached floating circular rotatable workpiece carrier plate horizontal excursion-stop device, wherein the horizontal and vertical movement distance of the floating circular rotatable workpiece carrier plate relative to the rotatable drive housing is controlled and limited by contact of the rotatable drive housing vertical excursion-stop device with the floating circular rotatable workpiece carrier plate vertical excursion-stop device and by contact of the rotatable drive housing horizontal excursion-stop device with the floating circular rotatable workpiece carrier plate horizontal excursion-stop device.

10. The apparatus of claim 1 wherein a rotatable stationary vacuum, air or fluid rotary union is attached to the hollow carrier drive shaft to supply vacuum, pressurized air or fluid to a hollow carrier drive shaft fluid passageway connected to a hollow flexible fluid tube that is routed to fluid passageways connected to vacuum or fluid port holes in the workpiece carrier plate flat bottom surface to supply vacuum, pressurized air or pressurized fluid to the port holes in the workpiece carrier plate flat bottom surface.

11. The apparatus of claim 1 wherein a rotatable stationary vacuum, air or fluid rotary union is attached to the hollow carrier drive shaft which supplies vacuum, pressurized air or pressurized fluid to a hollow carrier drive shaft fluid passageway that is routed to the sealed flexible annular disk device pressure chamber to supply vacuum, pressurized air or pressurized fluid to the sealed flexible annular disk device pressure chamber.

12. The apparatus of claim 3 further comprising a rotational limiting and restraint device in conjunction with the circular flexible support element, wherein the rotational limiting and restraint device is attached to either the rotatable workpiece carrier plate or to the rotatable drive housing, wherein the rotational limiting and restraint device contacts only a respective adjacent rotatable workpiece carrier plate or the respective adjacent rotatable drive housing when the flexible support element is substantially distorted or fractured, wherein the rotational limiting and restraint device prevents substantial rotation of the rotatable workpiece carrier plate relative to the rotatable drive housing.

13. A process for using the apparatus of claim 10 to abrade or polish a workpiece surface by rotating the rotatable abrading platen having a flat abrasive coated abrading surface against a workpiece wherein vacuum is supplied to the hollow flexible fluid tube that is routed to fluid passageways connected to vacuum or fluid port holes in the workpiece carrier plate flat bottom surface wherein the vacuum attaches at least one workpiece to the workpiece carrier plate flat bottom surface.

14. A process for the apparatus of claim 5 to abrade or polish a workpiece surface wherein pressurized air or a fluid is supplied to the sealed flexible annular disk device pressure chamber so that the applied pressure acts on the workpiece carrier plate top surface and with the workpiece is in abrading contact with the platen abrasive to create an abrading force that is transmitted through the workpiece carrier plate thickness wherein this abrading force is transmitted to at least one workpiece that is attached to the workpiece carrier plate which forces the at least one workpiece into abrading-force controlled flat-surfaced abrading contact with the rotatable abrading platen abrasive surface.

15. A process for using the apparatus of claim 5 to abrade or polish a workpiece surface wherein vacuum is applied to the sealed enclosed flexible annular disk device pressure chamber to generate a vacuum lifting force on the workpiece carrier plate wherein the vacuum lifting force forces the workpiece carrier plate top surface into rigid contact against a rotatable drive housing vertical excursion-stop device attached to the rotatable drive housing and wherein the workpiece substrate carrier frame and the attached workpiece carrier spindle are moved vertically to position the workpiece that is attached to the workpiece carrier plate flat bottom surface into abrading contact with the rotatable abrading platen abrasive surface, and the workpiece surface is abraded or polished by rotating the rotatable abrading platen and rotating the workpiece carrier plate while the workpiece is in abrading contact with the platen abrasive surface.

16. The apparatus of claim 5 wherein central portions of the floating circular rotatable workpiece carrier plate workpiece carrier plate are flexible in a vertical direction and wherein the workpiece carrier plate outer periphery annular surface is substantially rigid in a horizontal direction, wherein the flexible central portions of the workpiece carrier plate flat bottom surface can be distorted out-of-plane by the pressure-controlled air, fluid or vacuum present in the sealed enclosed flexible annular disk device pressure chamber.

17. The apparatus of claim 16 wherein multiple rotatable flexible annular disk devices are positioned concentric with respect to each other to form multiple independent annular or circular rotatable flexible annular disk device's sealed flexible annular disk device pressure chambers wherein independent sealed flexible annular disk device pressure chambers are formed between adjacent sealed flexible annular disk device pressure chambers, wherein each independent sealed rotatable flexible annular disk device sealed enclosed pressure chamber has an independent controlled-pressure air or controlled-pressure fluid or vacuum source to provide independent pressure-controlled air or fluid pressures to respective rotatable flexible annular disk device's sealed enclosed pressure chambers, wherein the flexible central portions of the workpiece carrier plate flat bottom surface can assume non-flat shapes at the location of each independent rotatable flexible annular disk device's sealed enclosed pressure chamber and the respective rotatable flexible annular disk device's sealed enclosed pressure chambers apply independently controlled abrading pressures to the portions of the abraded surface of at least one workpiece that is attached to the workpiece carrier plate at a position of the respective rotatable flexible annular disk device's sealed enclosed pressure chambers when the at least one workpiece abraded surface is in abrading contact with the rotatable abrading platen abrading surface.

18. The apparatus of claim 16 wherein the flexible-bottom workpiece carrier plate has an attached flexible vacuum-surface device that extends over the workpiece-attachment nominally-flat central portions of the floating circular rotatable workpiece carrier plate wherein the attached flexible vacuum-surface device has vacuum port holes wherein vacuum attaches a workpiece to the flexible-bottom workpiece carrier plate by vacuum supplied to the vacuum port holes.

19. The apparatus of claim 1 wherein the floating workpiece carrier plate nominally-vertical outer periphery annular surface has a nominally-spherical shape.

20. The apparatus of claim 10 wherein the stationary vacuum and fluid rotary union attached to the hollow rotatable carrier drive shaft is a friction-free air-bearing rotary union.

21. The apparatus of claim 11 wherein the stationary vacuum and fluid rotary union attached to the hollow rotatable carrier drive shaft is a friction-free air-bearing rotary union.

22. The apparatus of claim 6 wherein vacuum supplied to the sealed enclosed flexible annular disk device pressure chamber which generates a lifting force on the workpiece carrier plate that is capable of moving the workpiece carrier plate toward the rotatable drive housing is provided by a vacuum surge tank having a substantial tank volume wherein the at least one workpiece that is attached to the workpiece carrier plate is moved away from abrading contact with the rotatable abrading platen abrading surface.

23. The apparatus of claim 1 wherein the rotatable flexible annular disk device has an non-planar annular surface curvature which increases its flexibility in a radial direction perpendicular to the flexible annular disk device axis of rotation.

24. The apparatus of claim 9 wherein at least one measurement device is attached to the workpiece substrate carrier frame wherein the at least one measurement device measures the distance between the workpiece substrate carrier frame and the workpiece carrier plate when a workpiece that is attached to the workpiece carrier plate is in flat-surfaced contact with the rotatable abrading platen abrading surface, wherein the distance measurements between the workpiece substrate carrier frame and the workpiece carrier plate are used to move the workpiece carrier plate workpiece substrate carrier frame vertically wherein the workpiece carrier plate is positioned vertically where the vertical movement distance of the floating circular rotatable workpiece carrier plate relative to the rotatable drive housing that is attached to the workpiece substrate carrier frame is approximately at the midpoint of the controlled and limited vertical movement distance of the floating circular rotatable workpiece carrier plate relative to the rotatable drive housing.

25. A process of providing abrading workpieces using an abrading machine floating workpiece substrate carrier apparatus comprising:

a.) providing a workpiece substrate carrier frame moveable in a vertical direction that supports an attached rotatable workpiece carrier spindle having a hollow rotatable carrier drive shaft that has a vertical rotatable carrier drive shaft axis of rotation;

b) providing a rotatable drive housing having a rotatable drive housing rotation axis where the rotatable drive housing is attached to the rotatable carrier drive shaft wherein the rotatable drive housing rotation axis is coincident with the rotatable carrier drive shaft axis of rotation;

c) providing a rotatable flexible annular disk device having an annular disk device annular surface, an annular disk device outer periphery portion, an annular disk device inner periphery portion and an axis of rotation that is nominally located at the radial center of the annular disk device annular surface and that is nominally perpendicular to the annular disk device annular surface wherein the annular disk device outer annular periphery portion is moveable relative to the annular disk device inner annular periphery portion;

d) providing a floating circular rotatable workpiece carrier plate having a workpiece carrier plate top surface, an opposed nominally-horizontal workpiece carrier plate flat bottom surface, a workpiece carrier plate rotation axis that is nominally-perpendicular to the workpiece carrier plate flat bottom surface and a workpiece carrier plate nominally-vertical outer periphery annular surface located between the workpiece carrier plate top and bottom surfaces and wherein the floating circular rotatable workpiece carrier plate is movable relative to the rotatable drive housing;

e) attaching the rotatable flexible annular disk device inner annular periphery portion to the rotatable drive housing and attaching the rotatable flexible annular disk device outer annular periphery portion to the workpiece carrier plate top surface wherein the rotatable flexible annular disk device axis of rotation is nominally-coincident with the vertical rotatable carrier drive shaft axis of rotation and wherein the rotatable flexible annular disk device together with the rotatable drive housing and the workpiece carrier plate forms a sealed enclosed rotatable flexible annular disk device pressure chamber having an internal volume contained by the rotatable flexible annular disk, the rotatable drive housing and the workpiece carrier plate top surface;

f) providing a rotary workpiece drive that is connected with both the rotatable drive housing and the workpiece carrier plate wherein the rotary workpiece drive allowing movement of the workpiece carrier plate relative to the rotatable drive housing and wherein the rotary workpiece drive device transmits torque, measured about the rotatable drive housing rotation axis, from the rotatable drive housing to the workpiece carrier plate and causes the workpiece carrier plate to be rotated by the rotatable drive housing;

g) providing at least two rotatable idlers having rotation axes wherein the rotatable idlers have outer periphery cylindrical or spherical surfaces that are rotatable about the rotatable idlers rotation axes;

h) attaching the at least two rotatable idlers to the movable workpiece substrate carrier frame wherein the at least two rotatable idlers' rotation axes are nominally parallel to the vertical rotatable carrier drive shaft axis of rotation and wherein the at least two respective rotatable idler's outer periphery cylindrical or spherical surfaces are in contact with the floating circular workpiece carrier plate outer periphery annular surface, wherein the at least two rotatable idlers maintain the floating circular workpiece carrier plate rotation axis is nominally concentric with the carrier drive shaft axis of rotation;

i) moving that the floating circular workpiece carrier plate relative to the movable workpiece substrate carrier frame in a nominally-vertical direction along the floating circular workpiece carrier plate rotation axis wherein the at least two respective rotatable idler's outer periphery cylindrical surfaces slide in vertical sliding contact with the floating circular workpiece carrier plate outer periphery annular surface and wherein the at least two rotatable idlers rotate as they are in contact with a rotating rotatable workpiece carrier plate;

j) attaching at least one workpiece having opposed workpiece top and bottom surfaces to the workpiece carrier plate flat bottom surface; and k) providing a rotatable abrading platen having a flat abrasive coated abrading surface that is nominally horizontal;

l) moving the workpiece substrate carrier frame and the attached workpiece carrier spindle vertically to position the flat workpiece bottom surface of at least one workpiece that is attached to the workpiece carrier plate flat bottom surface close to flat-surfaced abrading contact with the rotatable abrading platen abrading surface after which the movable workpiece substrate carrier frame and the workpiece carrier spindle are held stationary at that position and wherein the workpiece carrier plate is moved in a vertical direction relative to the stationary workpiece substrate carrier frame by adjusting the pressure in the sealed flexible annular disk device pressure chamber wherein the at least one workpiece bottom surface is positioned in flat-surfaced abrading contact with the rotatable abrading platen abrading surface to abrade the workpiece.

* * * * *